(12) United States Patent
Hiramoto et al.

(10) Patent No.: US 8,384,818 B2
(45) Date of Patent: Feb. 26, 2013

(54) SOLID-STATE IMAGING DEVICE INCLUDING ARRAYS OF OPTICAL ELEMENTS AND PHOTOSENSITIVE CELLS

(75) Inventors: Masao Hiramoto, Osaka (JP); Kazuya Yonemoto, Osaka (JP); Seiji Nishiwaki, Hyogo (JP); Masaaki Suzuki, Osaka (JP); Yoshiaki Sugitani, Nara (JP); Shinichi Wakabayashi, Osaka (JP)

(73) Assignee: Panasonic Corporation, Osaka (JP)

( * ) Notice: Subject to any disclaimer, the term of this patent is extended or adjusted under 35 U.S.C. 154(b) by 390 days.

(21) Appl. No.: 12/671,083

(22) PCT Filed: Jun. 10, 2009

(86) PCT No.: PCT/JP2009/002616
§ 371 (c)(1),
(2), (4) Date: Jan. 28, 2010

(87) PCT Pub. No.: WO2009/153937
PCT Pub. Date: Dec. 23, 2009

(65) Prior Publication Data
US 2010/0188537 A1    Jul. 29, 2010

(30) Foreign Application Priority Data

| Jun. 18, 2008 | (JP) | 2008-158667 |
| Jun. 18, 2008 | (JP) | 2008-158668 |
| Jun. 25, 2008 | (JP) | 2008-165555 |
| Jun. 25, 2008 | (JP) | 2008-165556 |
| Feb. 3, 2009 | (JP) | 2009-022147 |
| Feb. 3, 2009 | (JP) | 2009-022148 |

(51) Int. Cl.
*H04N 3/14* (2006.01)
*H04N 5/335* (2011.01)
*H04N 9/04* (2006.01)
*H04N 9/07* (2006.01)
*H04N 5/225* (2006.01)

(52) U.S. Cl. ........ 348/337; 348/274; 348/340; 348/279; 348/280

(58) Field of Classification Search .................. 348/266, 348/272–274, 281, 335–340, 278–280
See application file for complete search history.

(56) References Cited

U.S. PATENT DOCUMENTS 4,675,727 A * 6/1987 Sekizawa et al. ............. 348/336
6,590,270 B2   7/2003 Suzuki
(Continued)

FOREIGN PATENT DOCUMENTS

JP       59-090467       5/1984
JP       11-313334       11/1999
(Continued)

OTHER PUBLICATIONS

International Search Report for corresponding application No. PCT/JP2009/002616 dated Sep. 8, 2009.

*Primary Examiner* — Jason Whipkey
(74) *Attorney, Agent, or Firm* — Renner, Otto, Boisselle & Sklar, LLP

(57) ABSTRACT

Light-splitting elements are arranged in at least two columns and two rows to form two pairs 1a, 1b and 1c, 1d. Each element splits incident light into light rays and makes them fall on a portion of a photosensing section right under itself and an adjacent photosensitive cell. The element 1a splits the incident light so that a primary color ray C1 and its complementary color ray C1' enter an adjacent cell 2b and an underlying cell 2a, respectively. The element 1b makes a primary color ray C2 and its complementary color ray C2' enter an underlying cell 2a and an adjacent cell 2a, respectively. The element 1c does the same as the element 1b. And the element 1d makes a primary color ray C3 and its complementary color ray C3' enter an adjacent cell 2c and an underlying cell 2d, respectively. These photosensitive cells 2 perform photoelectric conversion, thereby outputting an electrical signal representing the intensity of the incident light. By carrying out simple calculations between the outputs of these cells, a color signal and a luminance signal are generated.

28 Claims, 29 Drawing Sheets

U.S. PATENT DOCUMENTS

| | | | |
|---|---|---|---|
| 6,738,171 B1 * | 5/2004 | Campbell | 359/15 |
| 7,110,034 B2 | 9/2006 | Suda | |
| 7,202,896 B2 | 4/2007 | Wako et al. | |
| 7,250,973 B2 | 7/2007 | Dobashi et al. | |
| 7,955,764 B2 * | 6/2011 | Liu et al. | 430/7 |
| 8,101,903 B2 * | 1/2012 | Mokhnatyuk | 348/294 |
| 2002/0135825 A1 * | 9/2002 | Lee et al. | 358/509 |
| 2004/0004668 A1 * | 1/2004 | Namazue et al. | 348/340 |
| 2005/0041135 A1 * | 2/2005 | Togino | 348/340 |
| 2010/0019129 A1 * | 1/2010 | Ishigaki et al. | 250/208.1 |

FOREIGN PATENT DOCUMENTS

| | | |
|---|---|---|
| JP | 2000-151933 | 5/2000 |
| JP | 2001-309395 | 11/2001 |
| JP | 2003-078917 | 3/2003 |
| JP | 2003-243638 | 8/2003 |
| JP | 2003-243639 | 8/2003 |
| JP | 2003-243640 | 8/2003 |
| JP | 2005-006066 | 1/2005 |
| JP | 2005-260067 | 9/2005 |
| JP | 2008-202159 | 9/2008 |
| WO | 2009/019818 | 2/2009 |
| WO | 2010/016195 A1 | 2/2010 |

\* cited by examiner

G  R  B IR

IR R  G B

CONVENTIONAL ART

SOLID-STATE IMAGING DEVICE INCLUDING ARRAYS OF OPTICAL ELEMENTS AND PHOTOSENSITIVE CELLS

TECHNICAL FIELD

The present invention relates to a technique for increasing the sensitivity of a solid-state imaging device and a technique for realizing color representation using an infrared ray for such a device.

BACKGROUND ART

Recently, the performance and functionality digital cameras and digital movie cameras that use some solid-state imaging device such as a CCD and a CMOS (which will be sometimes referred to herein as an "imager") have been enhanced to an astonishing degree. In particular, the size of a pixel structure for use in a solid-state imaging device has been further reduced these days thanks to development of semiconductor device processing technologies, thus getting an even greater number of pixels and drivers integrated together in a solid-state imaging device. As a result, the resolution of an imager has lately increased significantly from one million pixels to ten million pixels in a matter of few years. Meanwhile, the greater the number of pixels in an imager, the lower the intensity of the light falling on a single pixel (which will be referred to herein as a "light intensity") and the lower the sensitivity of camera tends to be.

The sensitivity of cameras has dropped recently due to not only such a significant increase in resolution but also the use of a color-separating filter itself. A normal color filter transmits one color component of incoming light but absorbs the other components of the light, thus decreasing the optical efficiency. Specifically, in a color camera that uses a Bayer color filter, for example, a subtractive color filter that uses an organic pigment as a dye is arranged over each photosensing section of an imager, and therefore, the optical efficiency achieved is rather low. In a Bayer color filter, color filters in three colors are arranged two-dimensionally using a combination of one red (R) element, two green (G) elements and one blue (B) element as a fundamental unit. In this case, the R filter transmits an R ray but absorbs G and B rays, the G filter transmits a G ray but absorbs R and B rays, and the B filter transmits a B ray but absorbs R and G rays. That is to say, each color filter transmits only one of three colors of R, G and B and absorbs the other two colors. Consequently, the light ray used by each color filter is only approximately one third of the visible radiation falling on that color filter.

Also, there are a variety of demands on cameras in terms of not just performance but also extended use. For example, recently, a lot of people think it necessary to capture an image for monitoring purposes using an infrared ray not just in the daytime but also at night as well, and there is a growing demand for a camera that can be used both day and night.

To meet such a demand by overcoming such a problem, Patent Document No. 1 discloses a technique for increasing the intensity of the light received by attaching an array of micro lenses to a photodetector section of an imager. According to this technique, with attention paid to the fact that the photosensing section of an imager has a low aperture ratio, the incoming light is condensed with those micro lenses, thereby substantially increasing the aperture ratio. And this technique is now used in almost all solid-state imaging devices. It is true that the aperture ratio can be increased substantially by this technique but the decrease in optical efficiency by color filters still persists.

Thus, to avoid the decrease in optical efficiency and the decrease in sensitivity at the same time, Patent Document No. 2 discloses a solid-state imaging device that has a structure for taking in as much incoming light as possible by using multilayer color filters and micro lenses in combination. Such a device uses a combination of dichroic mirrors, each of which does not absorb light but selectively transmits only a component of light falling within a particular wavelength range and reflects the rest of the light falling within the other wavelength ranges. Each dichroic mirror selects only a required component of the light and makes it incident on its associated photosensing section. FIG. 25 is a cross-sectional view of an imager with such a configuration.

In the solid-state imaging device shown in FIG. 25, the light that has been incident on a condensing micro lens 21 has its luminous flux adjusted by an inner lens 22, and then enters a first dichroic mirror 23, which transmits a red (R) ray but reflects rays of the other colors. The light ray that has been transmitted through the first dichroic mirror 23 is then incident on a photosensitive cell 2 that is located right under the first dichroic mirror 23. On the other hand, the light ray that has been reflected from the first dichroic mirror 23 enters a second dichroic mirror 24 adjacent to the first dichroic mirror 23. The second dichroic mirror 24 reflects a green (G) ray and transmits a blue (B) ray. The green ray that has been reflected from the second dichroic mirror 24 is incident on a photosensitive cell 2 that is located right under the second dichroic mirror 24. On the other hand, the blue ray that has been transmitted through the second dichroic mirror 24 is reflected from a second dichroic mirror 25 and then incident on a photosensitive cell 2 that is located right under the dichroic mirror 25.

In this manner, in the imager shown in FIG. 25, the visible radiation that has been incident on the condensing micro lens 21 is not absorbed into color filters but their RGB components can be detected by the three photosensitive cells 2 non-wastefully.

Meanwhile, Patent Document No. 3 discloses a solid-state imaging device that uses a micro prism. The device splits the incoming light into red, green and blue rays using the micro prism and then makes those rays incident on their associated photosensitive cells. Even with such a solid-state imaging device, the incoming light is not wasted in vain, either, by color filters.

As described above, the solid-state imaging devices disclosed in Patent Documents Nos. 2 and 3 do not use any color filter that selectively transmits a light ray falling within a particular wavelength range but instead use either micro mirrors for selectively transmitting and reflecting light rays falling within particular wavelength ranges or a Micro prism for branching incoming light into multiple different directions according to their wavelength ranges. That is to say, by using color separating optical elements functioning as light-splitting elements such as the micro mirrors or the micro prism, the incoming light can be used much more efficiently.

Such a solid-state imaging device, however, should have as many photosensitive cells as the color separating optical elements to use. That is to say, the number of photosensitive cells provided should be the same as that of the light rays split. That is why to sense red, green and blue rays, for example, the number of photosensors cells provided should be tripled.

Thus, to overcome such problems with the prior art, Patent Document No. 4 discloses a technique for increasing the optical efficiency by using multilayer filters and reflected light, although some loss of the incoming light is involved. FIG. 26 is a partial cross-sectional view of an imager that adopts such a technique. As shown in FIG. 26, multilayer filters 32 and 33 are embedded in a light-transmitting resin 31. Specifically, the filter 32 transmits a G ray and reflects R and B rays, while the filter 33 transmits an R ray and reflects G and B rays. Under those filters 32 and 33, arranged are organic dye filters 34 and 35 that transmit G and R rays, respectively, micro lenses 36, and a metal layer 37.

Such a structure cannot receive a B ray at its photosensing section but can sense R and G rays entirely under the following principle. First, if an R ray is incident on the multilayer filters 32 and 33, the R ray is reflected from the multilayer filter 32, totally reflected from the interface between the resin 31 and the air, and then incident on the multilayer filter 33. Then, almost all of the R ray that has been incident on the multilayer filter 33 will enter the photosensing section by way of the organic dye filter 35 and the micro lens 36, even though only a part of the light is reflected from the metal layer 37. On the other hand, if a G ray is incident on the multilayer filters 32 and 33, the G ray is reflected from the multilayer filter 33, totally reflected from the interface between the resin 31 and the air, and then incident on the multilayer filter 32. Then, almost all of the G ray that has been incident on the multilayer filter 32 will eventually enter the photosensing section with virtually no less by way of the organic dye filter 34 and the micro lens 36.

According to the technique disclosed in Patent Document No. 4, only one of the three colors of RGB is lost but light rays of the other two colors can be received with almost no loss based on the principle described above. On top of that, the light rays of those two colors can be received efficiently enough even without providing an additional photosensitive cell. In this case, comparing such an imager to an imager that uses only organic dye filters, it can be seen that the sensitivity can be doubled by this technique because the imager that uses organic dye filters will achieve an optical efficiently of just one third but this technique will achieve an optical efficiency of two thirds. Nevertheless, even if such a technique is adopted, the optical efficiency cannot be 100%, as one out of the three colors should be sacrificed.

Meanwhile, a conventional method for using an infrared ray as an additional light source is disclosed in Patent Document No. 5. According to the method, a 2 by 2 array, consisting of RGB color elements and a color filter 40 that transmits an infrared ray (IR), is used as a fundamental unit as shown in FIG. 27 to be attached to the photosensing section of an imager. However, as each of the RGB color elements also has the property of transmitting an infrared ray, an infrared cut filter is arranged in front of those color elements. Using such an arrangement, a color image is produced in the daytime based on the light rays that have been transmitted through the RGB color elements, but a monochrome image is produced at night by emitting an infrared ray as an illumination and using the light ray that has come from the IR element. In this case, as light absorbing color elements are used, the RGB light rays cannot be used so efficiently. However, by applying the techniques of Patent Document Nos. 2 to 4 to this one, an infrared ray can be used with the optical efficiency of RGB light rays increased.

CITATION LIST

Patent Literature

Patent Document No. 1: Japanese Patent Application Laid-Open Publication No. 59-90467
Patent Document No. 2: Japanese Patent Application Laid-Open Publication No. 2000-151933
Patent Document No. 3: Japanese Patent Application Laid-Open Publication No. 2001-309395
Patent Document No. 4: Japanese Patent Application Laid-Open Publication No. 2003-78917
Patent Document No. 5: Japanese Patent Application Laid-Open Publication No. 2005-6066

SUMMARY OF INVENTION

Technical Problem

If the conventional technique disclosed in Patent Document No. 2 or 3 is adopted, the number of photosensors to provide should be as large as that of the color rays to receive as described above. Also, according to the technique disclosed in Patent Document No. 4, one of the three color components must be lost.

To sum up, according to the conventional technologies, if light-absorbing color filters are used, the number of photosensitive cells to provide does not have to be increased significantly but the optical efficiency achieved will be low. Nevertheless, if micro mirrors or micro prisms that selectively transmit incoming light are used, then the optical efficiency will be high but the number of photosensitive cells to provide should be increased considerably.

A color representation technique using light-splitting is disclosed in Patent Document No. 6. According to such a technique, a Bayer color filter arrangement is adopted, pixels associated with RGB are defined, and light rays of the respective colors are condensed on those pixels by diffracting the incoming light. That is to say, according to that technique, the incoming light should be split into at least three rays of RGB using only one diffraction grating. Consequently, that technique lacks flexibility in realizing the color representation.

It is therefore an object of the present invention to provide a highly flexible color representation technique, by which the incoming light does not have to be split into RGB rays. A more specific object of the present invention is to provide a color imaging technique that will achieve high optical efficiency using light-splitting elements even without increasing the number of photosensitive cells significantly. Another object of the present invention is to provide a technique for using not only visible radiation but also an infrared ray as well.

Solution to Problem

A solid-state imaging device according to the present invention includes: an array of photosensitive cells including first and second photosensitive cells; and an array of optical elements, which is arranged over the array of photosensitive cells and which includes first and second optical elements. The first optical element makes a light ray falling within a first wavelength range, which is included in incident light that has impinged on the first optical element, enter the first photosensitive cell and also makes a light ray falling within a second wavelength range, which is also included in the incident light, enter the second photosensitive cell. The second optical element makes at least a light ray falling within the second wavelength range, which is included in incident light that has impinged on the second optical element, enter the second photosensitive cell. The first photosensitive cell outputs a signal including an electrical signal component that has been produced as a result of reception of the light ray that has been transmitted through the first optical element. The second photosensitive cell outputs a signal including an electrical signal component that has been produced as a result of reception of the light rays that have been transmitted through the first and second optical elements.

In one preferred embodiment, the color of the light ray falling within the first wavelength range is the complementary color of that of the light ray falling within the second wavelength range.

In another preferred embodiment, each of the first and second optical elements has a light-splitting property that refracts the incident light to a different direction according to its wavelength. The first and second optical elements are located over the first and second photosensitive cells, respectively.

Another solid-state imaging device according to the present invention includes: an array of photosensitive cells; and an array of optical elements, in which at least two types of light-splitting elements are arranged either one-dimensionally or two-dimensionally over the array of photosensitive cells. Part or all of the photosensitive cells receive light that has come from the at least two types of light-splitting elements and generate at least three different types of color signals. The array of optical elements includes light-splitting elements that transmit a light ray falling within a first wavelength range toward a direction that defines a first angle with respect to incident light and also transmit a light ray falling within a second wavelength range toward a direction that defines a second angle with respect to the incident light. The light rays falling within the first and second wavelength ranges have mutually complementary colors.

In one preferred embodiment, the array of optical elements includes light-splitting elements for splitting the incident light into at least three light rays. At least one of the light-splitting elements makes a portion of the light fall on an associated one of the photosensitive cells and makes the rest of the light fall on another one of the photosensitive cells that is adjacent to the associated photosensitive cell.

In another preferred embodiment, the array of optical elements includes first and second light-splitting elements that transmit the light ray falling within the first wavelength range toward the direction that defines the first angle with respect to the incident light and also transmit the light ray falling within the second wavelength range toward the direction that defines the second angle with respect to the incident light. The light rays falling within the first and second wavelength ranges have mutually complementary colors. The first and second light-splitting elements are arranged adjacent to each other. The light rays falling within the first wavelength range that have been transmitted through the first and second light-splitting elements, respectively, enter the photosensitive cell associated with the first light-splitting element. The light rays falling within the second wavelength range that have been transmitted through the first and second light-splitting elements, respectively, enter the photosensitive cell associated with the second light-splitting element.

In still another preferred embodiment, the array of optical elements includes a third light-splitting element that transmits the light ray falling within the first wavelength range toward the direction that defines the first angle with respect to the incident light and also transmits the light ray falling within the second wavelength range toward the direction that defines the second angle with respect to the incident light. The light rays falling within the first and second wavelength ranges have mutually complementary colors. The array of optical elements further includes a transparent element that does not split the incident light. The third light-splitting element and the transparent element are arranged adjacent to each other. The light ray falling within the first wavelength range that has been transmitted through the third light-splitting element enters the photosensitive cell associated with the third light-splitting element. The light ray falling within the second wavelength range that has been transmitted through the third light-splitting element and the light ray that has been transmitted through the transparent element enter the photosensitive cell associated with the transparent element.

In yet another preferred embodiment, the array of optical elements includes first, second and third light-splitting elements that transmit the light ray falling within the first wavelength range toward the direction that defines the first angle with respect to the incident light and also transmit the light ray falling within the second wavelength range toward the direction that defines the second angle with respect to the incident light. The light rays falling within the first and second wavelength ranges have mutually complementary colors. The array of optical elements further includes a transparent element that does not split the incident light. The first and second light-splitting elements are arranged adjacent to each other. The third light-splitting element and the transparent element are arranged adjacent to each other. The light rays falling within the first wavelength range that have been transmitted through the first and second light-splitting elements, respectively, enter the photosensitive cell associated with the first light-splitting element. The light rays falling within the second wavelength range that have been transmitted through the first and second light-splitting elements, respectively, enter the photosensitive cell associated with the second light-splitting element. The light ray falling within the first wavelength range that has been transmitted through the third light-splitting element enters the photosensitive cell associated with the third light-splitting element. And the light ray falling within the second wavelength range that has been transmitted through the third light-splitting element and the light ray that has been transmitted through the transparent element enter the photosensitive cell associated with the transparent element.

In yet another preferred embodiment, the array of optical elements includes a first light-splitting element that transmits the light ray falling within the first wavelength range toward the direction that defines the first angle with respect to the incident light and also transmits the light ray falling within the second wavelength range toward the direction that defines the second angle with respect to the incident light. The light rays falling within the first and second wavelength ranges have mutually complementary colors. The array of optical elements further includes a second light-splitting element for splitting the incident light into light rays falling within third, fourth and fifth wavelength ranges, respectively. The first and second light-splitting elements are alternately arranged adjacent to each other. The light ray falling within the second wavelength range that has been transmitted through the first light-splitting element and the light rays falling within the third and fifth wavelength ranges that have been transmitted through the second light-splitting element enter the photosensitive cell associated with the first light-splitting element. And the light ray falling within the first wavelength range that has been transmitted through the first light-splitting element and the light ray falling within the fourth wavelength range that has been transmitted through the second light-splitting element enter the photosensitive cell associated with the second light-splitting element.

In yet another preferred embodiment, the array of optical elements includes a first light-splitting element that transmits the light ray falling within the first wavelength range toward the direction that defines the first angle with respect to the incident light and also transmits the light ray falling within the second wavelength range toward the direction that defines the second angle with respect to the incident light. The light rays falling within the first and second wavelength ranges have mutually complementary colors. The array of optical elements further includes a transparent element that does not split the incident light. The first light-splitting element and the transparent element are arranged adjacent to each other. The light ray falling within the second wavelength range that has been transmitted through the first light-splitting element enters the photosensitive cell associated with the first light-splitting element. The light ray falling within the first wavelength range that has been transmitted through the first light-splitting element and the light ray that has been transmitted through the transparent element enter the photosensitive cell associated with the transparent element.

In yet another preferred embodiment, the array of optical elements includes first and second light-splitting elements that transmit the light ray falling within the first wavelength range toward the direction that defines the first angle with respect to the incident light and also transmit the light ray falling within the second wavelength range toward the direction that defines the second angle with respect to the incident light. The light rays falling within the first and second wavelength ranges have mutually complementary colors. The array of optical elements further includes a third light-splitting element for splitting the incident light into light rays falling within third, fourth and fifth wavelength ranges, respectively, and a transparent element that does not split the incident light. The first and third light-splitting elements are alternately arranged adjacent to each other and the second light-splitting element and the transparent element are arranged adjacent to each other. The light ray falling within the second wavelength range that has been transmitted through the first light-splitting element and the light rays falling within the third and fifth wavelength ranges that have been transmitted through the third light-splitting element enter the photosensitive cell associated with the first light-splitting element. The light ray falling within the first wavelength range that has been transmitted through the first light-splitting element and the light ray falling within the fourth wavelength range that has been transmitted through the third light-splitting element enter the photosensitive cell associated with the third light-splitting element. The light ray falling within the second wavelength range that has been transmitted through the second light-splitting element enters the photosensitive cell associated with the second light-splitting element. And the light ray falling within the first wavelength range that has been transmitted through the second light-splitting element and the light ray that has been transmitted through the transparent element enter the photosensitive cell associated with the transparent element.

In yet another preferred embodiment, the solid-state imaging device includes a light-splitting element that splits incident light into two light rays and makes one of those two light rays fall on a photosensitive cell associated with a transparent element. The light ray to fall on the photosensitive cell associated with the transparent element has the lower intensity than the other light ray.

In yet another preferred embodiment, the light-splitting element splits the incident light by diffraction.

In yet another preferred embodiment, the light-splitting element includes: a high-refractive-index transparent portion that is made of a material with a relatively high refractive index; and a low-refractive-index transparent portion that is made of a material with a relatively low refractive index and that contacts with a side surface of the high-refractive-index transparent portion.

In this particular preferred embodiment, the high-refractive-index transparent portion has a part that has a different thickness from the other parts in the direction in which the incident light travels.

In a specific preferred embodiment, the center axis of the high-refractive-index transparent portion is stepped as viewed on a plane that is parallel to the direction in which the incident light travels.

In yet another preferred embodiment, color information is obtained by calculating a difference between the output signals of two adjacent photosensitive cells.

Still another solid-state imaging device according to the present invention includes: an array of photosensitive cells, which includes a number of photosensitive cells that are arranged two-dimensionally and which includes first and second photosensitive cells that are adjacent to each other in a first direction; and a first light-splitting element, which is arranged to face the first photosensitive cell and which splits and refracts incident light toward a first direction. At least a portion of the light that has been split by the first light-splitting element enters the second photosensitive cell. Each of the first and second photosensitive cells outputs a photoelectrically converted signal based on the intensity of the light received. The intensity of the light that has been split by the first light-splitting element and then has entered the second photosensitive cell is detected by calculating a difference between the photoelectrically converted signals supplied from the first and second photosensitive cells.

In one preferred embodiment, color elements with the same optical property are arranged over the first and second photosensitive cells, and the intensity of the light that has been split by the first light-splitting element and then has entered the second photosensitive cell is detected by using a photoelectrically converted signal obtained through the color elements.

In another preferred embodiment, the solid-state imaging device further includes a second light-splitting element, which is arranged to face the second photosensitive cell and which splits and refracts the incident light toward a second direction that defines an angle with respect to the first direction. The intensity of the split light is detected by calculating a difference between the sum of photoelectrically converted signals supplied from the second photosensitive cells and the sum of photoelectrically converted signals supplied from the first and second photosensitive cells.

In a specific preferred embodiment, the angle is 90 degrees.

In still another preferred embodiment, the light that has been split by the first light-splitting element and then has entered the second photosensitive cell is an infrared ray.

In this particular preferred embodiment, an infrared ray image is produced based on the intensity of the infrared ray that has been split by the first light-splitting element and then has entered the second photosensitive cell.

In another preferred embodiment, a visible radiation image is produced by subtracting the intensity of the infrared ray that has been split by the first light-splitting element and then has entered the second photosensitive cell from the photoelectrically converted signal of each said photosensitive cell.

In this particular preferred embodiment, the array of photosensitive cells includes a third photosensitive cell that is adjacent in the second direction. The device further includes a third light-splitting element, which is arranged to face the third photosensitive cell and which splits and refracts the incident light toward the second direction. The second light-splitting element splits the incident light into blue and other color rays. The third light-splitting element splits the incident light into red and other color rays.

Yet another solid-state imaging device according to the present invention includes: an array of photosensitive cells; and an array of optical elements, in which a number of light-splitting elements are arranged one- or two-dimensionally over the array of photosensitive cells. Some or all of the photosensitive cells receive light that has been transmitted through multiple light-splitting elements that are included in the array of optical elements, thereby generating color signals. The three-dimensional arrangement of the light-splitting elements with respect to the photosensitive cells or the tilts of the light-splitting elements change from one position to another.

In one preferred embodiment, the distances between the light-splitting elements and the photosensitive cells vary from one position to another.

In another preferred embodiment, the arrangement pitches of the light-splitting elements and the photosensitive cells have an integral ratio of m to n, where n/m is not an integer.

In still another preferred embodiment, the light-splitting elements included in the array of optical elements have the same property.

In yet another preferred embodiment, the device includes: a high-refractive-index transparent portion that is made of a material with a relatively high refractive index; and a low-refractive-index transparent portion that is made of a material with a relatively low refractive index and that contacts with a side surface of the high-refractive-index transparent portion. The high-refractive-index transparent portion has a part that has a different thickness from the other parts in the direction in which the incident light travels.

Yet another solid-state imaging device according to the present invention includes: an array of a first type of optical elements, in which a number of upper light-splitting elements for splitting and refracting incident light toward a first direction are arranged to form a two-dimensional plane; an array of a second type of optical elements, in which a number of lower light-splitting elements for splitting and refracting the incident light toward a second direction, which intersects with the first direction, are arranged to form another two-dimensional plane; and an array of photosensitive cells, in which a number of photosensitive cells are arranged two-dimensionally. The array of the first type of optical elements and the array of the second type of optical elements are stacked one upon the other over the array of the photosensitive cells.

In one preferred embodiment, the first and second directions intersect with each other at right angles.

In this particular preferred embodiment, each said upper light-splitting element splits the incident light into two light rays falling within first and second wavelength ranges, respectively. Each said lower light-splitting element splits the incident light into two light rays falling within third and fourth wavelength ranges, respectively. The light rays falling within the first and second wavelength ranges have mutually complementary colors, and the light rays falling within the third and fourth wavelength ranges have mutually complementary colors.

In a specific preferred embodiment, the array of photosensitive cells receives light rays falling within the first through fourth wavelength ranges and generates an electrical signal by photoelectric conversion, and at least four color signals are obtained from the array of photosensitive cells.

In a more specific preferred embodiment, the upper light-splitting elements include first and second light-splitting elements, of which the light-splitting directions are different from each other by 180 degrees. The lower light-splitting elements include third and fourth light-splitting elements, of which the light-splitting directions are different from each other by 180 degrees. The array of photosensitive cells has a fundamental unit consisting of four photosensitive cells. Each of the four photosensitive cells receives a light ray falling within one of the first through fourth wavelength ranges and outputs a signal by photoelectric conversion.

In another preferred embodiment, the array of photosensitive cells includes a group of photosensitive cells that receives either light that has been split by the first or second light-splitting element or light that has been transmitted through neither the first nor second light-splitting element and performs photoelectric conversion.

In still another preferred embodiment, each said upper light-splitting element splits the incident light into light rays falling within a first wavelength range and including infrared and blue rays and light rays falling within a second wavelength range and including red and green rays. Each said lower light-splitting element splits the incident light into light rays falling within a third wavelength range and including infrared and red rays and light rays falling within a fourth wavelength range and including green and blue rays.

Advantageous Effects of Invention

A solid-state imaging device according to the present invention uses an array of optical elements with a light-splitting function (i.e., light-splitting elements), and therefore, does not need a color filter that absorbs light. As a result, higher optical efficiency is achieved. In addition, since at least two different types of light-splitting elements are used, at least two kinds of color components can be obtained from the photosensitive cells. If the signals supplied from multiple photosensitive cells are appropriately added together, a white component can be obtained. And by subtracting those two kinds of color components from the white component, another kind of color component can be produced. Consequently, if two types of light-splitting elements are used, high optical efficiency can be achieved and at least three different kinds of color signals that are needed to get color separation done can be obtained.

DESCRIPTION OF EMBODIMENTS

Figure 1A:
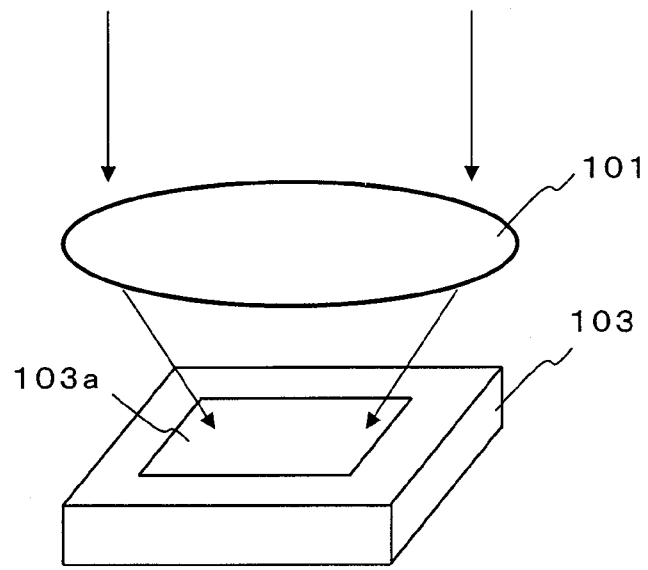
FIG. 1A is a perspective view illustrating a lens and an imager.

Hereinafter, preferred embodiments of the present invention will be described with reference to the accompanying drawings, in which any pair of components shown in multiple sheets and having substantially the same function will be identified by the same reference numeral.

Embodiment 1

FIG. 1a is a perspective view illustrating how light that has been transmitted through a lens 101 is incident on a solid-state imaging device 103. On the imaging plane 103a of the solid-state imaging device 103, arranged two-dimensionally are a lot of photosensitive cells. Since the light is imaged by the lens 101, the intensity of the light falling on the imaging plane 103a (which will be referred to herein as an "incident light intensity") varies according to the point of incidence. Those photosensitive cells are typically photodiodes, each of which outputs an electrical signal representing the incident light intensity by photoelectric conversion (such a signal will be referred to herein as a "photoelectrically converted signal"). The solid-state imaging device 103 is typically implemented as a CCD or a CMOS sensor and is fabricated by known semiconductor device processing. In the solid-state imaging device 103 of this preferred embodiment, an array of optical elements with a light-splitting function is arranged so as to face that side with the array of photosensitive cells. The solid-state imaging device 103 is electrically connected to a processing section including drivers, signal processors and other circuits (not shown), which will be described later.

Figure 1B:
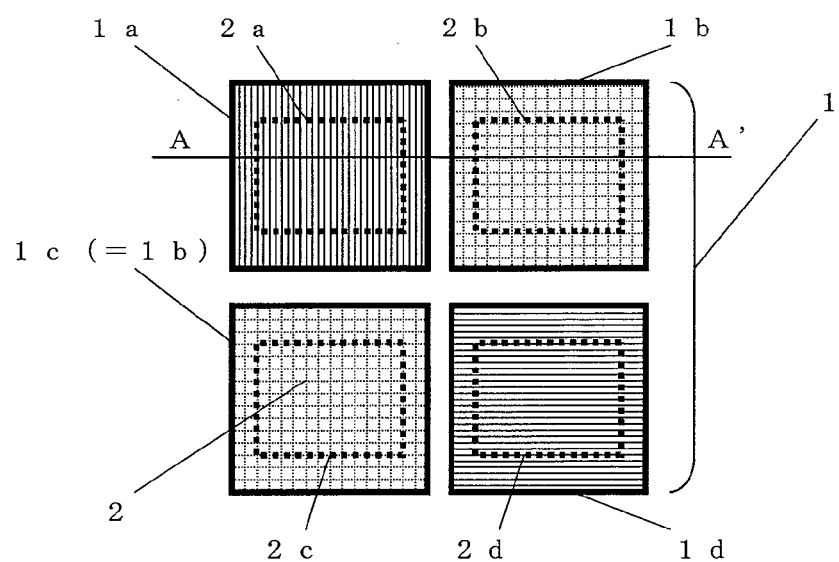
FIG. 1B is a plan view illustrating a fundamental unit according to a first preferred embodiment of the present invention.
Figure 1C:
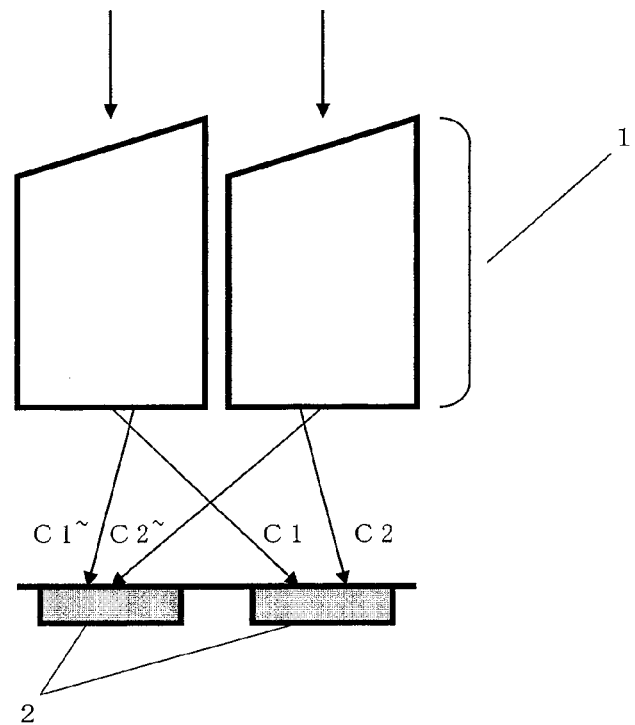
FIG. 1C is a cross-sectional view as viewed on the plane A-A' shown in FIG. 1A.
Figure 1D:
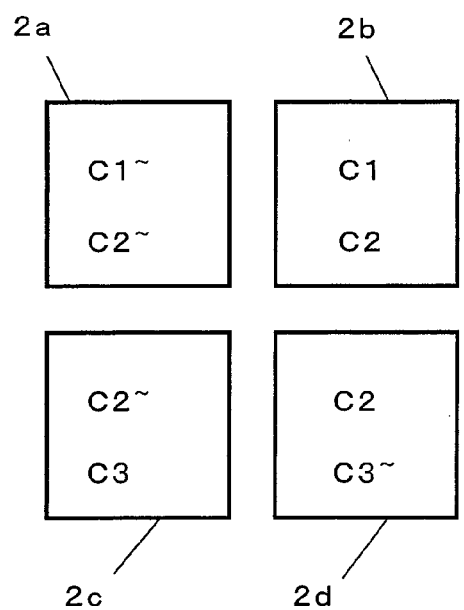
FIG. 1D is a plan view showing the kinds of light rays that enter photosensitive cells in the first preferred embodiment of the present invention.

FIG. 1B is a plan view illustrating the arrangement of an array of optical elements with respect to an array of photosensitive cells according to a first specific preferred embodiment of the present invention. A solid-state imaging device actually has an array of photosensitive cells, in which a huge number of photosensitive cells are arranged in columns and rows. However, FIG. 1B illustrates only a fundamental unit consisting of four photosensitive cells that are arranged in two columns and tow rows for the sake of simplicity. FIG. 1C is a cross-sectional view as viewed on the plane A-A' shown in FIG. 1B. And FIG. 1D is a plan view showing the kinds of light rays that enter photosensitive cells.

A solid-state imaging device according to the present invention can generate a color image signal by taking advantage of the light-splitting function of such an array of optical elements without using RGB color filters. More specifically, a preferred embodiment of the present invention is characterized in that each of some or all photosensitive cells that are included in such an array of photosensitive cells receive light rays that have come from multiple light-splitting elements. In the output signal of a single photosensitive cell, light rays falling within mutually different wavelength ranges have been superposed one upon the other. Even so, a color signal required can still be extracted by performing computations on the output signals of other photosensitive cells.

In the example illustrated in FIGS. 1B and 1C, each fundamental unit of the array 1 of optical elements includes four light-splitting elements 1a, 1b, 1c and 1d, each of which is an optical element with a light-splitting function. The array 1 of optical elements is arranged so as to cover the array of photosensitive cells including photosensitive cells 2a, 2b, 2c and 2d, which are associated with the light-splitting elements 1a, 1b, 1c and 1d, respectively.

As used herein, if "a photosensitive cell A is associated with a light-splitting element B", it means that at least a portion of the light that has been transmitted through the "light-splitting element A" enters the "photosensitive cell A". If the photosensitive cell A is associated with the light-splitting element B, then the light-splitting element B is typically arranged so as to cover the photosensitive cell A at least partially.

Figure 9:
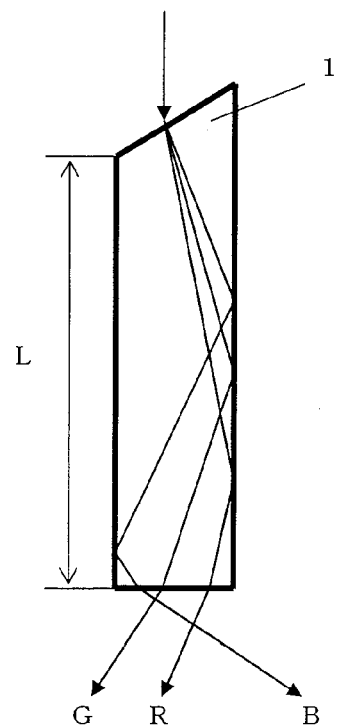
FIG. 9 is a front view illustrating a single light-splitting element according to a preferred embodiment of the present invention.

In this preferred embodiment, the light-splitting element 1c has the same property as the light-splitting element 1b. Each of the light-splitting elements 1a, 1b, 1c and 1d is a quadrangular prism light-splitting element as shown in FIG. 9. Such a prism type light-splitting element refracts the incident light at an angle that varies according to its wavelength and also changes its paths. That is why by adjusting the length L of such a light-splitting element, the point of incidence of each color ray on the photosensitive plane of a photosensitive cell can be controlled.

FIG. 9 illustrates a situation where the blue ray (B) is directed toward a cell that is adjacent to this light-splitting element and its complementary color ray (yellow=red (R)+green (G)) is directed toward a cell right under the light-splitting element. By adjusting the length L of the light-splitting element and its three-dimensional position with respect to its associated photosensitive cell, the colors of rays to enter a photosensitive cell right under the light-splitting element and an adjacent photosensitive cell can be changed. Such a light-splitting element can transmit light rays falling within mutually different wavelength ranges toward different directions with respect to the direction in which the incident light is traveling. To spatially split incident light into multiple components of light falling within mutually different wavelength ranges will be referred to herein as "splitting of light". Also, a light ray produced as a result of such splitting will sometimes be simply referred to herein as a "split light ray".

The prism type light-splitting element shown in FIG. 9 can transmit a light ray falling within a first wavelength range toward a direction that defines a first angle with respect to incident light and can also transmit a light ray falling within a second wavelength range (and representing the complementary color of that of the light ray falling within the first wavelength range) toward a direction that defines a second angle with respect to the incident light. Each of those split light rays falling within the respective wavelength ranges is in a plane including the incident light. That is why if the light-splitting element being arranged is turned on the optical axis of the incident light, then the direction of that plane including the split light ray can be changed.

Those light-splitting elements can be arranged either one-dimensionally or two-dimensionally in any of various patterns. By appropriately determining the arrangement pattern of those light-splitting elements, the incident light can be split into light rays falling within desired wavelength ranges, or some of those split light rays can be combined together if necessary, before those light rays strike on their associated photosensitive cells that form the array of photosensitive cells. As a result, a signal representing a required color component can be derived from a set of photoelectrically converted signals supplied from the photosensitive cells.

According to this first specific preferred embodiment, the light-splitting element $1a$ is paired with the light-splitting element $1b$ and the light-splitting element is is paired with the light-splitting element $1d$ so that each of those light-splitting elements makes two split light rays fall on a photosensitive cell that is located right under itself and on its adjacent photosensitive cell, respectively. Specifically, the light-splitting element $1a$ splits the incident light into two light rays so that a primary color ray C1 falls on an adjacent photosensitive cell and its complementary color ray C1~ falls straight down on a photosensitive cell. The light-splitting element $1b$ splits the incident light into two light rays so that a primary color ray C2 falls straight down on a photosensitive cell and its complementary color ray C2~ falls on an adjacent photosensitive cell. The light-splitting element $1c$ splits the incident light into two light rays so that a primary color ray C2 falls straight down on a photosensitive cell and its complementary color ray C2~ falls on an adjacent photosensitive cell. And the light-splitting element $1d$ splits the incident light into two light rays so that a primary color ray C3 falls on an adjacent photosensitive cell and its complementary color ray C3~ falls straight down on a photosensitive cell.

In the arrangement shown in FIG. 1B, the light that has been transmitted through the light-splitting element $1a$ is split so that the complementary color ray C1~ falls straight down on the photosensitive cell $2a$ and the primary color ray C1 falls on its adjacent photosensitive cell $2b$. The light that has been transmitted through the light-splitting element $1b$ is split so that the primary color ray C2 falls straight down on the photosensitive cell $2b$ and its complementary color ray C2~ falls on its adjacent photosensitive cell $2a$. The light that has been transmitted through the light-splitting element $1c$ is split so that the primary color ray C2 falls straight down on the photosensitive cell $2c$ and its complementary color ray C2~ falls on its adjacent photosensitive cell $2d$. And the light that has been transmitted through the light-splitting element $1d$ is split so that the complementary color ray C3~ falls straight down on the photosensitive cell $2d$ and the primary color ray C3 falls on its adjacent photosensitive cell $2c$.

Thus, as can be seen easily from FIG. 1D, supposing the intensities of the light received by the respective photosensitive cells $2a$, $2b$, $2c$ and $2d$ are identified by S2a, S2b, S2c and S2d, respectively, S2a, S2b, S2c and S2d are calculated by the following equations:

$$S2a = C1^\sim + C2^\sim \quad (1)$$

$$S2b = C1^\sim + C2 \quad (2)$$

$$S2c = C2 + C3 \quad (3)$$

$$S2d = C2^\sim + C3^\sim \quad (4)$$

where C1 and other signs represent the intensity of the light ray (i.e., primary color ray or complementary color ray) that is identified by that sign.

In this case, C1~=C2+C3, C2~=C1+C3, and C3~=C1+C2. Also, supposing the light intensity of white ray is identified by W, W=C1+C2+C3. Thus, Equations (1) through (4) can be rewritten into the following Equations (5) through (8):

$$S2a = W + C3 \quad (5)$$

$$S2b = W - C3 \quad (6)$$

$$S2c = W - C1 \quad (7)$$

$$S2d = W + C1 \quad (8)$$

Furthermore, by adding Equations (5) and (6) together, subtracting Equation (6) from Equation (5), adding Equations (7) and (8) together, and subtracting Equation (7) from Equation (8), respectively, the following Equations (9) through (12) can be derived:

$$S2a + S2b = 2W \quad (9)$$

$$S2a - S2b = 2C3 \quad (10)$$

$$S2d + S2c = 2W \quad (11)$$

$$S2d - S2c = 2C1 \quad (12)$$

As a result, by performing simple arithmetic operations between the horizontal photosensitive cells shown in these drawings, two pieces of color information and two pieces of luminance information can be obtained. And information about the other color can also be obtained by calculating 2W−2C1−2C3. Supposing C1, C2 and C3 represent the light intensities of red (R), green (G) and blue (B) rays, respectively, two color signals 2R and 2B and two luminance signals 2W can be obtained from the four optical elements in the example described above. Thus, it can be seen that the quantity of the signals obtained is twice as large as that of R and B signals obtained from a conventional Bayer arrangement.

As described above, according to the first preferred embodiment of the present invention, the group of light-splitting elements (i.e., the array of optical elements) splits the incident light into three color rays Ci, Cj and Ck and its complementary color rays Ci~, Cj~ and Ck~. Using two of these light rays, two primary color rays are made to fall on a photosensitive cell, thereby obtaining (Ci+Cj). And if two complementary color rays are made to fall on an adjacent photosensitive cell, (Ci~+Cj~) can be obtained. That is why by subtracting one of them from the other, the remaining light component Ck can be extracted efficiently. And if similar processing is carried out on different combinations, the three primary colors can be extracted efficiently. On top of that, since no light is absorbed unlike the conventional subtractive color filters, high optical efficiency can be achieved as well.

Embodiment 2

Figure 2A:
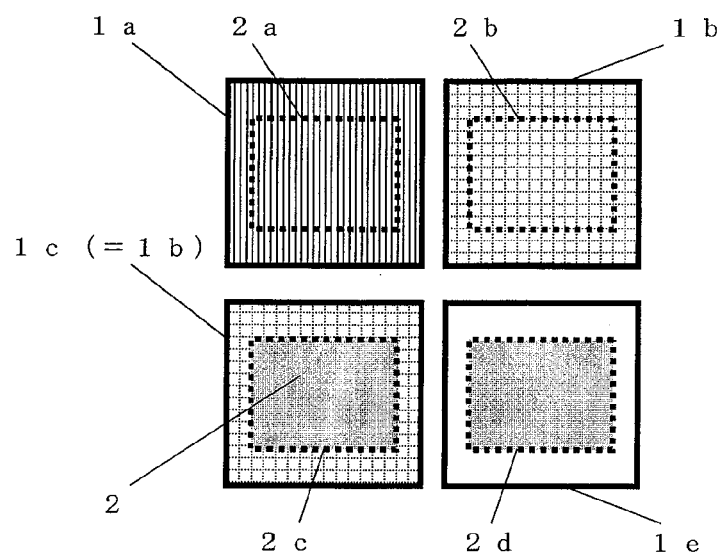
FIG. 2A is a plan view illustrating a fundamental unit according to a second preferred embodiment of the present invention.
Figure 2B:
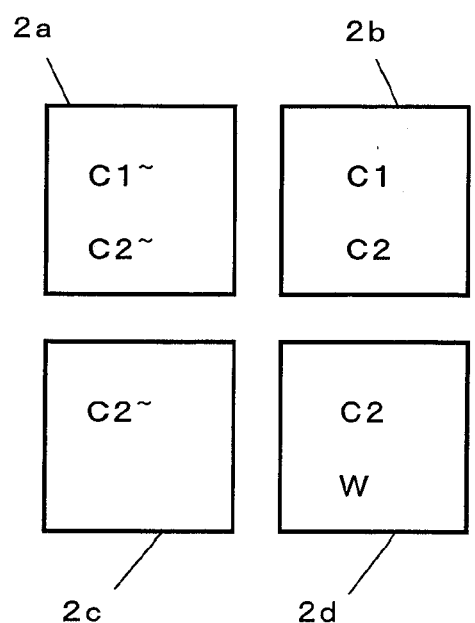
FIG. 2B is a plan view showing the kinds of light rays that enter photosensitive cells in the second preferred embodiment of the present invention.

Hereinafter, a second preferred embodiment of the present invention will be described with reference to the accompanying drawings. FIG. 2A is a plan view illustrating the arrangement of an array of optical elements according to this second preferred embodiment of the present invention in an imager that uses a 2 by 2 matrix of photosensitive cells as its fundamental unit. FIG. 2B is a plan view illustrating the kinds of light rays to be incident on those photosensitive cells.

The fundamental unit of this preferred embodiment is similar to that of the first preferred embodiment described above but is different from its counterpart in that an element associated with the light-splitting element 1d in the array of optical elements is a transparent element 1e, not the photosensitive cell.

The light-splitting elements 1a and b of this preferred embodiment are the same as their counterparts 1a and 1b of the first preferred embodiment described above. That is why the photosensitive cells 2a and 2b right under those elements 1a and b also receive light with the same intensity as in the first preferred embodiment, as can be seen from FIG. 2B. Thus, by performing addition and subtraction between the two horizontally adjacent photosensitive cells 2a and 2b, a color signal 2C3 and a luminance signal 2W can be obtained. On the other hand, since the transparent element 1e does not split the incident light, the photosensitive cell 2d right under the transparent element 1e does receive the light W but also receives the complementary color ray $C2^\sim$ from its adjacent light-splitting element 1c (see FIG. 2B). Also, unlike the first preferred embodiment described above, the photosensitive cell 2c does not receive light from an adjacent light-splitting element but receives only the primary color ray C2 from the light-splitting element 1c. Consequently, the intensities S2c and S2d of the light received by the photosensitive cells 2c and 2d are given by the following Equations (13) and (14), respectively:

$$S2c = W(C1+C3) \quad (13)$$

$$S2d = W+(C1-C3) \quad (14)$$

It should be noted that Equation (13) could also be represented as S2c=C2 but is represented in this example using W.

Although the results of calculations are partially different from those of the first preferred embodiment described above, 2C3 and 2W can also be obtained by Equations (9) and (10) and color information 2C1+2C3 and luminance information 2W can also be extracted by either adding Equations (13) and (14) together or subtracting one of them from the other. Based on these results, 2C1 and 2C3 can also be calculated by performing simple addition and subtraction.

As described above, according to this second preferred embodiment of the present invention, even if some light-splitting element is replaced with a transparent element, a photosensitive cell right under that transparent element receives not only the light W but also a split light ray that has come from an adjacent light-splitting element. As a result, color information can be extracted efficiently by performing subtraction on its adjacent photosensitive cell. Consequently, according to this second preferred embodiment, the performance will be improved compared to the prior art no less significantly than in the first preferred embodiment. On top of that, as the transparent element is also included, there is no need to make a light-splitting element for every photosensitive cell. Consequently, the number of process steps to fabricate the light-splitting elements can be decreased by one, which is advantageous to simplify the process of making such an array of optical elements and make it more cost effective.

Embodiment 3

Figure 3A:
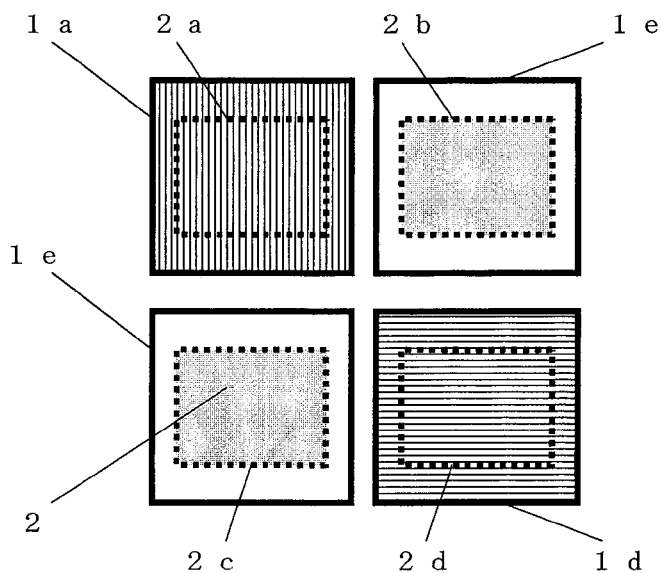
FIG. 3A is a plan view illustrating a fundamental unit according to a third preferred embodiment of the present invention.
Figure 3B:
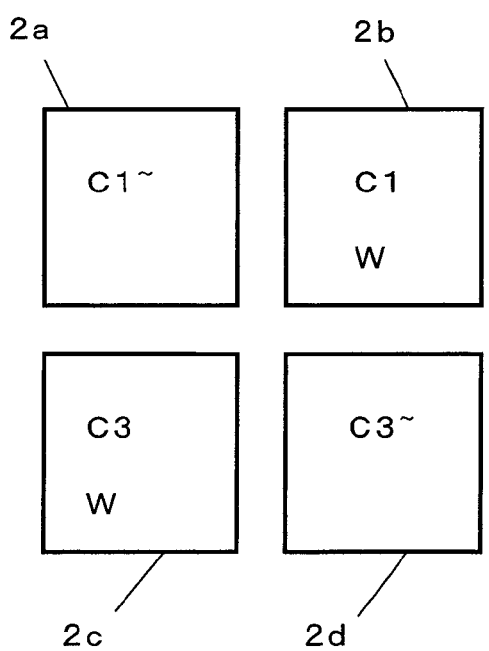
FIG. 3B is a plan view showing the kinds of light rays that enter photosensitive cells in the third preferred embodiment of the present invention.

Hereinafter, a third preferred embodiment of the present invention will be described with reference to the accompanying drawings. FIG. 3 is a plan view illustrating the arrangement of an array of optical elements according to this third preferred embodiment of the present invention in an imager that uses a 2 by 2 matrix of photosensitive cells as its fundamental unit. FIG. 3B is a plan view illustrating the kinds of light rays to be incident on those photosensitive cells.

The fundamental unit of the array of optical elements of this preferred embodiment is similar to that of the first preferred embodiment described above but is different from its counterpart in that elements associated with the light-splitting element 1b and 1c in the array of optical elements are transparent elements 1e. But other than that, the fundamental unit of this preferred embodiment is quite the same as that of the first preferred embodiment. That is to say, in the 2 by 2 fundamental cell unit, only one transparent element is included according to the second preferred embodiment, but two transparent elements are used according to this preferred embodiment.

According to this preferred embodiment, two transparent elements 1e are used in each unit and the photosensitive cells 2b and 2c right under those transparent elements 1e receive the light W. The photosensitive cell 2b also receives the primary color ray C1 from its adjacent light-splitting element 1a and the photosensitive cell 2c also receives the primary color ray C3 from its adjacent light-splitting element 1d. On the other hand, as the elements adjacent to the photosensitive cells 2a and 2d are transparent elements, the photosensitive cells 2a and 2d receive no light from those adjacent elements. As a result, the photosensitive cell 2a receives only the complementary color ray $C1^\sim$ and the photosensitive cell 2d receives only the complementary color ray $C3^\sim$.

As a result, the intensities of the light received by the photosensitive cells 2a, 2b, 2c and 2d are as shown in FIG. 3B and given by the following Equations (15) to (18):

$$S2a = W-C1 \quad (15)$$

$$S2b = W+C1 \quad (16)$$

$$S2c = W-C3 \quad (17)$$

$$S2d = W-C3 \quad (18)$$

It should be noted that Equations (15) and (18) could also be represented as $S2a=C1^\sim$ and $S2d=C3^\sim$, respectively, but are represented in this example using W.

As a result, by adding Equations (15) and (16) together and subtracting one of them from the other, the color information 2C1 and the luminance information 2W can be extracted. And by adding Equations (17) and (18) together and subtracting one of them from the other, the color information 2C3 and the luminance information 2W can be extracted. As can be seen, even if a plurality of light-splitting elements are replaced with transparent elements, the color information can still be extracted efficiently enough and the sensitivity can also be increased significantly compared to the prior art as long as there are two types of light-splitting elements.

It should be noted that if such a transparent element is used as already described for the second and third preferred embodiments of the present invention, the light-splitting element adjacent to that transparent element preferably splits the incident light so that the photosensitive cell right under that light-splitting element receives as much light as possible, because a pixel signal to be produced by conversion will be better balanced in that case.

For example, suppose the transparent element is adjacent to a light-splitting element that splits the incident light into a blue (B) ray and its complementary color (i.e., yellow=R+G) ray. In that case, if the yellow ray is made to fall on the photosensitive cell right under the light-splitting element and if the blue ray is made to fall on the photosensitive cell associated with the transparent element, then the intensities of the light rays received there will be (R+G) and (W+B), respectively, which will have a difference of 2B between them. On the other hand, if the light-splitting element makes the blue ray fall straight down on the photosensitive cell and also makes the yellow ray fall on the photosensitive cell associated with the transparent element, then the intensities of the light rays received will be B and (W+R+G), respectively, of which the difference will be (2R+2G). In the latter case, the difference between the signals representing the respective intensities of light rays received is bigger than in the former case. And if there is such a big difference between those signals representing the received light intensities, then the output signals of the photosensitive cells will have more varying level differences between them before reaching their saturation levels. Consequently, even if the intensity of the incident light is the same, the pixel signals may get saturated in some photosensitive cells but not in the others, which is a problem. For these reasons, the former case is preferred because the pixel signals will be better balanced and will exhibit better dynamic range performance.

In addition, as for a light-splitting element that splits the incident light into a primary color ray and its complementary color ray as described above, a primary color signal can be extracted directly in the former case. In short, the structure of light-splitting elements is preferably designed so that a light-splitting element adjacent to a transparent element makes a complementary color ray fall straight down on a photosensitive cell and also makes a primary color ray fall on a photosensitive cell associated with the transparent element.

Embodiment 4

Figure 4A:
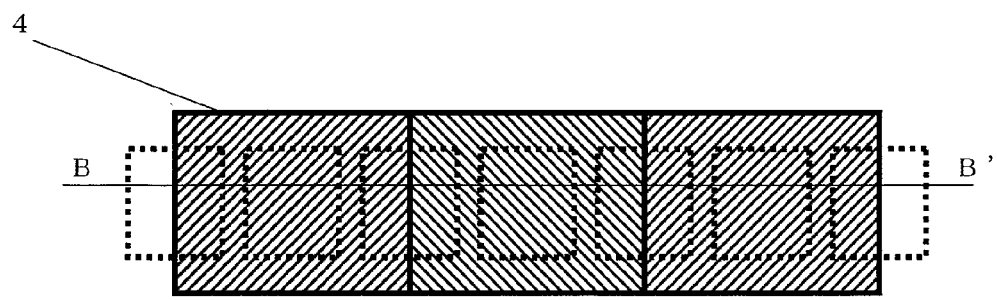
FIG. 4A is a plan view illustrating a fundamental unit according to a fourth preferred embodiment of the present invention.
Figure 4B:
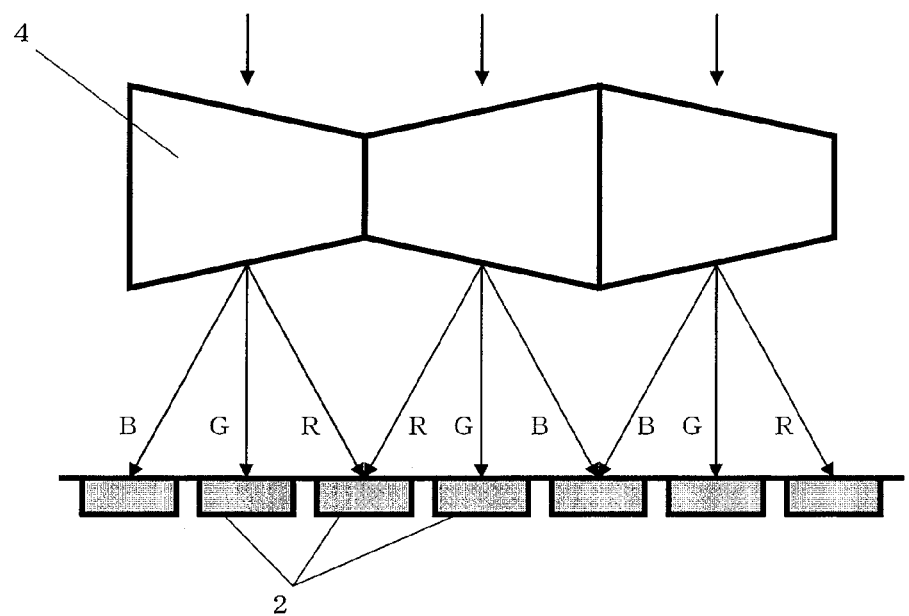
FIG. 4B is a cross-sectional view as viewed on the plane B-B' shown in FIG. 4A.

Hereinafter, a fourth specific preferred embodiment of the present invention will be described with reference to the accompanying drawings. This fourth preferred embodiment is characterized by using a light-splitting element that splits incident light into the three color rays of R, G and B. FIG. 4A is a plan view illustrating the arrangement of an array of optical elements according to this fourth preferred embodiment of the present invention in an imager that uses photosensitive cells arranged in two columns and one row as its fundamental unit. FIG. 4B is a cross-sectional view as viewed on the plane B-B' shown in FIG. 4A.

In the example illustrated in FIGS. 4A and 4B, the array 4 of optical elements is an array of prism type light-splitting elements. Specifically, in this array 4 of optical elements, quadrangular prism light-splitting elements are arranged two-dimensionally so that every other light-splitting element has its direction changed by 180 degrees. In this case, the light-splitting element has basically the same configuration as the quadrangular prism light-splitting element as already described for the first preferred embodiment. The prism of this preferred embodiment, however, has a sloped emitting plane so as to further spread the red (R), green (G) and blue (B) rays and is also designed so that two out of the three color rays fall on mutually different adjacent photosensitive cells. Nevertheless, the ratio of the number of light-splitting elements to that of photosensitive cells is one to two, and one photosensitive cell is arranged right under each light-splitting element and another photosensitive cell is arranged between two light-splitting elements.

In the arrangement shown in FIGS. 4A and 4B, a number of light-splitting elements are arranged in pairs, and therefore, a G ray falls on a photosensitive cell right under each light-splitting element and 2R or 2B rays fall on a photosensitive cell located between two light-splitting elements. As a result, RGB signals can be extracted from a single row in the order of 2B, G, 2R, G, 2B, G, 2R and so on. Compared to conventional color filters, the intensity of the G ray received remains the same but a photosensitive cell that receives R or B rays get those rays from two different light-splitting elements. Accordingly, the number of pixels can be reduced and the intensity of the R or B ray received can be doubled. In the example described above, a light-splitting element that splits incident light into three light rays is supposed to be used. However, as long as multiple light rays are received by a single photosensitive cell as described above, the light-splitting element may also split the incident light into more than three light rays as well.

As described above, according to this fourth preferred embodiment of the present invention, by using at least one type of light-splitting elements that split the incident light into at least three rays, RGB signals can be extracted with no loss and two R or G rays can be received at a single photosensitive cell. Consequently, the number of pixels can be reduced.

Embodiment 5

Figure 5A:
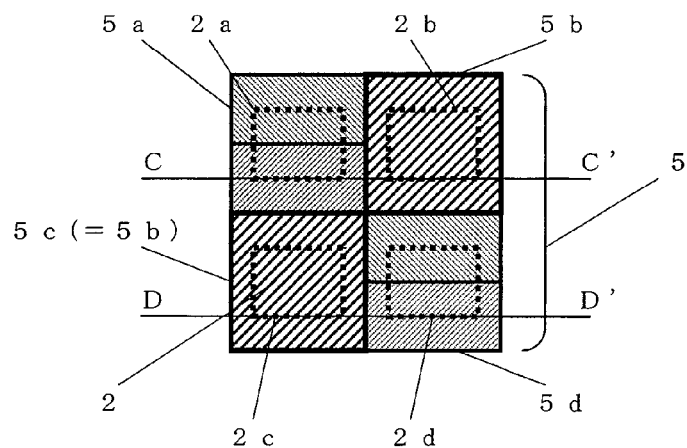
FIG. 5A is a plan view illustrating a fundamental unit according to a fifth preferred embodiment of the present invention.
Figure 5B:
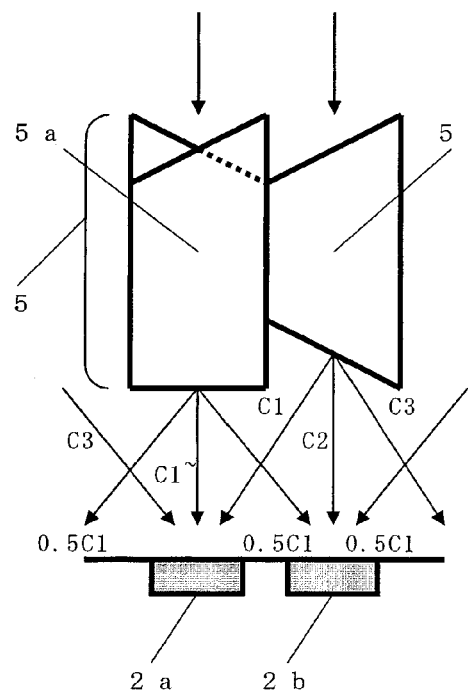
FIG. 5B is a cross-sectional view as viewed on the plane C-C' shown in FIG. 5A.

Hereinafter, a fifth preferred embodiment of the present invention will be described with reference to the accompanying drawings. FIG. 5A is a plan view illustrating the arrangement of an array of optical elements according to this fifth preferred embodiment of the present invention in an imager that uses a 2 by 2 matrix of photosensitive cells as its fundamental unit. FIG. 5B is a cross-sectional view as viewed on the plane C-C' shown in FIG. 5A, and FIG. 5C is a cross-sectional view as viewed on the plane D-D' shown in FIG. 5A.

Figure 5C:
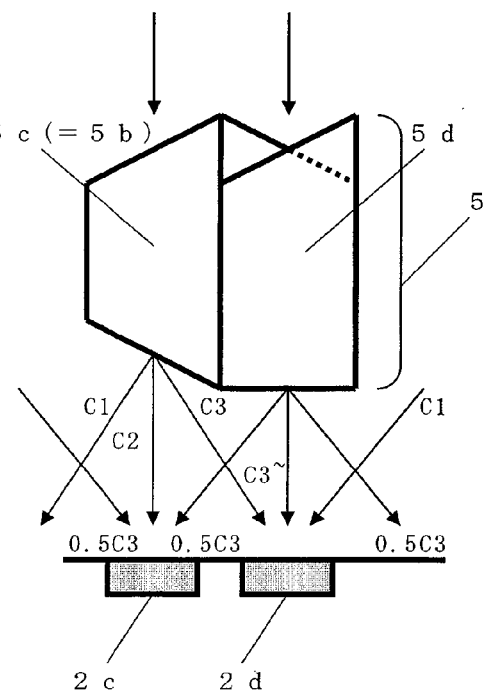
FIG. 5C is a cross-sectional view of the fundamental unit of the fifth preferred embodiment of the present invention as viewed on the plane D-D' shown in FIG. 5A.

In the example illustrated in FIGS. 5A, 5B and 5C, the array 5 of optical elements includes light-splitting elements 5a, 5b, 5c and 5d of a light-splitting type.

In this fifth preferred embodiment, the light-splitting element 5c has the same property as the light-splitting element 5b. Just like their counterparts of the fourth preferred embodiment described above, the light-splitting elements 5b and 5c have a sloped emitting plane to spread the light rays in the three primary colors, two of which can enter mutually different adjacent photosensitive cells.

The light-splitting elements 5a and 5d have mutually different properties but have the same structure. Each of these light-splitting elements 5a and 5d makes a split light ray Ci fall straight down and also makes its complementary color ray $Ci^-$ fall toward a direction that defines a certain angle with respect to that of the split light ray Ci. Each of these light-splitting elements 5a and 5d is obtained by preparing two light-splitting elements 1 shown in FIG. 9 and bonding them together so that the elements 1 face two opposite directions. By adopting such a structure, the split light ray Ci can fall right under the light-splitting element and its complementary color ray $Ci^-$ can fall toward a direction that defines a certain angle with respect to that of the split light ray Ci. Also, the light-splitting property of each of these light-splitting elements can also be modified by changing its length.

Figure 10:
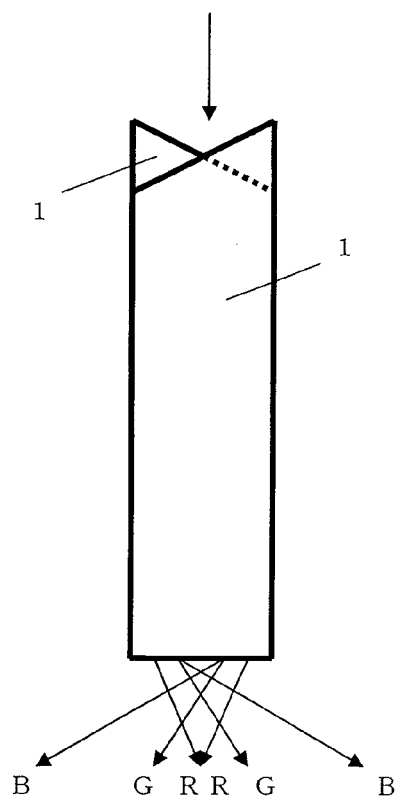
FIG. 10 is a front view illustrating a light-splitting element 5a or 5d according to the fifth preferred embodiment of the present invention.

FIG. 10 illustrates a situation where Ye (R+G) rays are made to fall right under a light-splitting element and B rays are made to fall to the left and the right. If split light rays Ci in a certain color are made to fall right under a light-splitting element, one of two complementary color rays of the split light rays Ci will fall toward an adjacent cell on the right-hand side and the other complementary color ray will fall toward another adjacent cell on the left-hand side. In the array of optical elements of this preferred embodiment, the light-splitting elements 5a and 5d are designed so that those light rays falling to the right and the left will enter two photosensitive cells that are adjacent to the photosensitive cell right under the light-splitting element 5a, 5d.

According to this fifth preferred embodiment, the light-splitting elements 5a and 5b form one pair, and the light-splitting elements 5c and 5d form another. And each of those light-splitting elements makes split light rays enter a photosensitive cell right under itself and its adjacent photosensitive cells. Specifically, in this case, the light-splitting element 5a splits the incident light so that primary color rays 0.5C1 will enter adjacent photosensitive cells and their complementary color ray C1~ will enter a photosensitive cell right under itself. The light-splitting element 5b splits the incident light into three light rays C1, C2 and C3 and makes the split light ray C2 enter a photosensitive cell right under itself and also makes the split light rays C1 and C3 enter adjacent photosensitive cells. Just the light-splitting element 5b, the light-splitting element 5c makes the split light ray C2 enter a photosensitive cell right under itself and also makes the split light rays C1 and C3 enter adjacent photosensitive cells. And the light-splitting element 5d makes primary color rays 0.5C3 enter adjacent photosensitive cells and also makes their complementary color ray C3~ enter a photosensitive cell right under itself.

According to the arrangement shown in FIG. 5A, the incident light is transmitted through the light-splitting element 5a so that C1~ will enter the photosensitive cell 2a right under itself and 0.5C1+0.5C1 (=C1) will enter the adjacent photosensitive cells 2b. On the other hand, the incident light is transmitted through the light-splitting element 5b so that C2 will enter the photosensitive cell 2b right under itself and C1 and C3 will enter the adjacent photosensitive cells 2a. Likewise, the incident light is transmitted through the light-splitting element 5c so that C2 will enter the photosensitive cell 2c right under itself and C1 and C3 will enter the adjacent photosensitive cells 2d. And the incident light is transmitted through the light-splitting element 5d so that C3~ will enter the photosensitive cell 2d right under itself and 0.5C3+0.5C3 (=C3) will enter the adjacent photosensitive cells 2c.

As a result, the intensities of the light rays received by the photosensitive cells 2a, 2b, 2c and 2d are given by the following Equations (19) to (22):

$$S2a = C1^\sim + C1 + C3 \quad (19)$$

$$S2b = C1 + C2 \quad (20)$$

$$S2c = C2 + C3 \quad (21)$$

$$S2d = C1 + C3 + C3^\sim \quad (22)$$

In this case, if the relations $W = C1 + C1^\sim = C3 + C3^\sim$, $C1 + C2 = W - C3$ and $C2 + C3 = W - C1$ are applied, these Equations (19) to (22) can be rewritten into Equations (5) to (8). As a result, the equations representing the results become the same as their counterparts of the first preferred embodiment described above. Consequently, the same effects as in the first preferred embodiment are achieved.

As described above, according to the fifth preferred embodiment of the present invention, the device includes a first light-splitting element that transmits a light ray falling within a first wavelength range toward a direction that defines a first angle with respect to incident light and also transmits a light ray falling within a second wavelength range toward a direction that defines a second angle with respect to the incident light. The light rays falling within the first and second wavelength ranges have mutually complementary colors. The device further includes a second light-splitting element for splitting the incident light into light rays falling within third, fourth and fifth wavelength ranges, respectively. The first and second light-splitting elements are alternately arranged adjacent to each other. The light ray falling within the second wavelength range that has been transmitted through the first light-splitting element and the light rays falling within the third and fifth wavelength ranges that have been transmitted through the second light-splitting element enter the photosensitive cell associated with the first light-splitting element. On the other hand, the light ray falling within the first wavelength range that has been transmitted through the first light-splitting element and the light ray falling within the fourth wavelength range that has been transmitted through the second light-splitting element enter the photosensitive cell associated with the second light-splitting element. As a result, color signals can be extracted efficiently by performing simple arithmetic operations between the photosensitive cells, thus achieving high optical efficiency.

Embodiment 6

Figure 6:
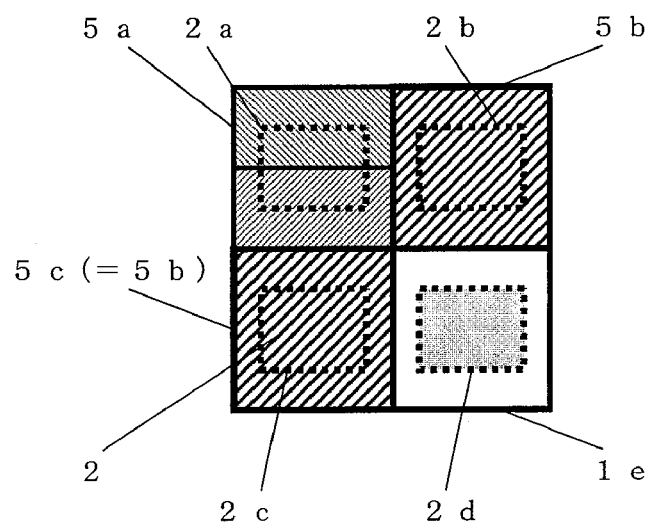
FIG. 6 is a plan view illustrating a fundamental unit according to a sixth preferred embodiment of the present invention.

Hereinafter, a sixth specific preferred embodiment of the present invention will be described with reference to the accompanying drawings. FIG. 6 is a plan view illustrating the arrangement of an array 5 of optical elements according to this sixth preferred embodiment of the present invention in an imager that uses a 2 by 2 matrix of photosensitive cells as its fundamental unit. The fundamental unit of this array of optical elements is similar to that of the array 5 of optical elements according to the fifth preferred embodiment but is different from the counterpart of the fifth preferred embodiment in that the element associated with the light-splitting element 5d is replaced with a mere transparent element 1e.

Comparing this preferred embodiment to the fifth preferred embodiment described above, it can be seen that the same light-splitting elements 5a and 5b are used in these two embodiments, and therefore, the intensities of light rays received by the photosensitive cells 2a and 2b right under the light-splitting elements 5a and 5b are also the same. That is why according to this preferred embodiment, the color signal 2C3 and the luminance signal 2W can also be obtained by performing addition and subtraction between the horizontally adjacent photosensitive cells 2a and 2b. On the other hand, since the transparent element 1e does not contribute to splitting the incident light, the photosensitive cell 2d right under the transparent element 1e receives not only the light W but also C1+C3 that has come from the light-splitting element 5c adjacent to the transparent element 1e. Unlike the fifth preferred embodiment described above, the photosensitive cell 2c does not receive the light that has come from the light-splitting element adjacent to the light-splitting element 5c, and therefore, receives only C2 from the light-splitting element 5c.

As a result, the intensities S2c and S2d of the light rays received by the photosensitive cells 2c and 2d satisfy $S2c = W - (C1 + C3)$ and $S2d = W + (C1 + C3)$. By performing these addition and subtraction operations, color information 2C1+2C3 and luminance information 2W can be retrieved. These results are quite the same as those of the second preferred embodiment described above, and therefore, the same effects are achieved as in the second preferred embodiment.

Embodiment 7

Figure 7:
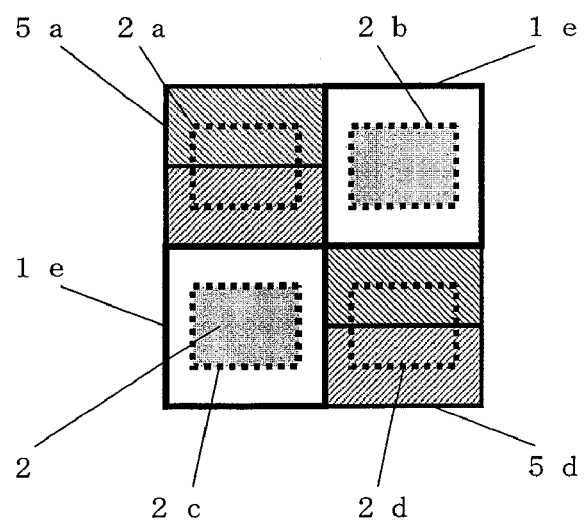
FIG. 7 is a plan view illustrating a fundamental unit according to a seventh preferred embodiment of the present invention.

Hereinafter, a seventh specific preferred embodiment of the present invention will be described with reference to the accompanying drawings. FIG. 7 is a plan view illustrating the arrangement of an array of optical elements according to this seventh preferred embodiment of the present invention in an imager that uses a 2 by 2 matrix of photosensitive cells as its fundamental unit. The fundamental unit of this array of optical elements is similar to that of the fifth preferred embodiment but is different from the counterpart of the fifth preferred embodiment in that the elements associated with the light-splitting elements 5b and 5c in the array 5 of optical elements are replaced with mere transparent elements 1e. That is to say, in the fundamental unit of the array of optical elements, only one transparent element is included according to the sixth preferred embodiment, but two transparent elements are used according to this preferred embodiment.

According to this preferred embodiment, the fundamental unit of the array of optical elements includes two transparent elements 1e and the photosensitive cells 2b and 2c right under those transparent elements 1e receive the light W. The photosensitive cell 2b also receives 0.5C1+0.5C1 (=C1) from its adjacent light-splitting element 5a and the photosensitive cell 2c also receives 0.5C3+0.5C3 (=C3) from its adjacent light-splitting element 5d. On the other hand, as the elements adjacent to the photosensitive cells 2a and 2d are transparent elements, the photosensitive cells 2a and 2d receive no light from those adjacent elements. As a result, the photosensitive cell 2a receives only C1⁻ and the photosensitive cell 2d receives only C3⁻. These light rays received are totally the same as in the third preferred embodiment described above, and therefore, the same effects would be achieved, too.

As already described for the third preferred embodiment, in these sixth and seventh preferred embodiments, the light-splitting element adjacent to that transparent element preferably has such a property that has the photosensitive cell right under that light-splitting element receive as much light as possible, because a pixel signal to be produced by conversion will be better balanced in that case.

Embodiment 8

Hereinafter, an eighth preferred embodiment of the present invention will be described. In each of the preferred embodiments of the present invention described above, the array of optical elements uses prism type light-splitting elements. An array of optical elements according to this preferred embodiment, however, uses another type of light-splitting elements that are made of materials with mutually different refractive indices.

Figure 8A:
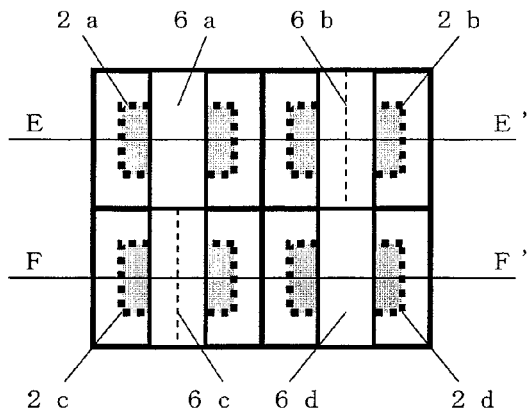
FIG. 8A is a plan view illustrating a fundamental unit according to an eighth preferred embodiment of the present invention.

FIG. 8A is a plan view illustrating the arrangement of an array of photosensitive cells and an array of optical elements in an imager as an eighth specific preferred embodiment of the present invention. FIG. 83 is a cross-sectional view as viewed on the plane E-E' shown in FIG. 8A, and FIG. 8C is a cross-sectional view as viewed on the plane F-F' shown in FIG. 8A.

Figure 8B:
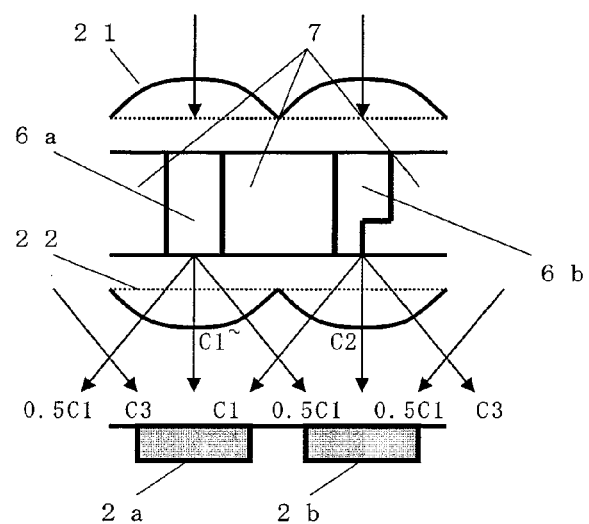
FIG. 8B is a cross-sectional view as viewed on the plane E-E' shown in FIG. 8A.
Figure 8C:
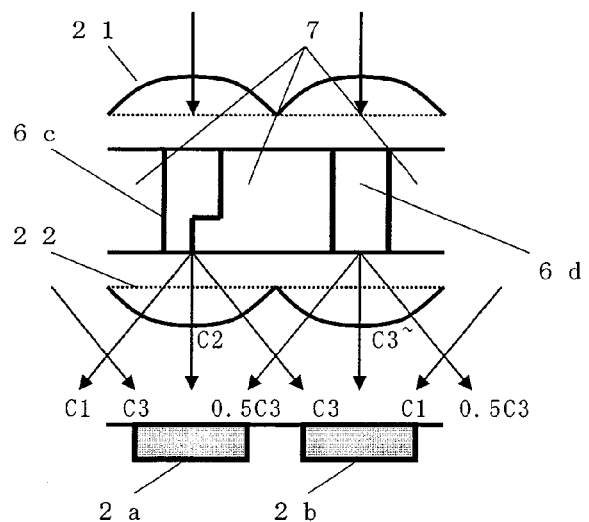
FIG. 8C is a cross-sectional view as viewed on the plane F-F' shown in FIG. 8A.

In the example illustrated in FIGS. 8A to 8C, the imager includes high-refractive-index transparent portions (core portions) 6a through 6d, which are made of a material with a relatively high refractive index, and low-refractive-index transparent portions (clad portions) 7, which are made of a material with a relatively low refractive index and which contact with side surfaces of the high-refractive-index transparent portions 6a through 6d. The high-refractive-index transparent portions 6a and 6d have a simple rectangular parallelepiped shape but refract the incident light due to a difference in refractive index from the low-refractive-index transparent portions 7. That is why each of the high-refractive-index transparent portions 6a and 6b directs split primary color rays (e.g., two 0.5C1 rays or two 0.5C3 rays to the right and the left with respect to the thickness direction) toward photosensitive cells that are adjacent to the photosensitive cell right under itself and also makes a complementary color ray (such as C1⁻ or C3⁻) fall straight down.

On the other hand, each of the high-refractive-index transparent portions 6b and 6c has a shape in which two rectangular parallelepipeds with different widths are combined together and has a step at the end closest to its associated photosensitive cell. Due to a difference in refractive index between the high-refractive-index transparent portions 6b, 6c and the transparent portion 7, the incident light gets diffracted to produce zero-order and minus-first-order diffracted light rays. And due to a difference in angle of diffraction, each diffracted light ray is split into primary color rays C1, C2 and C3.

Such diffractive light-splitting elements are disclosed in Japanese Patent Applications Nos. 2008-551594 and 2008-202159, for example, the entire disclosure of which are hereby incorporated by reference. An array of optical elements, including such light-splitting elements, may be fabricated by performing thin-film deposition and patterning processes by known semiconductor device processing technologies.

According to this preferred embodiment, to increase the optical efficiency of the high-refractive-index transparent portions 6a through 6d, micro lenses 21 and inner lenses 22 are arranged over and under the high-refractive-index transparent portions 6a through 6d, respectively. Since the incident light can be split according to this preferred embodiment due to the presence of the high-refractive-index transparent portions 6a through 6d, those high-refractive-index transparent portions will also be regarded herein as "light-splitting elements". The two-dimensional relative arrangement of those light-splitting elements and the photosensitive cells and splitting of the incident light according to this preferred embodiment are the same as what has already been described for the fifth preferred embodiment. As a result, pixel signals are also processed in the same way.

As described above, even when two groups of light-splitting elements that are made of mutually different materials and that produce diffraction of light are used, color signals can also be extracted as efficiently as in the fifth preferred embodiment by performing simple arithmetic operations between the photosensitive cells. As a result, a color imager that achieves high optical efficiency is realized.

Embodiment 9

Figure 11A:
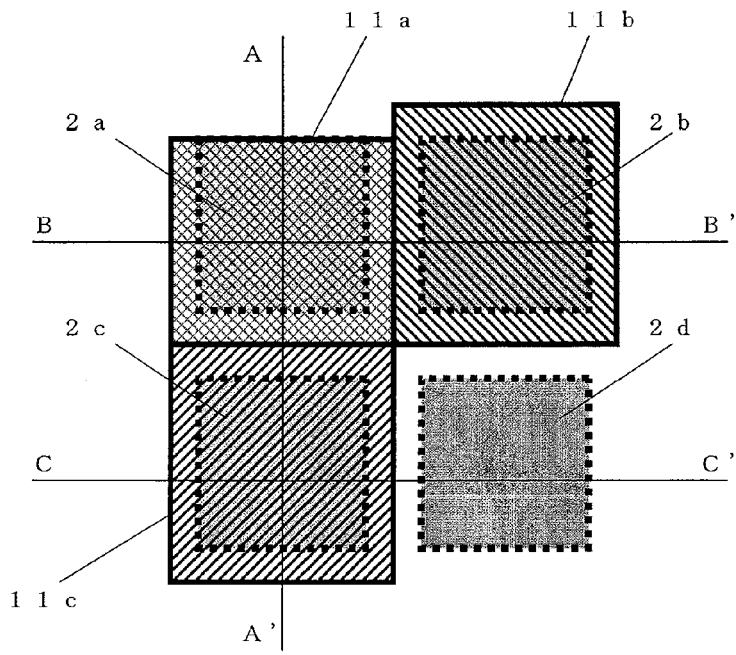
FIG. 11A is a plan view illustrating the arrangement of optical elements with respect to photosensitive cells in an imager according to a ninth preferred embodiment of the present invention.
Figure 11B:
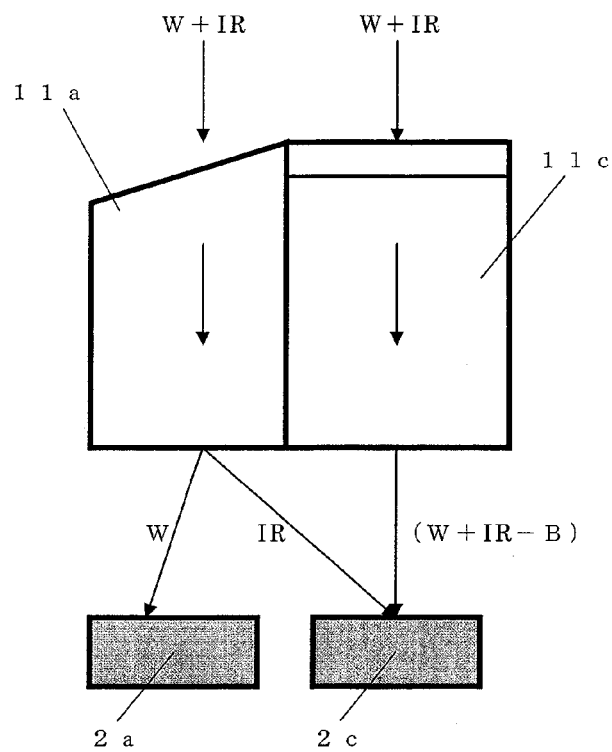
FIG. 11B is a cross-sectional view as viewed on the plane A-A' shown in FIG. 11A.
Figure 11C:
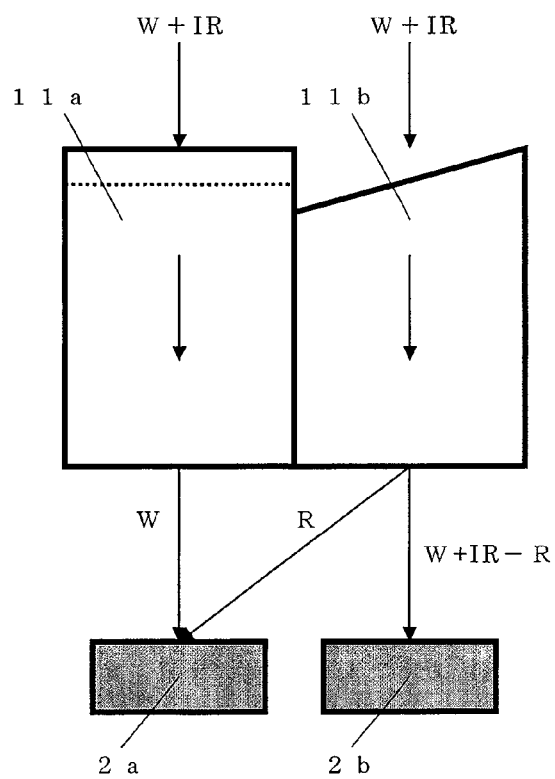
FIG. 11C is a cross-sectional view as viewed on the plane B-B' shown in FIG. 11A.
Figure 11D:
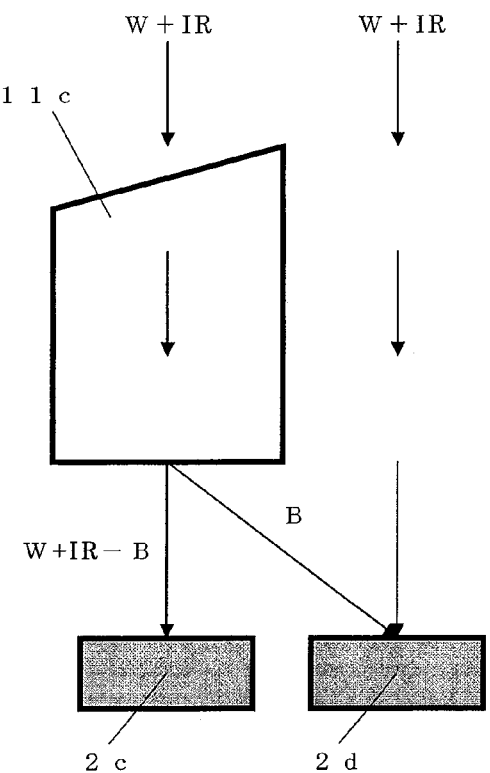
FIG. 11D is a cross-sectional view as viewed on the plane C-C' shown in FIG. 11A.

Hereinafter, a ninth specific preferred embodiment of the present invention will be described with reference to the accompanying drawings. FIG. 11A is a plan view illustrating, using a fundamental unit, how optical elements are arranged with respect to photosensitive cells in an imager as a ninth preferred embodiment of the present invention. FIGS. 11B, 11C and 11D are cross-sectional views as viewed on the respective planes A-A', B-B' and C-C' shown in FIG. 11A.

As shown in FIGS. 11A through 11D, an array of optical elements according to this preferred embodiment includes light-splitting elements 11a, 11b and 11c, which are arranged to face the photosensitive cells 2a, 2b, 2c and 2d of the imager.

Figure 14A:
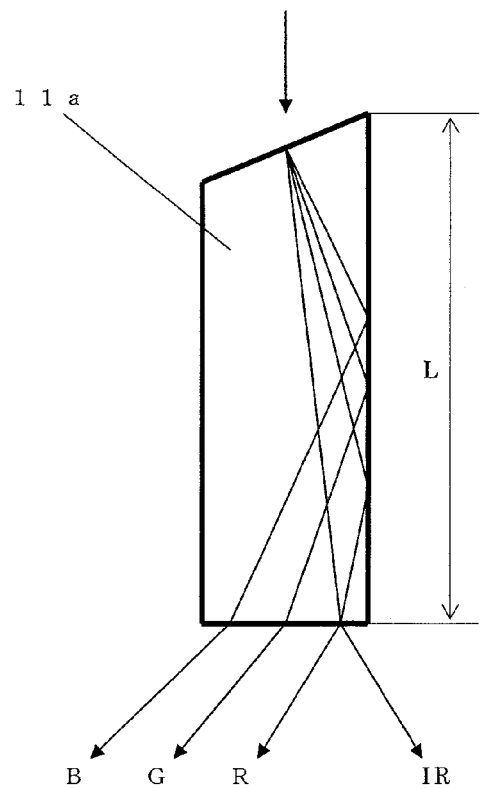
FIG. 14A is a front view illustrating a light-splitting element according to the present invention for splitting incident light into an IR ray and other rays.
Figure 14B:
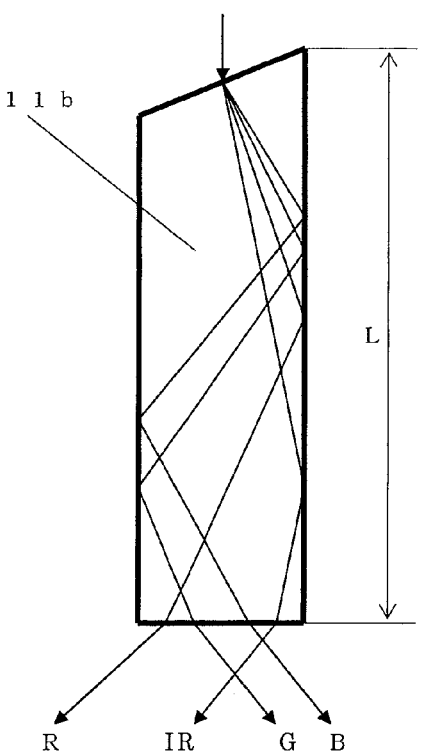
FIG. 14B is a front view illustrating a light-splitting element according to the present invention for splitting incident light into an R ray and other rays.
Figure 14C:
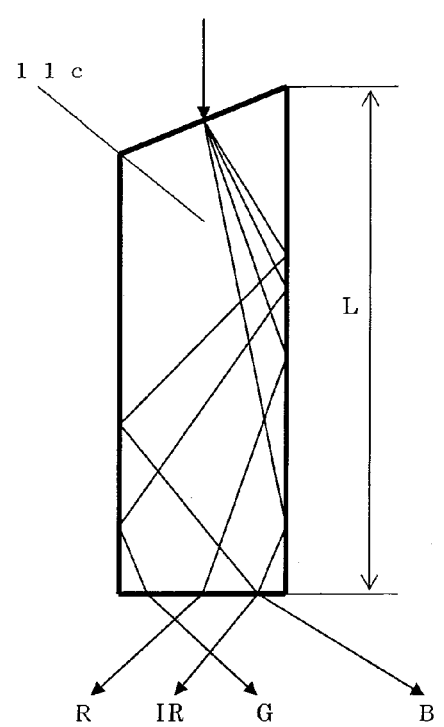
FIG. 14C is a front view illustrating a light-splitting element according to the present invention for splitting incident light into a B ray and other rays.

The light-splitting elements 11a, 11b and 11c in the array of optical elements are prism type light-splitting elements as shown in FIGS. 14A through 14C. Specifically, the light-splitting element 11a directs an infrared ray (IR) to one side and also directs R, G and B rays to the other side from right under itself. On the other hand, the light-splitting element 11b directs only R to one side and also directs the other color rays to right under itself. Furthermore, the light-splitting element 11c directs only B to one side and also directs the other color rays to right under itself. However, the incident light does not always have to be split in this manner but in any other pattern according to the refractive indices of the respective light-splitting elements or their lengths (L) and other shape parameters.

According to this preferred embodiment, the light-splitting element 11a is designed and arranged so that IR that has been incident on the light-splitting element 11a will enter an adjacent photosensitive cell 2c and that the other rays will enter the photosensitive cell 2a right under itself. The light-splitting element 11b is designed and arranged so that R that has been incident on the light-splitting element 11b will enter an adjacent photosensitive cell 2a and that the other rays will enter the photosensitive cell 2b right under itself. And the light-splitting element 11c is designed and arranged so that B that has been incident on the light-splitting element 11c will enter an adjacent photosensitive cell 2d and that the other rays will enter the photosensitive cell 2c right under itself. When viewed perpendicularly to the imaging plane, the light-splitting element 11a splits the incident light vertically on the paper of FIG. 11A, but the light-splitting elements 11b and 11c split the incident light horizontally on the paper of FIG. 11A. That is to say, the light-splitting directions of these multiple light-splitting elements 11a through 11c intersect with each other at right angles, which is one of the features of this preferred embodiment.

When such a structure and scheme are adopted, the intensities of light rays received by the respective photosensitive cells are represented by the following Equations (31) through (34):

$$S2a = W + R \quad (31)$$

$$S2b = IR - W - R \quad (32)$$

$$S2c = 2IR + W - B \quad (33)$$

$$S2d = IR + W + B \quad (34)$$

where S2a, S2b, S2c and S2d represent the intensities of the light rays received by the photosensitive cells 2a, 2b, 2c and 2d, respectively, and W=R+G+B.

In this case, the following Equation (35) is obtained by adding Equations (31) and (32) together, and the following Equation (36) is obtained by adding Equations (33) and (34) together. Equations (35) and (36) represent what if IR has entered an adjacent photosensitive cell. Furthermore, by subtracting Equation (35) from Equation (36), the IR component is represented by the following Equation (37):

$$S2a + S2b = IR + 2W \quad (35)$$

$$S2c + S2d = 3IR + 2W \quad (36)$$

$$IR = ((S2c + S2d) - (S2a + S2b))/2 \quad (37)$$

Thus, the intensities $S2b^\sim$, $S2c^\sim$ and $S2d^\sim$ of the light obtained by removing the IR components from S2b, S2c and S2d are given by the following Equations (38) to (40):

$$S2b^\sim = W - R \quad (38)$$

$$S2c^\sim = W - B \quad (39)$$

$$S2d^\sim = W + B \quad (40)$$

Consequently, using Equations (31) and (38) to (40), 2R, 2B and 2W are obtained by the following Equations (41) to (44) and 2G is obtained by subtracting 2R+2B from 2W:

$$2R = S2a - S2b^\sim \quad (41)$$

$$2W = S2a + S2b^\sim \quad (42)$$

$$2B = S2d^\sim - S2c^\sim \quad (43)$$

$$2W = S2d^\sim + S2c^\sim \quad (44)$$

It can be seen that if a split light ray representing a color signal C is made to fall on a photosensitive cell, which is adjacent to a given photosensitive cell, using a light-splitting element, the intensity (2C) of the resultant signal can be twice as high as that of that color signal due to a difference in pixel signal level between the given and adjacent photosensitive cells as a result of the processing described above. In addition, in a situation where multiple light-splitting elements are used, if the light-splitting direction of one light-splitting element intersects with that of another light-splitting element at right angles, the respective split component can be obtained, even though addition needs to be done between pixels. Such an example has been described for this preferred embodiment. Thus, it can be seen that by performing addition processing between adjacent pixels by Equations (35) and (36) and then the subtraction represented by Equation (37), the IR component can be obtained.

As described above, if the light-splitting direction of the element 11a that splits the incident light into IR and other color rays is made to intersect at right angles with that of the element 11b that splits the incident light into R and other color rays and the element 11c that splits the incident light into B and other color rays, IR and RGB color signals can be obtained without causing any optical loss.

Thus, according to the ninth preferred embodiment described above, if a split light ray to be obtained is made to enter an adjacent pixel by using a number of light-splitting elements, then a photoelectrically converted signal can be generated with no loss based on that split light ray by performing arithmetic operations between pixels after that. In addition, if the light-splitting directions of the light-splitting elements are made to intersect with each other at right angles, signals representing respective light rays can be extracted efficiently. As a result, a color imager that achieves high optical efficiency and that can also cope with IR light is realized.

Embodiment 10

Figure 12A:
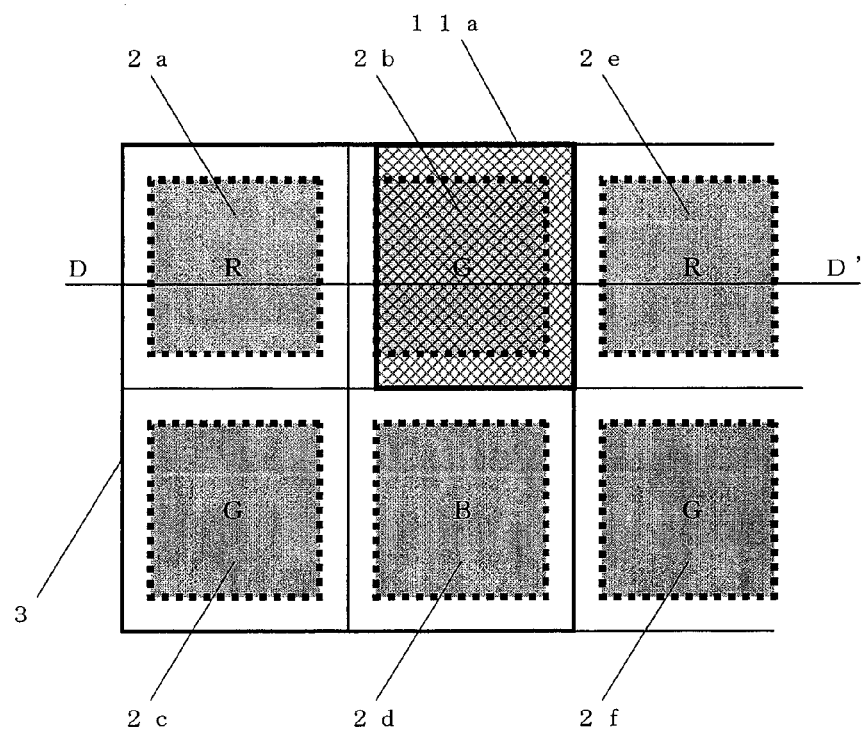
FIG. 12A is a plan view illustrating the arrangement of light-splitting elements with respect to photosensitive cells in an imager according to a tenth preferred embodiment of the present invention.
Figure 12B:
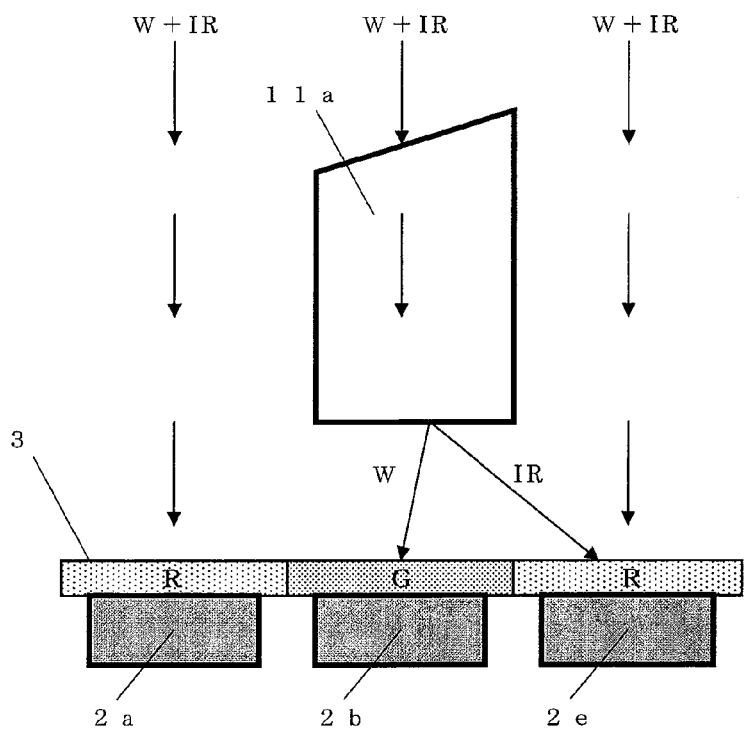
FIG. 12B is a cross-sectional view as viewed on the plane D-D' shown in FIG. 12A.

Hereinafter, a tenth specific preferred embodiment of the present invention will be described with reference to the accompanying drawings. FIG. 12A is a plan view illustrating, using a fundamental unit, how photosensitive cells with color filters and light-splitting elements are arranged in an imager as a tenth preferred embodiment of the present invention. On the other hand, FIG. 12B is a cross-sectional view as viewed on the plane D-D' shown in FIG. 12A.

As shown in these drawings, the imager of this preferred embodiment includes Bayer type color filters 3. Specifically, six photosensitive cells 2a through 2f are illustrated in FIGS. 12A and 12B. However, the other reference numerals denote the same components as their counterparts of the ninth preferred embodiment.

According to this tenth preferred embodiment, a single light-splitting element 11a according to the present invention is provided for every eight pixels of a conventional Bayer type color imager. Just like the light-splitting element 11a of the ninth preferred embodiment described above, the light-splitting element 11a also makes IR fall on an adjacent photosensitive cell.

In this arrangement, a Bayer type fundamental unit consisting of four pixels is used as a single unit, and a light-splitting element is provided for every two units. That is to say, FIG. 12A illustrates four cells that are included in one unit, for which the light-splitting element 11a is provided, and two more cells belonging to another unit. The light-splitting element 11a is arranged over the G element and makes an IR component fall on an R element that is located on the right-hand side of the G pixel in FIG. 12A.

The differences between the imager of this preferred embodiment and a conventional Bayer type color imager are just that the imager of this preferred embodiment has no infrared cut filter for cutting off an incoming infrared ray and that the light-splitting element is provided for every eight pixels (i.e., the ratio of the number of pixels to that of a light-splitting element provided for them is eight to one). Generally speaking, almost every color filter contains pigment as a dye. And each dye transmits not only R, G and B rays but also an IR ray as well. That is why the conventional Bayer type color imager usually has an infrared cut filter in addition to color filters.

Hereinafter, it will be described how processing is done according to this preferred embodiment.

Since no infrared cut filter is attached according to this preferred embodiment, the entire photosensitive plane receives an IR component. The light-splitting element 11a arranged over the G element makes the IR component fall on an R element. That is why the photosensitive cell 2b right under the light-splitting element 11a does not receive the IR component but instead the IR component enters the adjacent photosensitive cell 2e on the right-hand side. As a result, the sum of the intensities of the light rays received by the four photosensitive cells 2a through 2d belonging to the unit including the light-splitting element 11a is R+2G+B+3IR. On the other hand, the sum of the intensities of the light rays received by the four photosensitive cells belonging to the unit including the light-splitting element 11a is R+2G+B+5IR. By subtracting these sums of the intensities of the two units from each other, an infrared component 2IR can be obtained. That is why if IR is subtracted from each pixel signal supplied from a photosensitive cell on which the IR has been incident, RGB color signals can be obtained. Optionally, if only the IR component is used, an infrared ray image can be obtained as well.

As described above, by making a split light ray enter an adjacent unit, a photoelectrically converted signal representing that split light ray can be obtained by performing calculations between the units. In the tenth preferred embodiment described above, a single light-splitting element is supposed to be provided for every eight pixels. However, this is just an example. Alternatively, a single light-splitting element may also be provided for every unit consisting of four pixels of RGGB so that the light-splitting element is located over one of the two G elements. Even so, by performing subtraction between a signal supplied from the G pixel, on which the light-splitting element is arranged, and a signal supplied from an adjacent G pixel, on which no light-splitting element is arranged, an IR component can also be obtained. If IR is subtracted from each pixel signal supplied from a photosensitive cell on which the IR has been incident, RGB color signals can be obtained. Optionally, if only the IR component is used, an infrared ray image can be obtained as well. The imager of this preferred embodiment includes a photosensitive cell with a color filter. However, even if each color filter were arranged over one of the light-splitting element shown in FIG. 12B separately from the photosensitive cell, the same effect can also be achieved.

As described above, according to this tenth preferred embodiment, an element that splits an IR component is applied to a conventional color imager, and therefore, the IR component can be introduced without loss. In other words, the IR ray can be used more efficiently. On top of that, not just a color image but also an IR image can be obtained without using an infrared cut filter.

Embodiment 11

Figure 13A:
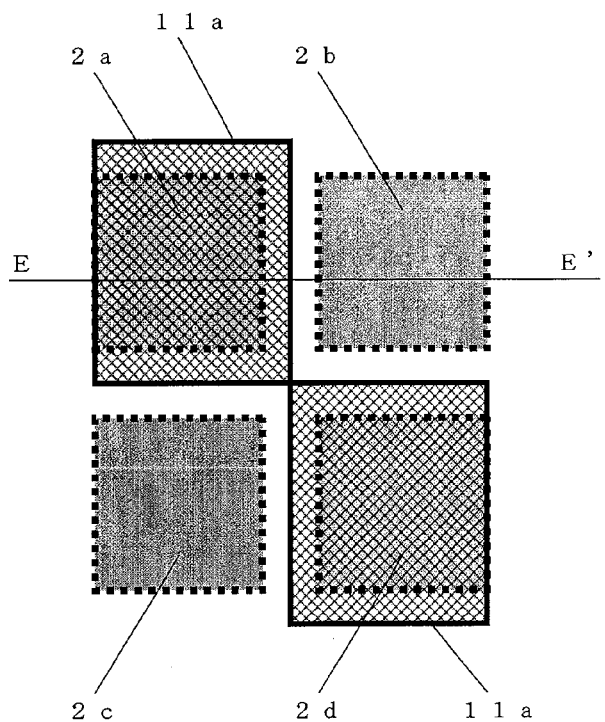
FIG. 13A is a plan view illustrating the arrangement of light-splitting elements with respect to photosensitive cells in an imager according to an eleventh preferred embodiment of the present invention.
Figure 13B:
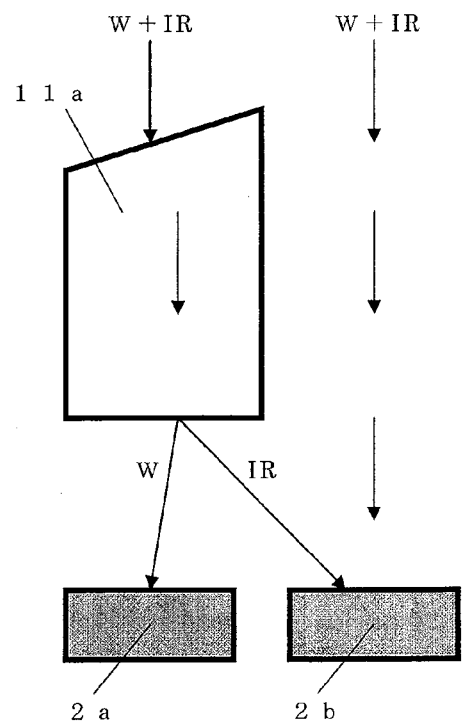
FIG. 13B is a cross-sectional view as viewed on the plane E-E' shown in FIG. 13A.

Hereinafter, an eleventh specific preferred embodiment of the present invention will be described with reference to the accompanying drawings. FIG. 13A is a plan view illustrating, using a fundamental unit, how light-splitting element are arranged with respect to photosensitive cells in an imager as an eleventh preferred embodiment of the present invention. On the other hand, FIG. 13B is a cross-sectional view as viewed on the plane E-E' shown in FIG. 13A.

According to this preferred embodiment, a light-splitting element is provided for every two photosensitive cells of the imager. The light-splitting element arranged is a light-splitting element 11a that makes an IR component fall on an adjacent pixel.

In this preferred embodiment, the light-splitting elements 11a are attached to a monochrome imager. By performing subtraction between a signal supplied from a pixel that IR is prevented from entering by the light-splitting element 11a and a signal supplied from an adjacent pixel on which the IR is incident, 2IR can be obtained. As a result, a visible radiation image and an infrared ray image of a monochrome image can be obtained at the same time. According to this preferred embodiment, the IR ray can be used highly efficiently when an infrared ray image needs to be obtained and a visible radiation image can be obtained without using an infrared cut filter.

Embodiment 12

Figure 15A:
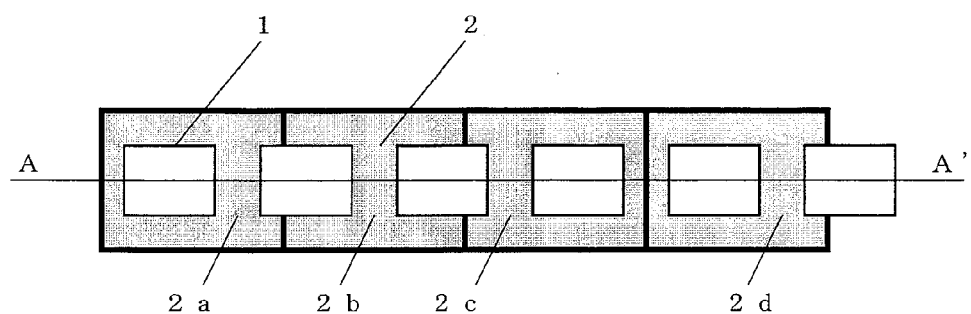
FIG. 15A is a plan view illustrating the arrangement of optical elements with respect to photosensitive cells in an imager according to a twelfth preferred embodiment of the present invention.

Hereinafter, a twelfth specific preferred embodiment of the present invention will be described with reference to the accompanying drawings. FIG. 15A is a plan view illustrating how optical elements are arranged with respect to photosensitive cells in an imager as a twelfth preferred embodiment of the present invention and showing only a portion of one row thereof. On the other hand, FIG. 15B is a cross-sectional view as viewed on the plane A-A' shown in FIG. 15A.

Figure 15B:
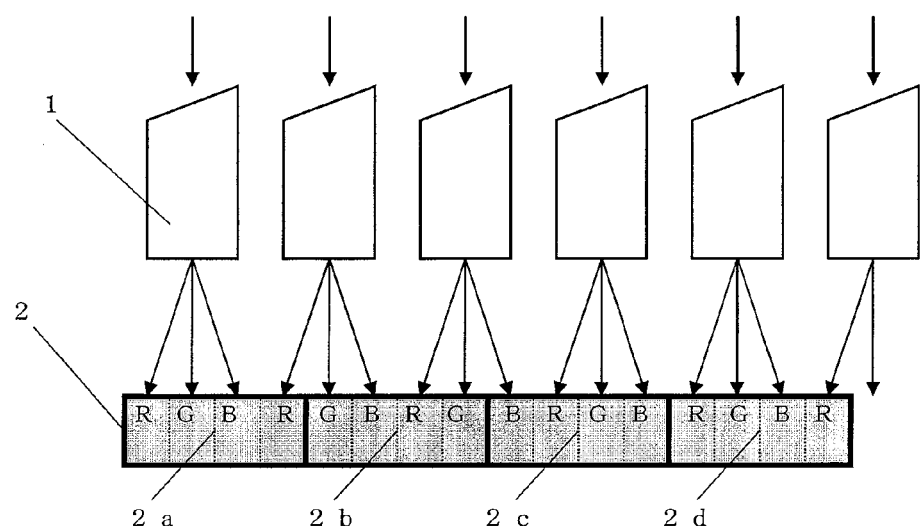
FIG. 15B is a cross-sectional view as viewed on the plane A-A' shown in FIG. 15A.

As shown in FIGS. 15A and 15B, the array of optical elements consists of light-splitting elements 1 and the photosensitive cells 2 of the imager include photosensitive cells 2a, 2b, 2c and 2d.

Each of the light-splitting elements 1 in the array of optical elements is a quadrangular prism light-splitting element as shown in FIG. 9. Unlike a color filter, such a light-splitting element 1 does not absorb light and refracts the incident light at an angle that varies according to its wavelength and also changes its paths. That is why by adjusting the length L of such a light-splitting element, the distribution of the respective split color rays can be changed. According to this preferred embodiment, the length L of the light-splitting elements is adjusted so that RGB light rays are sequentially output from the left to the right in FIG. 15 as a result of splitting of the incident light. According to this preferred embodiment, only one type of light-splitting elements is used.

This twelfth preferred embodiment is characterized in that the arrangement pitch of light-splitting elements in the array of optical elements is different from that of photosensitive cells in the array of photosensitive cells. Specifically, the light-splitting elements and the photosensitive cells are arranged so that the ratio of the arrangement pitch of light-splitting elements to that of photosensitive cells becomes three to four.

If such a structure is adopted, each photosensitive cell will receive light rays from multiple light-splitting elements. And as there is a difference in arrangement pitch between the light-splitting elements and the photosensitive cells, the light rays are received differently from one cell to another.

Supposing W=R+G+B, the intensities of the light received by the photosensitive cells 2a, 2b and 2c are W+R, W+G and W+B, respectively, of which the photoelectrically converted signals can be extracted from the respective photosensitive cells. Those extracted signals will be subjected to signal processing after that to be RGB color signals, except for the W component superposed on the output signals of the photosensitive cells.

As described above, according to this twelfth preferred embodiment of the present invention, the arrangement pitch of light-splitting elements in the array of optical elements is defined to be different from that of photosensitive cells, thereby causing color rays to be received differently by the respective photosensitive cells and obtaining RGB color signals. That is to say, since light-splitting elements are used, a high degree of optical efficiency can be achieved. In addition, since R, G and B rays are directly received by the respective photosensitive cells so that those rays are superposed one upon the other, there is no need to provide pixels for RGB rays. As a result, a color image capture device that can get color separation done with high sensitivity is realized even without increasing the number of pixels.

In the preferred embodiment described above, the ratio of the arrangement pitch of the light-splitting elements to that of the photosensitive cells is supposed to be three to four. However, the ratio does not have to be three to four as long as the quotient obtained by dividing the pitch of photosensitive cells by that of light-splitting elements is a non-integer. On top of that, the arrangement pitch of light-splitting elements does not always have to be smaller than that of photosensitive cells, either. Nevertheless, if the arrangement pitch of light-splitting elements were defined to be greater than that of photosensitive cells, then a light ray that has come from a single light-splitting element would be received by multiple photosensitive cells. Accordingly, the number of photosensitive cells provided should be greater than that of light-splitting elements in that case.

Embodiment 13

Figure 16A:
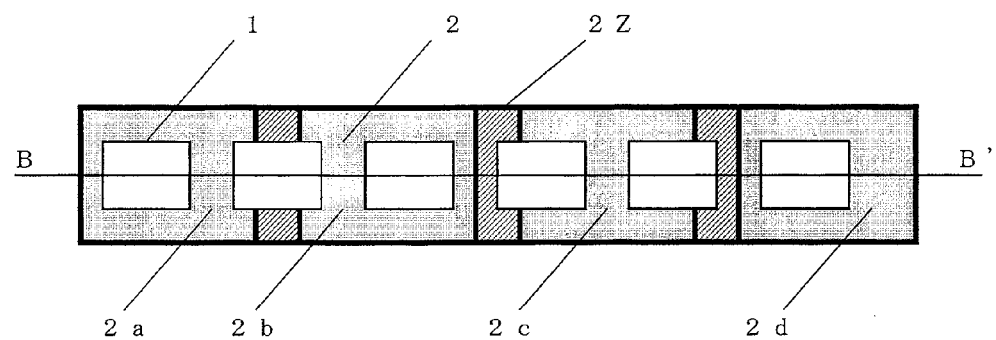
FIG. 16A is a plan view illustrating the arrangement of optical elements with respect to photosensitive cells in an imager according to a thirteenth preferred embodiment of the present invention.
Figure 16B:
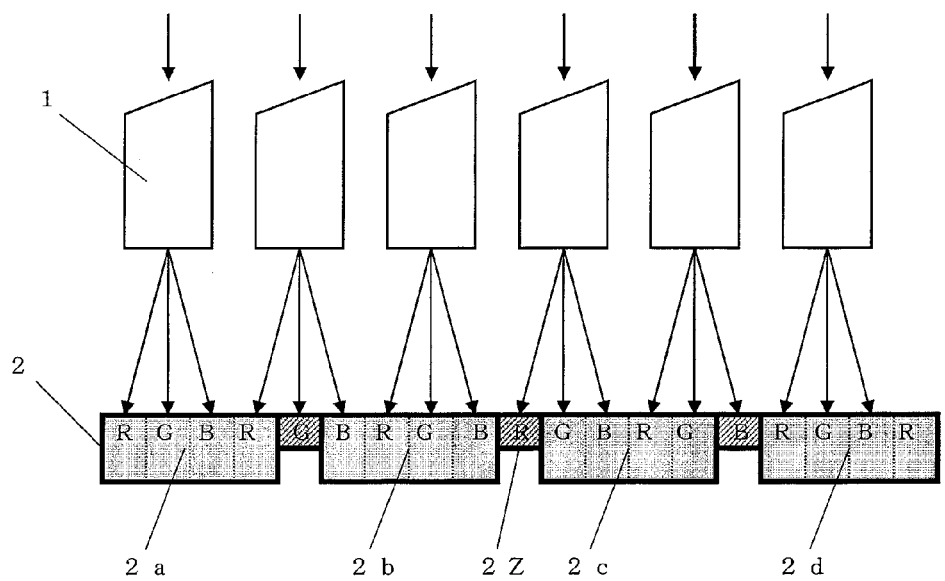
FIG. 16B is a cross-sectional view as viewed on the plane B-B' shown in FIG. 16A.

Hereinafter, a thirteenth specific preferred embodiment of the present invention will be described with reference to the accompanying drawings. FIG. 16A is a plan view illustrating the arrangement of optical elements (in a portion of one row thereof) with respect to photosensitive cells in an imager as a thirteenth preferred embodiment of the present invention. On the other hand, FIG. 16B is a cross-sectional view as viewed on the plane B-B' shown in FIG. 16A.

This thirteenth preferred embodiment of the present invention is similar to the twelfth preferred embodiment described above. According to this preferred embodiment, however, an opaque portion 2Z is provided between respective photosensitive cells as shown in FIGS. 16A and 16B. In addition, the number of light-splitting elements in the array of optical elements is different from that of the twelfth preferred embodiment.

According to the thirteenth preferred embodiment, light-splitting elements are arranged in the array of optical elements on the supposition that the size of each opaque portion is an integral number of times smaller than that of its associated photosensitive cells. Specifically, in this preferred embodiment, the ratio of the size of each opaque portion to that of its associated photosensitive cells is defined to be one to four, while the ratio of the arrangement pitch of light-splitting elements to that of photosensitive cells is defined to be three to five. By adopting such ratios, the intensities of the light received by the photosensitive cells 2a, 2b and 2c become W+R, W+G and W+B as in the twelfth preferred embodiment described above. That is why according to this preferred embodiment, the signals are also processed in the same way as in the twelfth preferred embodiment, and the same effects are achieved except for some optical loss caused by the opaque portions.

In this preferred embodiment, the ratio of the arrangement pitch of light-splitting elements to that of photosensitive cells is defined to be three to five. However, as long as the ratio of the size of each photosensitive cell to that of its associated opaque portion is an integer (=n−1) and as long as the ratio of the arrangement pitch of light-splitting elements to that of photosensitive cells is an integral ratio of m to n, two or more types of color signals can be obtained at any ratio, except a situation where n/m or (n−1)/m is an integer.

Embodiment 14

Figure 17A:
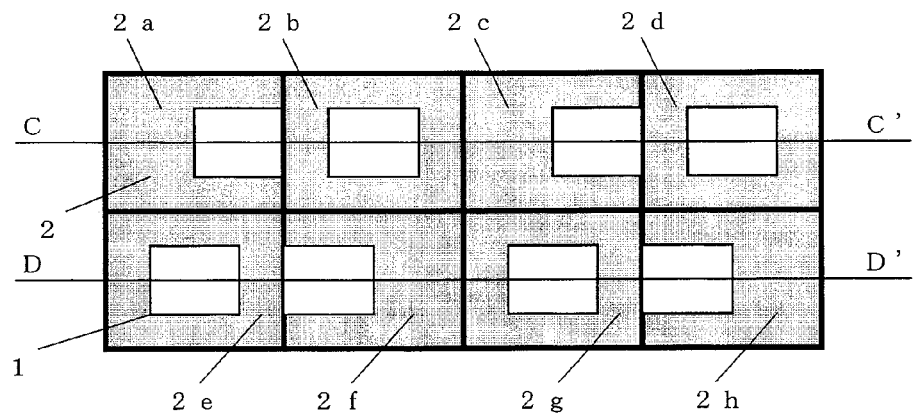
FIG. 17A is a plan view illustrating the arrangement of optical elements with respect to photosensitive cells in an imager according to a fourteenth preferred embodiment of the present invention.
Figure 17B:
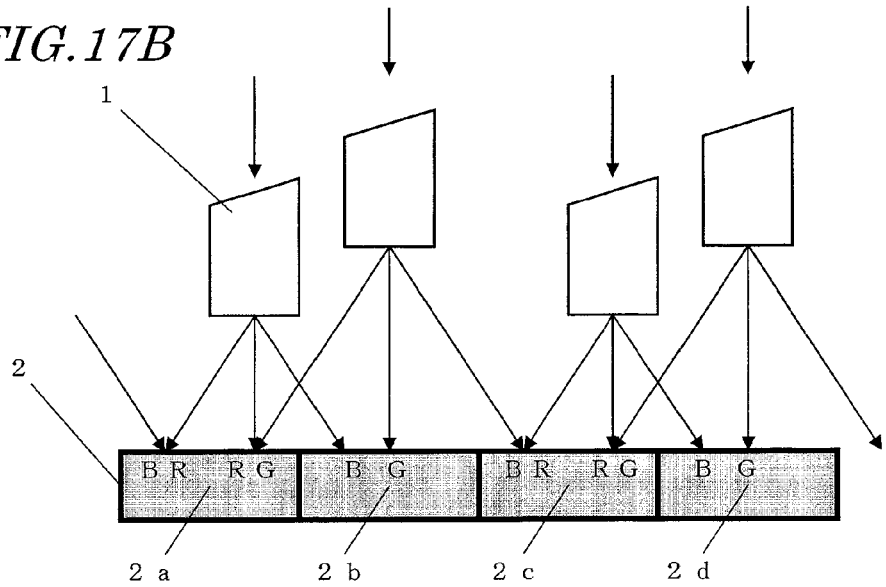
FIG. 17B is a cross-sectional view as viewed on the plane C-C' shown in FIG. 17A.
Figure 17C:
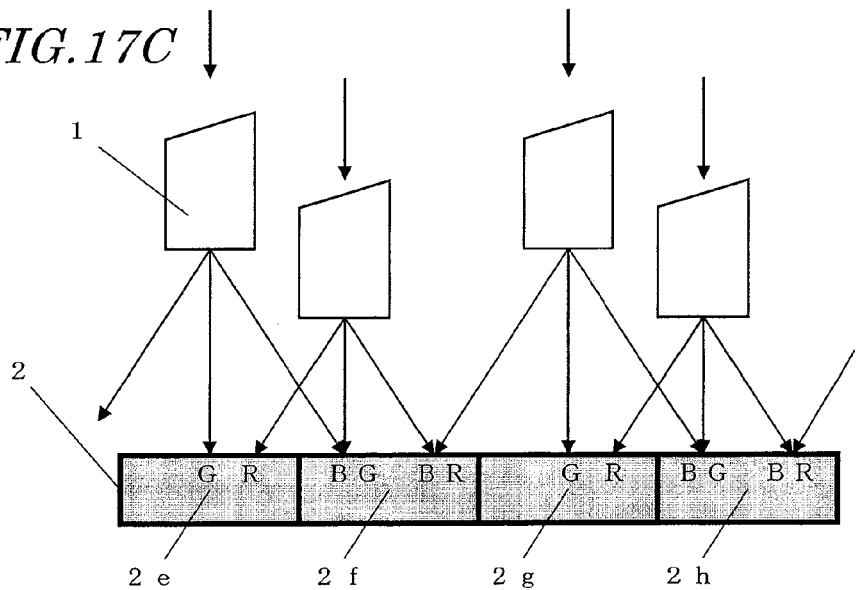
FIG. 17C is a cross-sectional view as viewed on the plane D-D' shown in FIG. 17A.

Hereinafter, a fourteenth specific preferred embodiment of the present invention will be described with reference to the accompanying drawings. FIG. 17A is a plan view illustrating the arrangement of optical elements (in a portion of one row thereof) with respect to photosensitive cells in an imager as a fourteenth preferred embodiment of the present invention. FIG. 17B is a cross-sectional view as viewed on the plane C-C' shown in FIG. 17A. And FIG. 17C is a cross-sectional view as viewed on the plane D-D' shown in FIG. 17A.

According to this fourteenth preferred embodiment of the present invention, the arrangement of light-splitting elements in the array of optical elements with respect to photosensitive cells changes three-dimensionally from one position to another. Specifically, each of the light-splitting elements associated with photosensitive cells 2b, 2d, 2e and 2g has the center of its optical axis aligned with that of its associated photosensitive cell so that a G ray enters the photosensitive cell right under itself and is spaced apart from its associated photosensitive cell so that R and B rays enter two adjacent photosensitive cells on the right- and left-hand sides thereof. On the other hand, each of the light-splitting elements associated with the photosensitive cells 2a and 2c is located closer to the photosensitive cells than the four light-splitting elements are, but has the center of its optical axis shifted so that only a B ray enters an adjacent photosensitive cell. Furthermore, the light-splitting elements associated with the photosensitive cells 2f and 2h also have a similar structure but have the center of their optical axis shifted so that only an R ray enters an adjacent photosensitive cell.

According to such an arrangement, each of the photosensitive cells 2a and 2c receives R+G rays from its associated light-splitting element and also receives R+B rays from adjacent light-splitting elements. Each of the photosensitive cells 2b and 2d receives a G ray from its associated light-splitting element and also receives a B ray from an adjacent light-splitting element. Each of the photosensitive cells 2e and 2g receives a G ray from its associated light-splitting element and also receives an R ray from an adjacent light-splitting element. And each of the photosensitive cells 2f and 2h receives G+B rays from its associated light-splitting element and also receives R+B rays from adjacent light-splitting elements. Supposing the intensities of the light received by the photosensitive cells 2a, 2b, 2e and 2f are identified by S2a, S2b, S2e and S2f, respectively, the intensities of the light received by those photosensitive cells are given by the following Equations (51) to (54), which are expressed in a form including W based on the relation W=R+G+B:

$$S2a = W+R \quad (51)$$

$$S2b = W-R \quad (52)$$

$$S2e = W-B \quad (53)$$

$$S2f = W+B \quad (54)$$

Furthermore, by adding Equations (51) and (52) together, subtracting Equation (52) from Equation (51), adding Equations (53) and (54) together, and subtracting Equation (53) from Equation (54), respectively, the following Equations (55) through (58) can be derived:

$$S2a+S2b = 2W \quad (55)$$

$$S2a-S2b = 2R \quad (56)$$

$$S2f+S2e = 2W \quad (57)$$

$$S2f-S2e = 2B \quad (58)$$

As a result, by performing simple arithmetic operations between the horizontal photosensitive cells, two pieces of color information and two pieces of luminance information can be obtained. And information about the other color G can also be obtained by calculating 2W−2R−2B. Although these calculations are carried out on the photosensitive cells 2a, 2b, 2e and 2f, the results are quite the same about the photosensitive cells 2c, 2d, 2g and 2h. In either case, color separation can be done easily and signals with high color and luminance levels can be obtained.

As can be seen, according to this fourteenth preferred embodiment, the arrangement of the light-splitting elements is changed three-dimensionally from one position to another, and a portion of split light rays is made to fall on an adjacent photosensitive cell. Thus, each photosensitive cell receives multiple superposed incident light rays. As a result, there is no need to provide pixels for RGB, and a color image capture device that can get color separation done with high sensitivity is realized even without increasing the number of pixels.

It should be noted that it is not always necessary to change the arrangement of the light-splitting elements three-dimensionally. Optionally, some of the split light rays could be made to fall on an adjacent photosensitive cell by varying the angle of each light-splitting element.

Embodiment 15

Figure 18A:
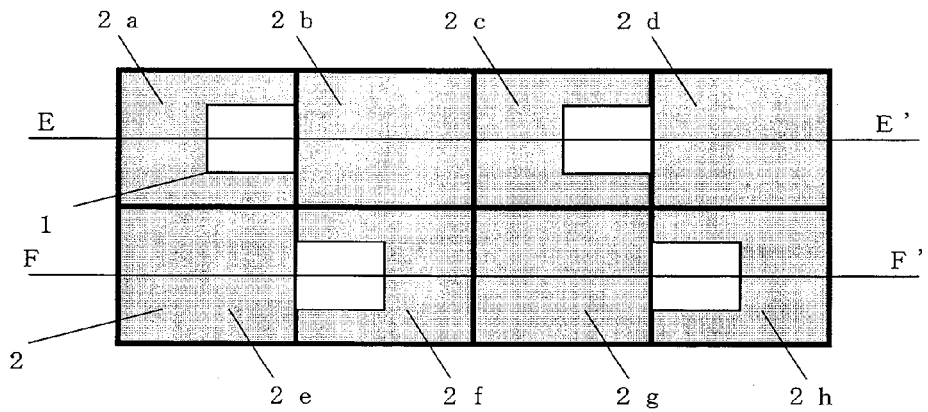
FIG. 18A is a plan view illustrating the arrangement of optical elements with respect to photosensitive cells in an imager according to a fifteenth preferred embodiment of the present invention.
Figure 18B:
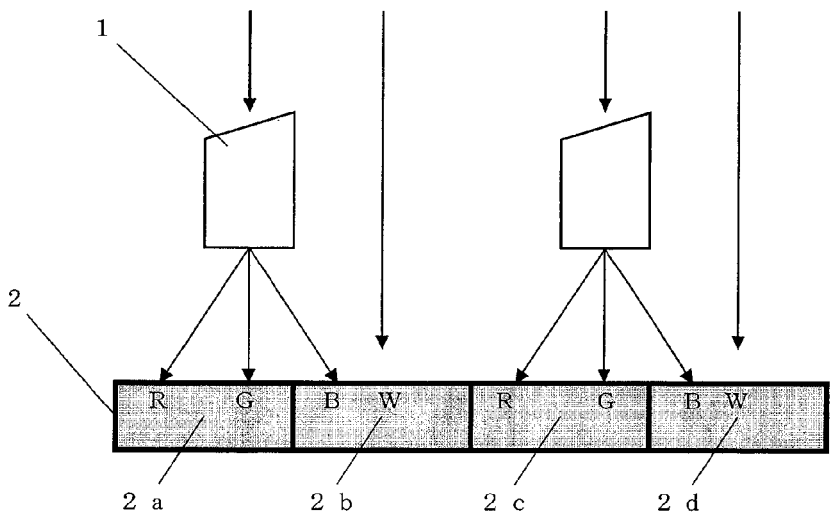
FIG. 18B is a cross-sectional view as viewed on the plane E-E' shown in FIG. 18A.
Figure 18C:
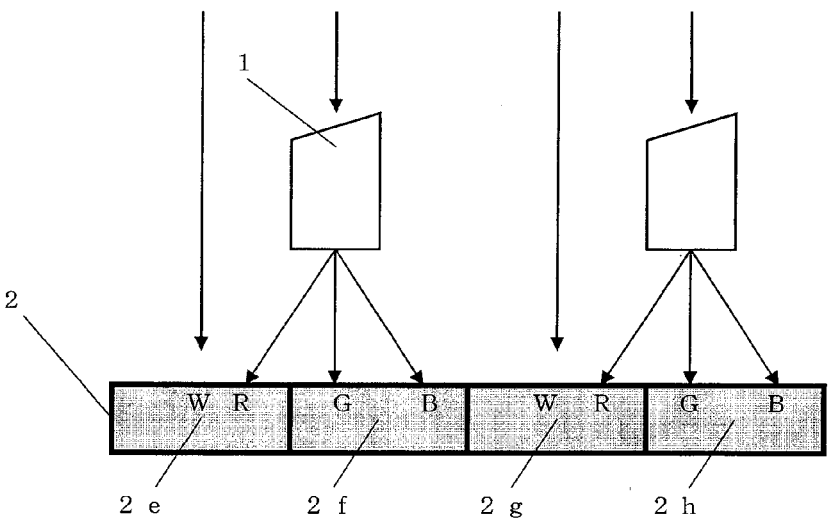
FIG. 18C is a cross-sectional view as viewed on the plane F-F' shown in FIG. 18A.

Hereinafter, a fifteenth specific preferred embodiment of the present invention will be described with reference to the accompanying drawings. FIG. 18A is a plan view illustrating the arrangement of optical elements (in a portion of one row thereof) with respect to photosensitive cells in an imager as a fifteenth preferred embodiment of the present invention. FIG. 18B is a cross-sectional view as viewed on the plane E-E' shown in FIG. 18A. And FIG. 18C is a cross-sectional view as viewed on the plane F-F' shown in FIG. 18A.

The arrangement of this preferred embodiment is obtained by removing light-splitting elements associated with the photosensitive cells 2b, 2d, 2e and 2g from the arrangement of the fourteenth preferred embodiment described above. The incident light directly falls on a photosensitive cell, of which the associated light-splitting element has been removed.

In such an arrangement, each of the photosensitive cells 2a and 2c receives R+G rays from its associated light-splitting element but receives no rays from any adjacent light-splitting element. In the same way, each of the photosensitive cells 2f and 2h receives no rays from any adjacent light-splitting element but receives only G+B rays from its associated light-splitting element. On the other hand, each of the photosensitive cells 2b and 2d receives not only incident light W but also a B ray that has come from an adjacent light-splitting element. Likewise, each of the photosensitive cells 2e and 2g receives not only the incident light W but also an R ray that has come from an adjacent light-splitting element. Consequently, the intensities of the light rays received by the photosensitive cells 2a, 2b, 2e and 2f are given by the following Equations (59) to (62):

$$S2a = W-B \quad (59)$$

$$S2b = W+B \quad (60)$$

$$S2e = W+R \quad (61)$$

$$S2f = W-R \quad (62)$$

These Equations (59) to (62) are basically the same as Equations (51) to (54) that have been described for the fourteenth preferred embodiment. As a result, similar effects to the ones achieved by the fourteenth preferred embodiment are also achieved by this preferred embodiment.

As can be seen, according to this fifteenth preferred embodiment, the arrangement of the light-splitting elements is changed three-dimensionally from one position to another, and some of those light-splitting elements are removed. Even so, some of the photosensitive cells receive multiple superposed incident light rays. As a result, there is no need to provide pixels for RGB, and a color image capture device that can get color separation done with high sensitivity is realized even without increasing the number of pixels.

Embodiment 16

Hereinafter, a sixteenth specific preferred embodiment of the present invention will be described with reference to the accompanying drawings. According to this preferred embodiment, the prism type light-splitting elements are replaced with light-splitting elements similar to what is used for the eighth preferred embodiment.

Figure 19A:
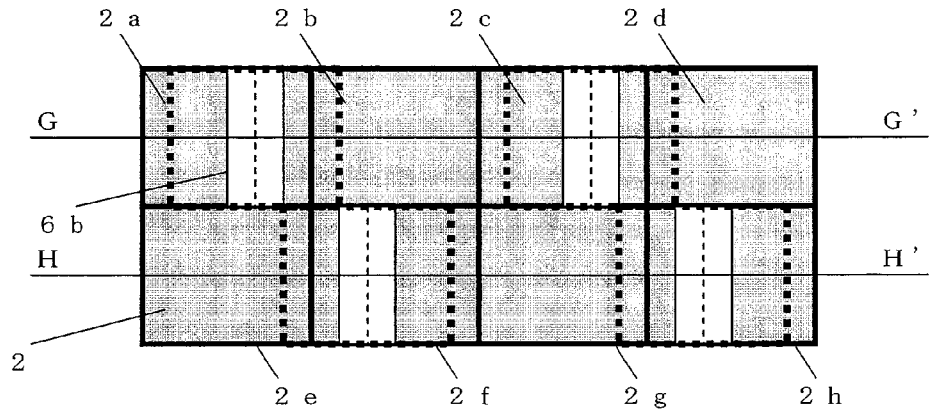
FIG. 19A is a plan view illustrating the arrangement of optical elements with respect to photosensitive cells in an imager according to a sixteenth preferred embodiment of the present invention.
Figure 19B:
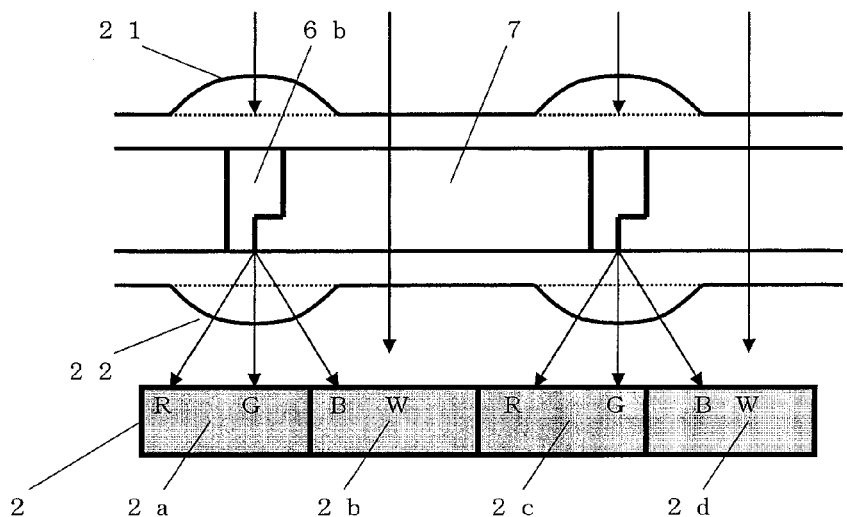
FIG. 19B is a cross-sectional view as viewed on the plane G-G' shown in FIG. 19A.
Figure 19C:
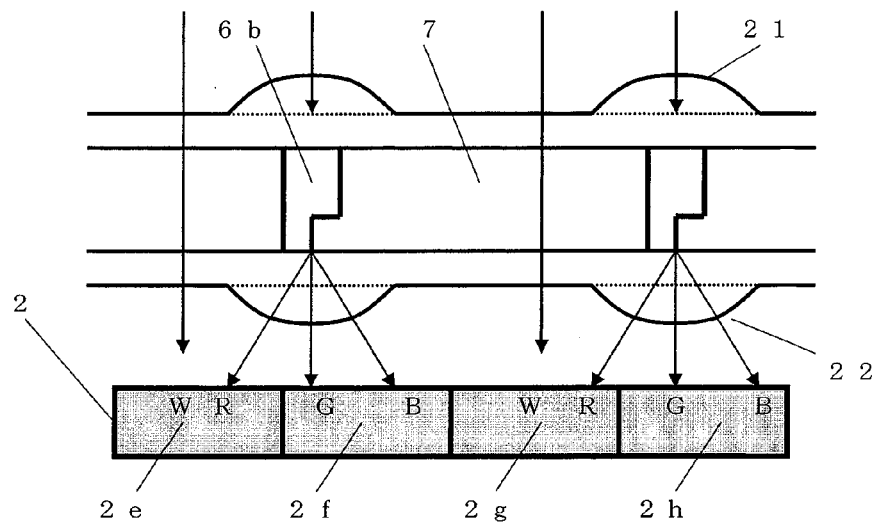
FIG. 19C is a cross-sectional view as viewed on the plane H-H' shown in FIG. 19A.

FIG. 19A is a plan view illustrating the arrangement of optical elements (in a portion of one row thereof) with respect to photosensitive cells in an imager as a sixteenth preferred embodiment of the present invention. FIG. 19B is a cross-sectional view as viewed on the plane G-G' shown in FIG. 19A. And FIG. 19C is a cross-sectional view as viewed on the plane H-H' shown in FIG. 19A.

As shown in FIG. 19, the array of optical elements of this preferred embodiment includes high-refractive-index transparent portions 6b, which are made of a material with a high refractive index, and low-refractive-index transparent portions 7, which are made of a material with a low refractive index. According to this preferred embodiment, due to the shape of the high-refractive-index transparent portions 6b and due to a difference in refractive index between the high-refractive-index transparent portions 6b and the low-refractive-index transparent portions 7, the incident light is diffracted to produce zero-, first-order and minus-first-order diffracted light rays, and is split into multiple light rays according to the difference in the angle of diffraction. That is why the high-refractive-index transparent portions 6b function as light-splitting elements.

Also, to improve the light-splitting ability of each light-splitting element 6b, a micro lens 21 and an inner lens 22 are arranged over and under the light-splitting element 6b. The two-dimensional arrangement of the light-splitting elements 6b with respect to the pixels and the distribution of the split light rays are the same as in the fifteenth preferred embodiment described above. As a result, pixel signals are also processed just as already described for the fifteenth preferred embodiment.

As can be seen, if a material with a different refractive index is used to provide the light-splitting elements, a color image capture device that can get color separation done with high sensitivity is realized as in the fifteenth preferred embodiment even without increasing the number of pixels.

Embodiment 17

Figure 20A:
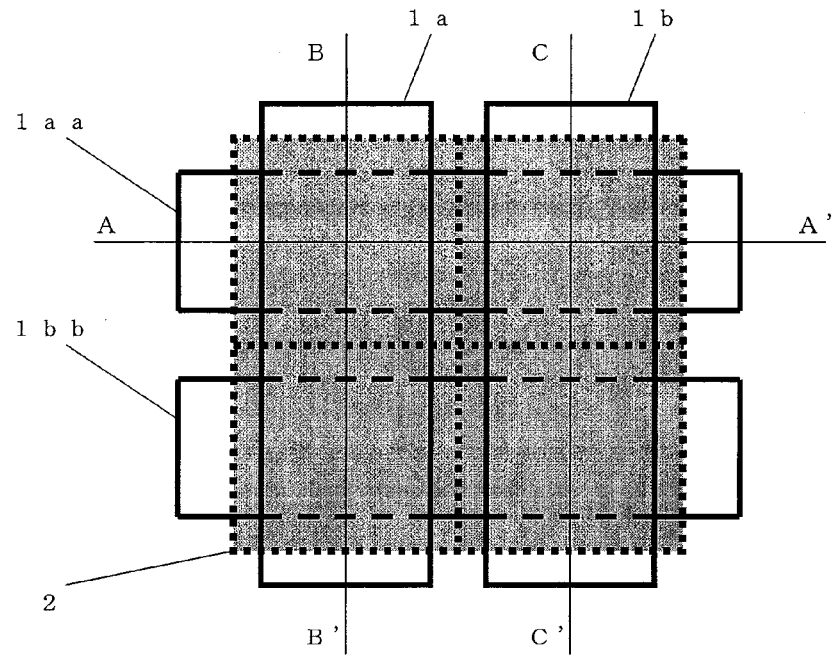
FIG. 20A is a plan view illustrating the arrangement of optical elements with respect to photosensitive cells in an imager according to a seventeenth preferred embodiment of the present invention.
Figure 20B:
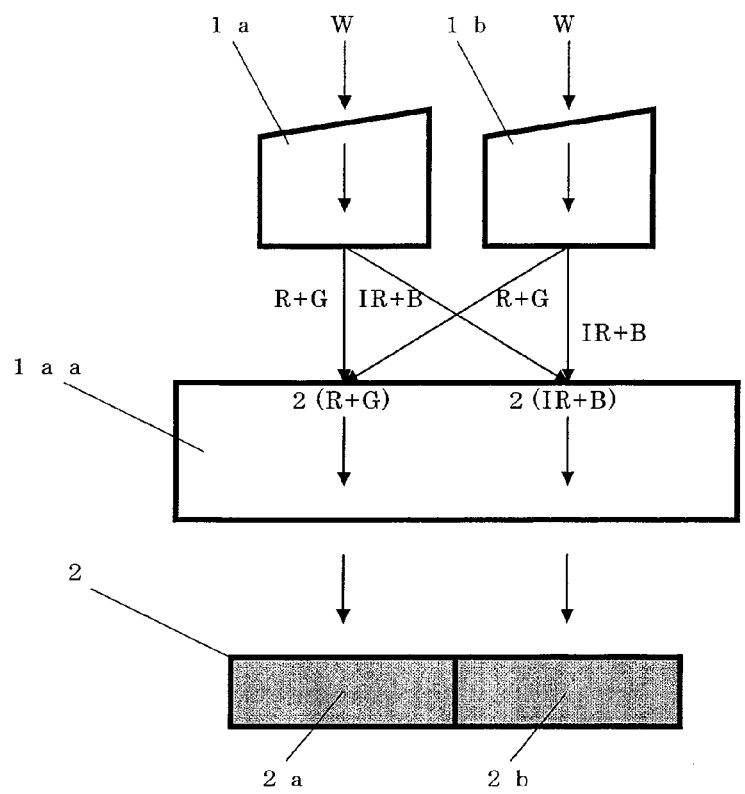
FIG. 20B is a cross-sectional view as viewed on the plane A-A' shown in FIG. 20A.
Figure 20C:
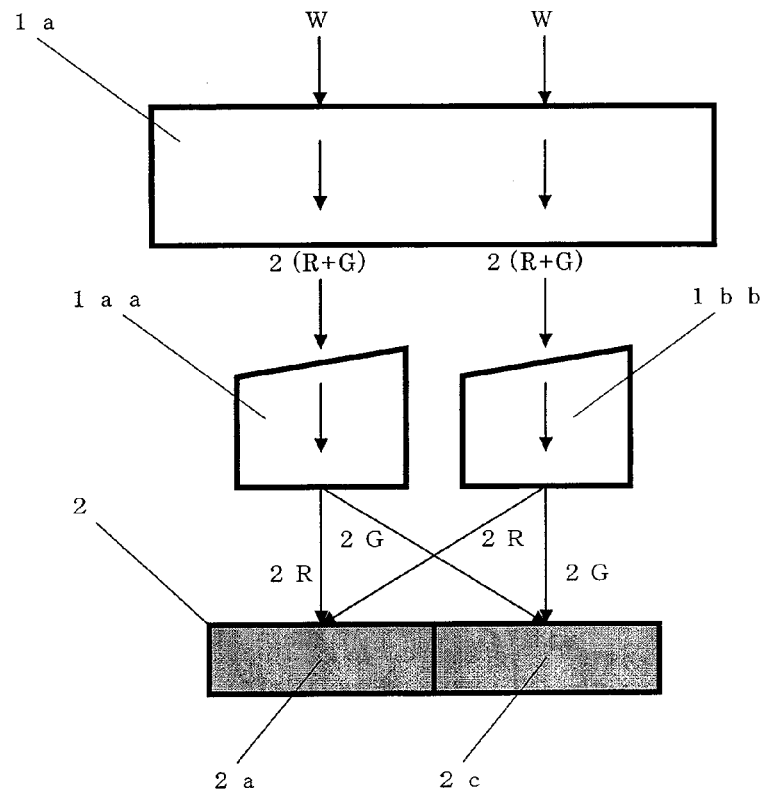
FIG. 20C is a cross-sectional view as viewed on the plane B-B' shown in FIG. 20A.
Figure 20D:
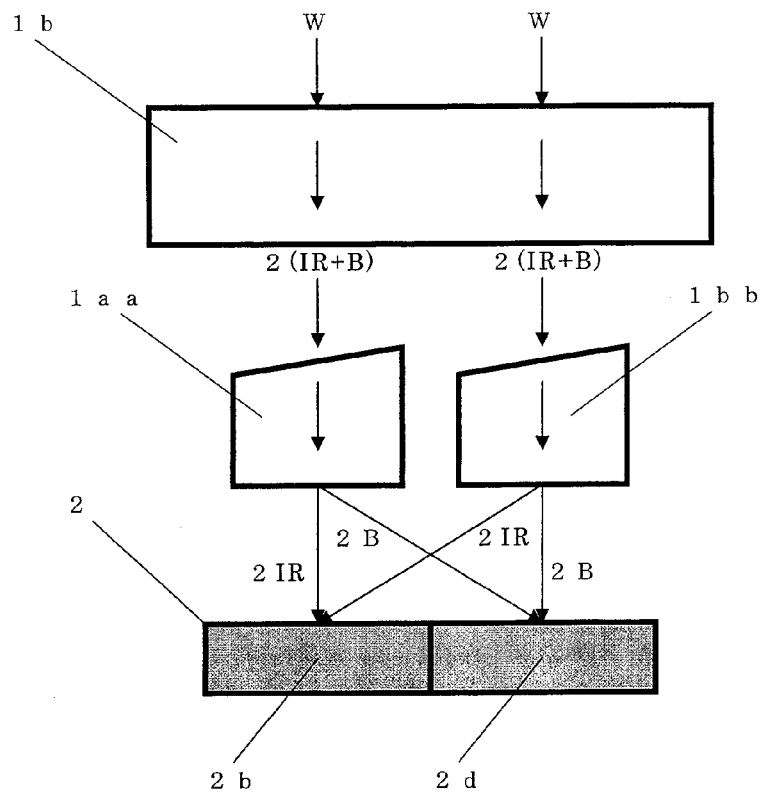
FIG. 20D is a cross-sectional view as viewed on the plane C-C' shown in FIG. 20A.

Hereinafter, a seventeenth specific preferred embodiment of the present invention will be described with reference to the accompanying drawings. FIG. 20A is a plan view illustrating, using a fundamental unit, how optical elements are arranged with respect to photosensitive cells in an imager as a seventeenth preferred embodiment of the present invention. FIG. 20B is a cross-sectional view as viewed on the plane A-A' shown in FIG. 20A. FIG. 20C is a cross-sectional view as viewed on the plane B-B' shown in FIG. 20A. And FIG. 20D is a cross-sectional view as viewed on the plane C-C' shown in FIG. 20A.

As shown in FIGS. 20A through 20D, the array of optical elements of this preferred embodiment includes light-splitting elements 1a, 1b, 1aa and 1bb. On the other hand, the array 2 of photosensitive cells of the imager includes photosensitive cells 2a, 2b, 2c and 2d.

Figure 23A:
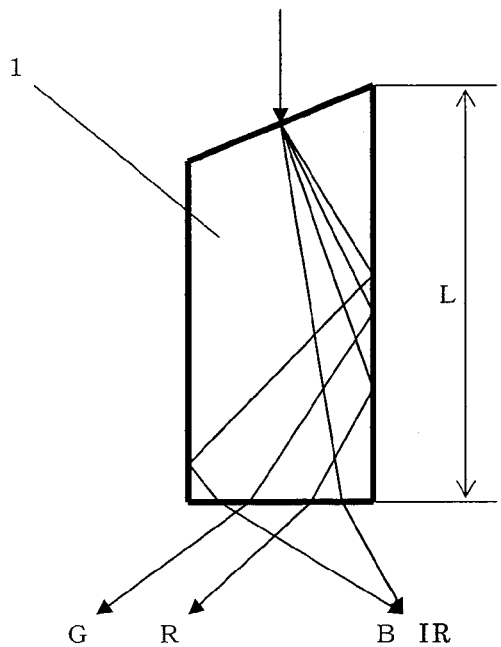
FIG. 23A is a front view of a light-splitting element according to the present invention for splitting incident light into R+G and IR+B rays.
Figure 23B:
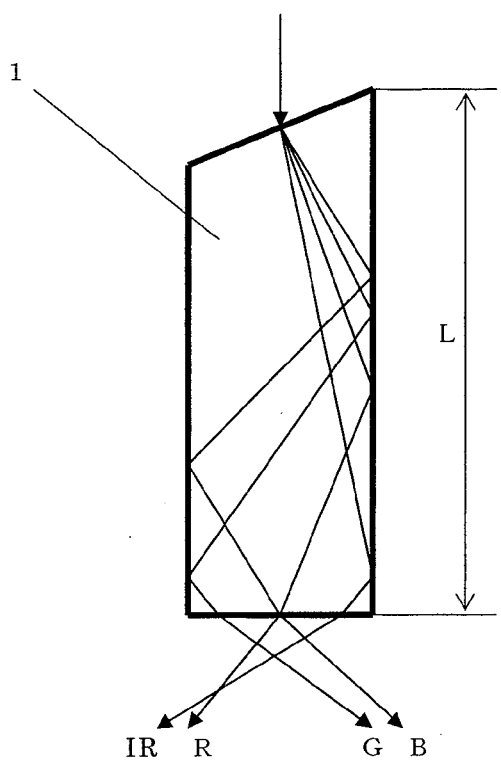
FIG. 23B is a front view of a light-splitting element according to the present invention for splitting incident light into IR+R and G+B rays.

It should be noted that the light-splitting elements 1a and 1b are of the same type as the prism type light-splitting element shown in FIG. 23A and that the light-splitting elements 1aa and 1bb are of the same type as the prism type light-splitting element shown in FIG. 23B. Each of these light-splitting elements absorbs no light, refracts an incident light ray at an angle that varies according to its wavelength, and also changes its paths. That is why by adjusting the length L of each of these light-splitting elements, the distribution of the respective split color rays can be changed.

According to this preferred embodiment of the present invention, the light-splitting element 1a is designed so as to split the incident light into R and G rays that fall straight down and IR and B rays that are directed toward an adjacent photosensitive cell. On the other hand, the light-splitting element 1b is designed so as to do the opposite to what the light-splitting element 1a does. Furthermore, the light-splitting element 1aa is designed so as to split the incident light into IR and R rays that fall straight down and G and B rays that are directed toward an adjacent photosensitive cell. On the other hand, the light-splitting element 1bb is designed so as to do the opposite to what the light-splitting element 1aa does.

In this seventeenth preferred embodiment, the split light rays that have been produced by each of the light-splitting elements 1a and 1b are made to fall on the light-splitting elements 1aa and 1bb. Likewise, each of the light-splitting elements 1aa and 1bb makes similarly split light rays enter photosensitive cells. Furthermore, the light-splitting elements 1a and 1b cross the light-splitting elements 1aa and 1bb at right angles and their wavelength ranges are different from each other.

Hereinafter, it will be described how the incident light enters the light-splitting elements 1a and 1b and then reaches the photosensitive cells on the supposition that the incident light consists of RGB light rays and an IR ray.

When light is incident on the light-splitting elements 1a and 1b, the light-splitting element 1a makes R and G rays fall straight down and also makes IR and B rays fall obliquely. On the other hand, the light-splitting element 1b does the opposite, i.e., makes IR and B rays fall straight down and also makes R and G rays fall obliquely. As a result, 2(R+G) rays are collected right under the light-splitting element 1a and 2(IR+B) rays are collected right under the light-splitting element 1b.

Next, those light rays enter the light-splitting elements 1aa and 1bb, each of which divides the incident light rays into IR and R rays and G and B rays. More specifically, the incident 2(R+G) rays are split by the light-splitting element 1aa so that 2R rays fall straight down and that 2G rays fall obliquely. On the other hand, the incident 2(R+G) rays are also split by the light-splitting element 1bb so that 2G rays fall straight down and that 2R rays fall obliquely. As a result, 4R rays will enter the photosensitive cell 2a and 4G rays will enter the photosensitive cell 2b.

On the other hand, the incident 2(IR+B) rays are split by the light-splitting element 1aa so that 2IR rays fall straight down and that 2B rays fall obliquely. On the other hand, the incident 2(IR+B) rays are also split by the light-splitting element 1bb so that 2B rays fall straight down and that 2IR rays fall obliquely. As a result, 4IR rays will enter the photosensitive cell 2b and 4B rays will enter the photosensitive cell 2d.

In this manner, the incident light reaches the photosensitive cells without causing loss and is also split into 4R, 4G, 4B and 4IR rays during the light-splitting process. Those light rays that have entered the photosensitive cells are photoelectrically converted into RGB and IR signals. As a result, an RGB color image and an infrared monochrome image can be produced without using any infrared cut filter or infrared pass filter.

As described above, according to this seventeenth preferred embodiment, two types of light-splitting elements, one type of which splits the incident light into R+G and IR+B rays and the other type of which splits the incident light into IR+R and G+B rays, are arranged so as to cross each other at right angles. And each of those light-splitting elements is designed so that some split light rays intersect with each other. As a result, the incident light can be transmitted to reach the photosensitive cells without causing loss and can be split into RGB and IR rays as well. Consequently, an image capture device that not only realizes a color image with high sensitivity but also obtains an infrared image as well and that can cope with a broad optical wavelength range, covering from visible radiation through infrared radiation, can be provided even without increasing the number of pixel of the imager.

In the preferred embodiment described above, the light-splitting elements 1a and 1b split the incident light into R+G and I+B rays, while the light-splitting elements 1aa and 1bb further split the light rays into IR+R and G+B rays. However, the incident light does not always have to be split in this manner. Even if these two types of light-splitting elements split the incident light in the opposite order, the incident light could also be split into RGB and IR rays.

Embodiment 18

Figure 21A:
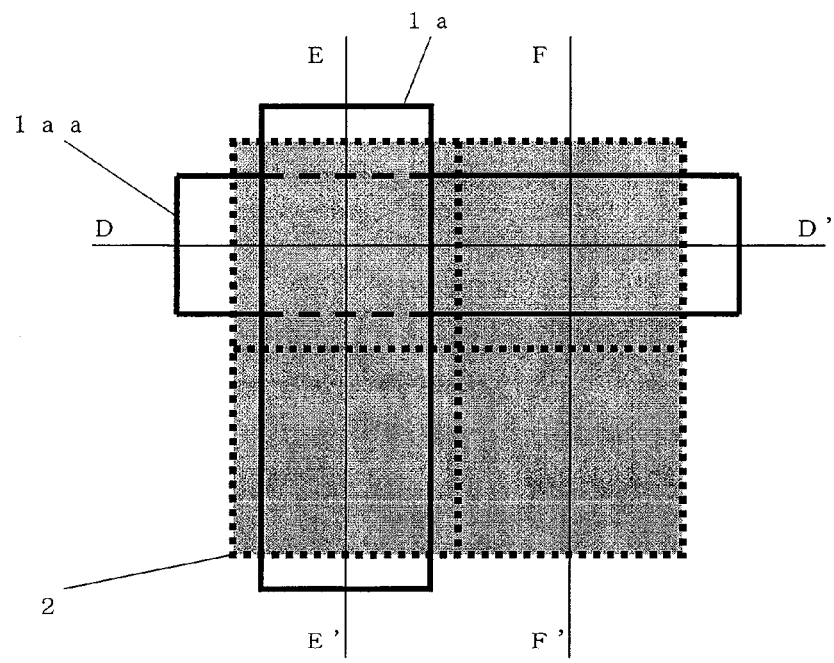
FIG. 21A is a plan view illustrating the arrangement of optical elements with respect to photosensitive cells in an imager according to an eighteenth preferred embodiment of the present invention.
Figure 21B:
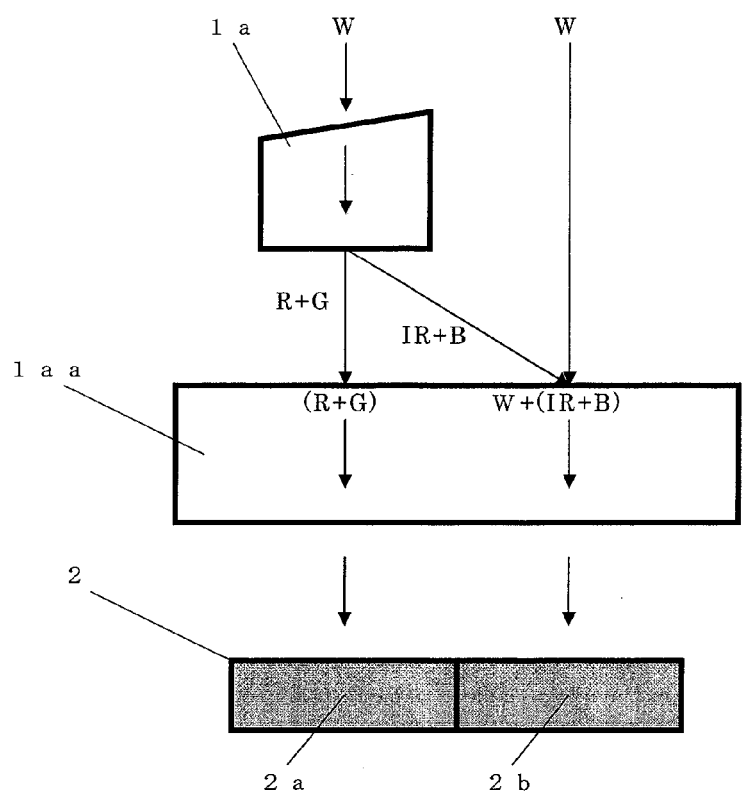
FIG. 21B is a cross-sectional view of the imager of the eighteenth preferred embodiment of the present invention as viewed on the plane D-D' shown in FIG. 21A.
Figure 21C:
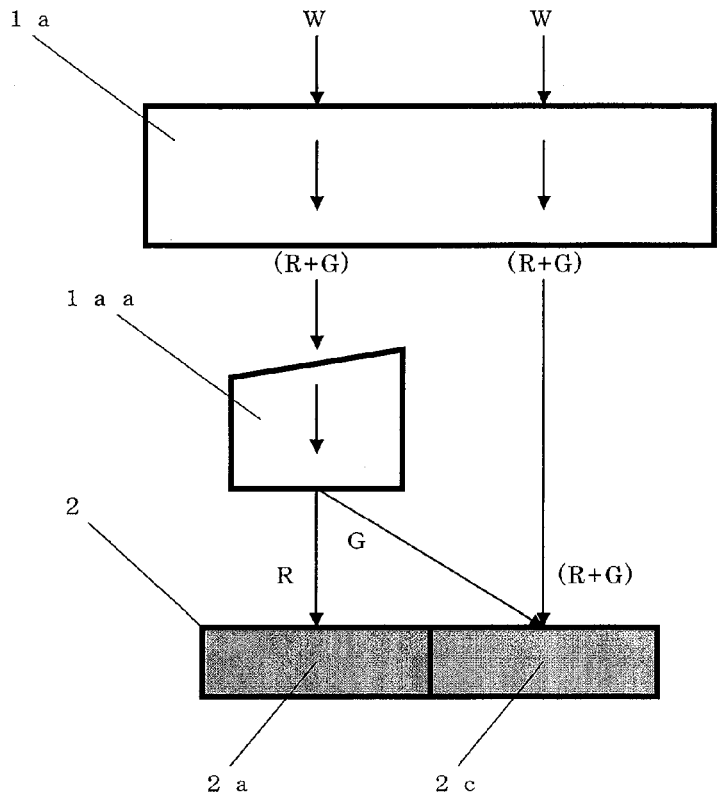
FIG. 21C is a cross-sectional view of the imager of the eighteenth preferred embodiment of the present invention as viewed on the plane E-E' shown in FIG. 21A.
Figure 21D:
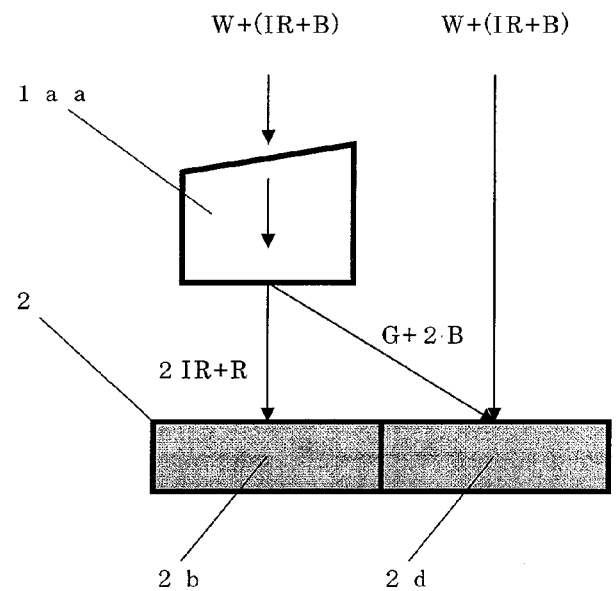
FIG. 21D is a cross-sectional view of the imager of the eighteenth preferred embodiment of the present invention as viewed on the plane F-F' shown in FIG. 21A.

Hereinafter, an eighteenth specific preferred embodiment of the present invention will be described with reference to the accompanying drawings. FIG. 21A is a plan view illustrating, using a fundamental unit, how optical elements are arranged with respect to photosensitive cells in an imager as an eighteenth preferred embodiment of the present invention. FIG. 21B is a cross-sectional view as viewed on the plane D-D' shown in FIG. 21A. FIG. 21C is a cross-sectional view as viewed on the plane E-E' shown in FIG. 21A. And FIG. 21D is a cross-sectional view as viewed on the plane F-F' shown in FIG. 21A.

The arrangement of this eighteenth preferred embodiment of the present invention is obtained by removing the light-splitting elements 1*b* and 1*bb* from that of the seventeenth preferred embodiment described above. Since the number of light-splitting elements provided can be halved as a result, the array of optical elements can be fabricated more easily than in the seventeenth preferred embodiment during the manufacturing process of the imager.

In this eighteenth preferred embodiment, the incident light enters the light-splitting element 1*a* and then the light-splitting element 1*aa* and also enters directly the photosensitive cell 2*d*. Hereinafter, the light transmission path will be described sequentially.

First of all, the light that has been incident on the light-splitting element 1*a* is split into R and G rays that fall straight down and IR and B rays that fall obliquely. Those falling light rays will enter the light-splitting element 1*aa* and will be incident directly on the photosensitive cells 2*c* and 2*d*. As will be described in detail later, the photosensitive cells 2*c* and 2*d* will receive light rays from the light-splitting element 1*aa*, too. The R+G rays that have fallen straight down on the light-splitting element 1*aa* are further split into R and G rays, which will enter the photosensitive cell 2*a* right under the light-splitting element 1*aa* and an adjacent photosensitive cell 2*c*, respectively. The photosensitive cell 2*c* also receives R+G from the light-splitting element 1*a*, and therefore, receives R+2G combined. As a result, an R ray eventually enters the photosensitive cell 2*a* and R+2G rays eventually enter the photosensitive cell 2*c*.

On the other hand, the IR+B rays that have entered obliquely the light-splitting element 1*aa* is combined with direct light W (=IR+R+G+B), thereby making 2IR+R rays fall straight down and also making G+2B fall obliquely. As a result, 2IR+R rays will eventually enter the photosensitive cell 2*b* and G+2B rays, the direct light W and IR+B rays that have come from the light-splitting element 1*a* will all enter the photosensitive cell 2*d*. Consequently, the combined intensity of the light rays received by the photosensitive cell 2*d* will be 2IR+R+2G+4B.

Supposing the intensities of the light rays received by the photosensitive cells 2*a*, 2*b*, 2*c* and 2*d* are identified by S2*a*, S2*b*, S2*c* and S2*d*, respectively, those intensities are given by the following Equation (71) to (74):

$$S2a = R \quad (71)$$

$$S2b = 2IR + R \quad (72)$$

$$S2c = R + 2G \quad (73)$$

$$S2d = 2IR + R + 2G + 4B \quad (74)$$

As can be seen, the intensity of R can be obtained by Equation (71), the intensity of 2IR can be obtained by Equations (71) and (72), the intensity of 2G can be obtained by Equations (1) and (73), and the intensity of 4B can be obtained based on those results and Equation (74). Thus, it can be seen that RGB and IR signals can be extracted, even though the ratios of extraction of the respective colors are not as high as in the seventeenth preferred embodiment.

As described above, according to this eighteenth preferred embodiment, even if the number of light-splitting elements provided is halved from that of the seventeenth preferred embodiment, the incident light can still be transmitted to reach the photosensitive cells without causing any loss and can also be split into the four rays of RGB and IR. As a result, a high sensitivity color image is realized and an infrared image can be obtained even without increasing the number of pixels of the imager and without using any infrared cut filter or infrared pass filter.

Embodiment 19

Figure 22A:
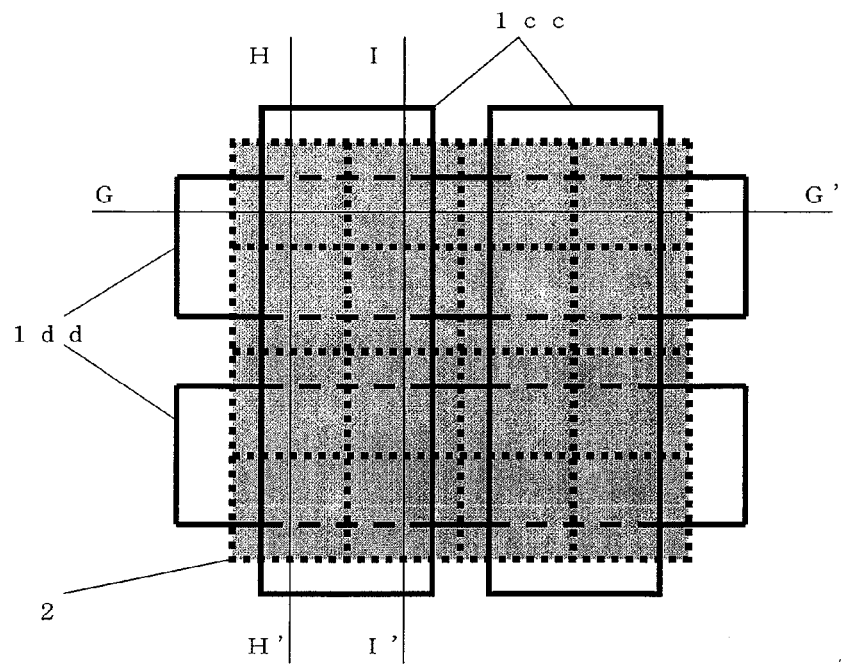
FIG. 22A is a plan view illustrating the arrangement of optical elements with respect to photosensitive cells in an imager according to a nineteenth preferred embodiment of the present invention.
Figure 22B:
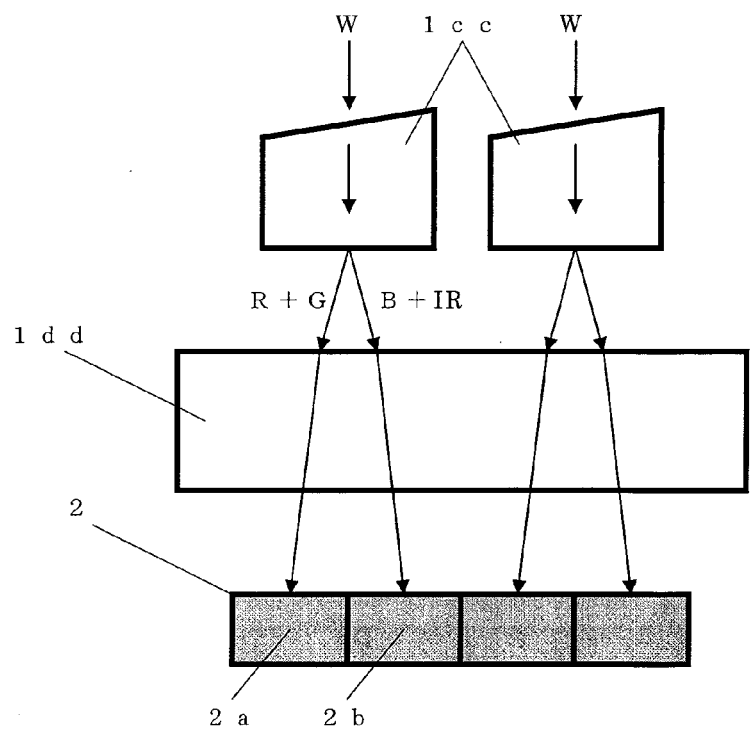
FIG. 22B is a cross-sectional view of the imager of the nineteenth preferred embodiment of the present invention as viewed on the plane G-G' shown in FIG. 22A.
Figure 22C:
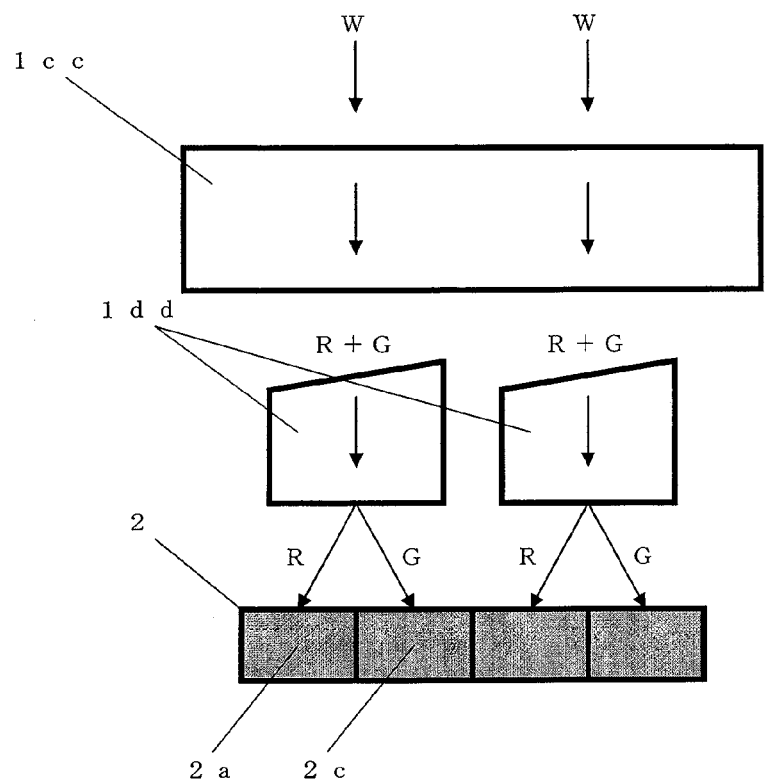
FIG. 22C is a cross-sectional view of the imager of the nineteenth preferred embodiment of the present invention as viewed on the plane H-H' shown in FIG. 22A.
Figure 22D:
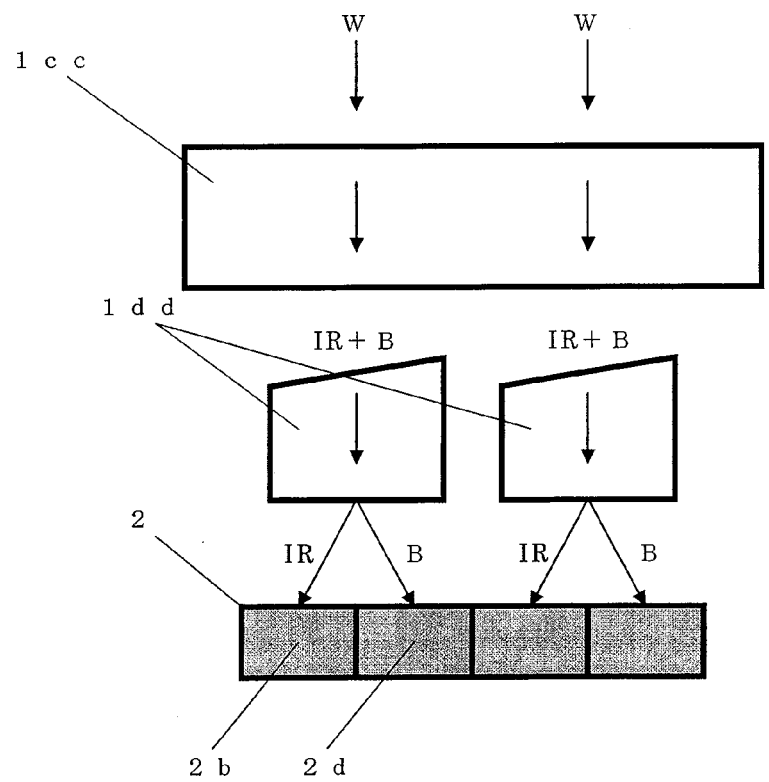
FIG. 22D is a cross-sectional view of the imager of the nineteenth preferred embodiment of the present invention as viewed on the plane I-I' shown in FIG. 22A.

Hereinafter, a nineteenth specific preferred embodiment of the present invention will be described with reference to the accompanying drawings. FIG. 22A is a plan view illustrating, using a fundamental unit, how optical elements are arranged with respect to photosensitive cells in an imager as a nineteenth preferred embodiment of the present invention. FIG. 22B is a cross-sectional view as viewed on the plane G-G' shown in FIG. 22A. FIG. 22C is a cross-sectional view as viewed on the plane H-H' shown in FIG. 22A. And FIG. 22D is a cross-sectional view as viewed on the plane I-I' shown in FIG. 22A.

This nineteenth preferred embodiment of the present invention has the same arrangement as the seventeenth preferred embodiment described above, except the function and the size of light-splitting elements in the array of optical elements. According to this preferred embodiment, the light-splitting elements 1*cc* and 1*dd* are the same as what is illustrated in FIGS. 4A and 4B. Each of the light-splitting elements 1*cc* makes R and G rays fall obliquely, and also makes IR and B rays fall obliquely in the opposite direction. In the same way, each of the light-splitting elements 1*dd* makes IR and R rays fall obliquely, and also makes G and B rays fall obliquely in the opposite direction. Those light-splitting elements 1*cc* and 1*dd* are arranged so as to cross each other at right angles. And each of the light-splitting elements 1*cc* and 1*dd* is associated with two photosensitive cells.

According to this preferred embodiment, the light rays are just split without being combined together, and therefore, the light transmission path is relatively simple. Specifically, the light that has been incident on the light-splitting elements 1*cc* is split into R+G and IR+B rays, which fall on the light-splitting elements 1*dd*. The R+G rays that have entered the light-splitting elements 1*dd* are then split into R and G rays. And the IR+B rays that have entered the light-splitting elements 1*dd* are then split into IR and B rays. As a result, R, G, IR and B rays eventually enter the photosensitive cells 2*a*, 2*c*, 2*b* and 2*d*, respectively, which carry out photoelectric conversion to make RGB and IR signals ready to extract.

Figure 24A:
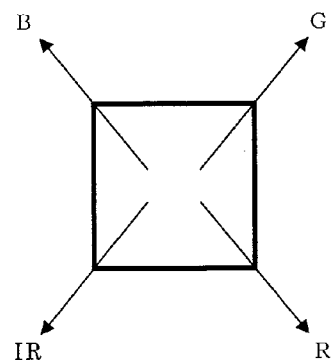
FIG. 24A is a plan view illustrating a light-splitting element according to the present invention in which two light-splitting elements are combined together.
Figure 24B:
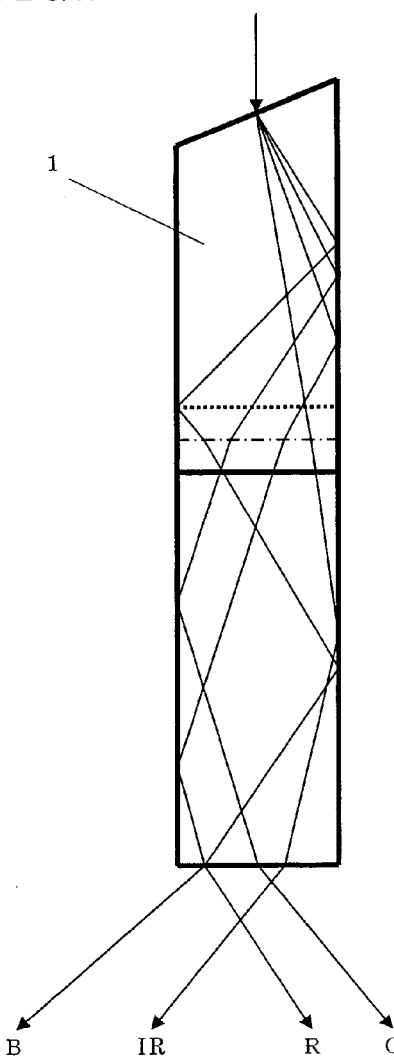
FIG. 24B is a front view of the light-splitting element of the present invention in which two light-splitting elements are combined together.
Figure 24C:
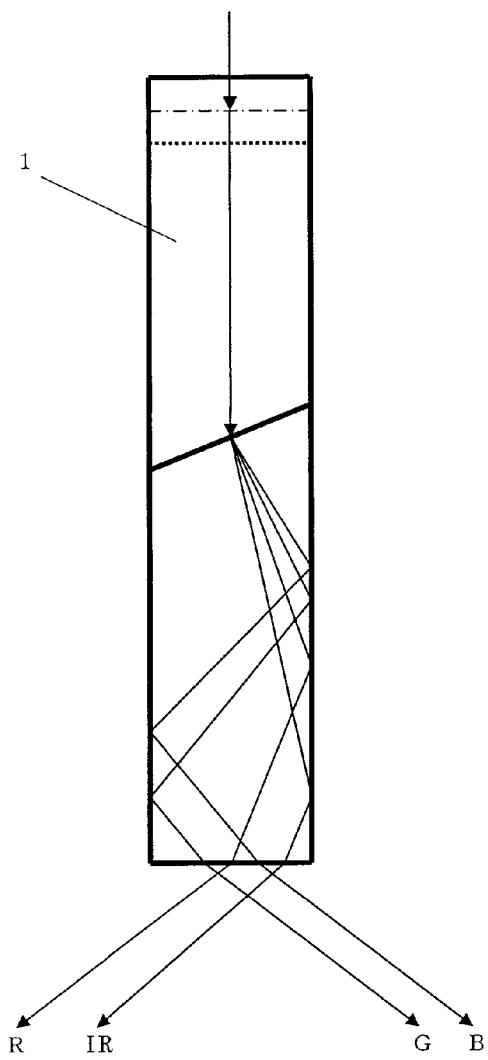
FIG. 24C is a side view of the light-splitting element of the present invention in which two light-splitting elements are combined together.
Figure 25:
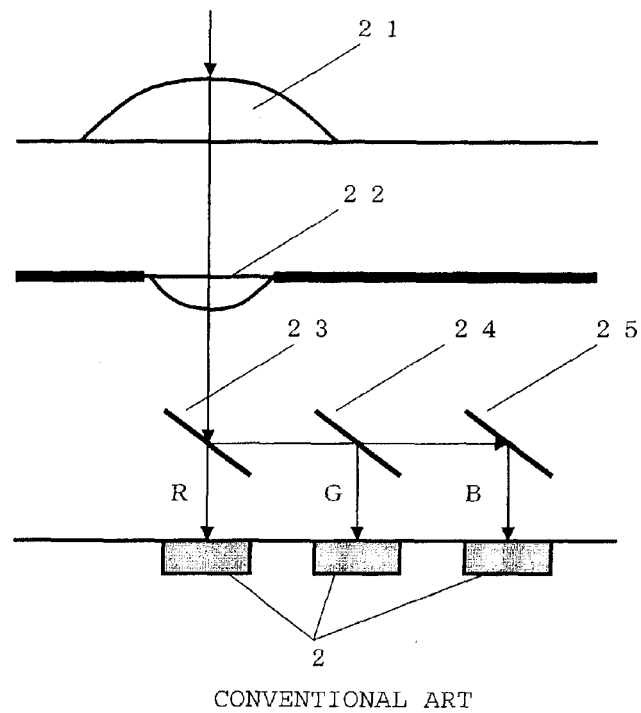
FIG. 25 is a cross-sectional view of a conventional solid-state imaging device that uses micro lenses and color filters of reflection type.
Figure 26:
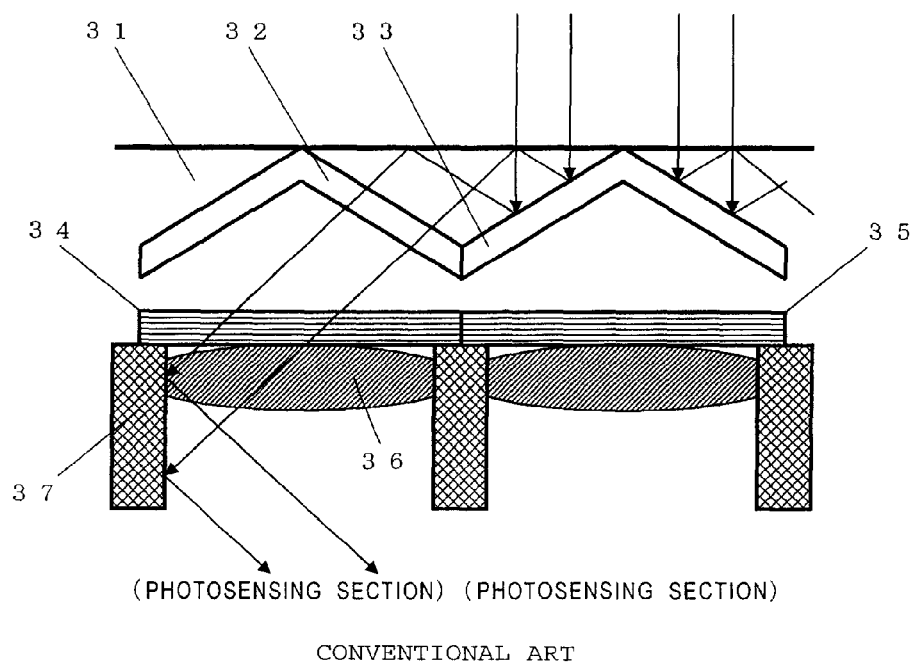
FIG. 26 is a cross-sectional view of an imager that uses incident light more efficiently using multilayer filters and reflection.
Figure 27:
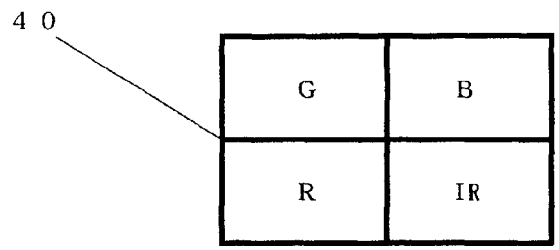
FIG. 27 illustrates the arrangement of basic colors that transmit RGB and infrared (IR) rays.

In the preferred embodiment described above, the light-splitting elements 1*cc* and 1*dd* are arranged separately from each other. However, those light-splitting elements 1*cc* and 1*dd* could be stacked one upon the other in the optical axis direction as shown in FIGS. 24A, 24B and 24C, which are a plan view, a front view and a side view, respectively. Even by adopting such an arrangement, the RGB and IR rays can still be split from each other and their image signals can also be extracted.

As described above, the RGB color signal and the IR signal can be directly extracted from the respective photosensitive cells. However, as those light rays are not superposed one upon the other, the number of pixels cannot be reduced. Nevertheless, an infrared ray image and a visible radiation image can be obtained at the same time even without using any infrared cut filter or infrared pass filter.

As can be seen, according to this nineteenth preferred embodiment of the present invention, two types of light-splitting elements for splitting incident light into R+G and IR+B rays and further splitting the light rays into IR+R and G+B rays are arranged so as to cross each other at right angles and a single light-splitting element is provided for every two pixels. As a result, the incident light can be transmitted to reach the respective photosensitive cells without causing any loss and can also be split into the four rays of RGB and IR. Consequently, even though the number of pixels of the imager needs to be as large as that of the light rays split, a high-sensitivity color image and infrared ray image can be obtained even without using any infrared cut filter or infrared pass filter.

In the seventeenth through nineteenth preferred embodiments of the present invention described above, the photosensitive cells are supposed to be arranged horizontally and vertically to form a two-dimensional array. However, the present invention is in no way limited to those specific preferred embodiments. Even if those cells are obliquely arranged two-dimensionally to form a so-called "pixel shifted arrangement", quite the same effect can be achieved by the present invention.

Embodiment 20

Hereinafter, an overall configuration for a solid-state imaging device according to the present invention will be described with reference to FIG. 28.

Figure 28:
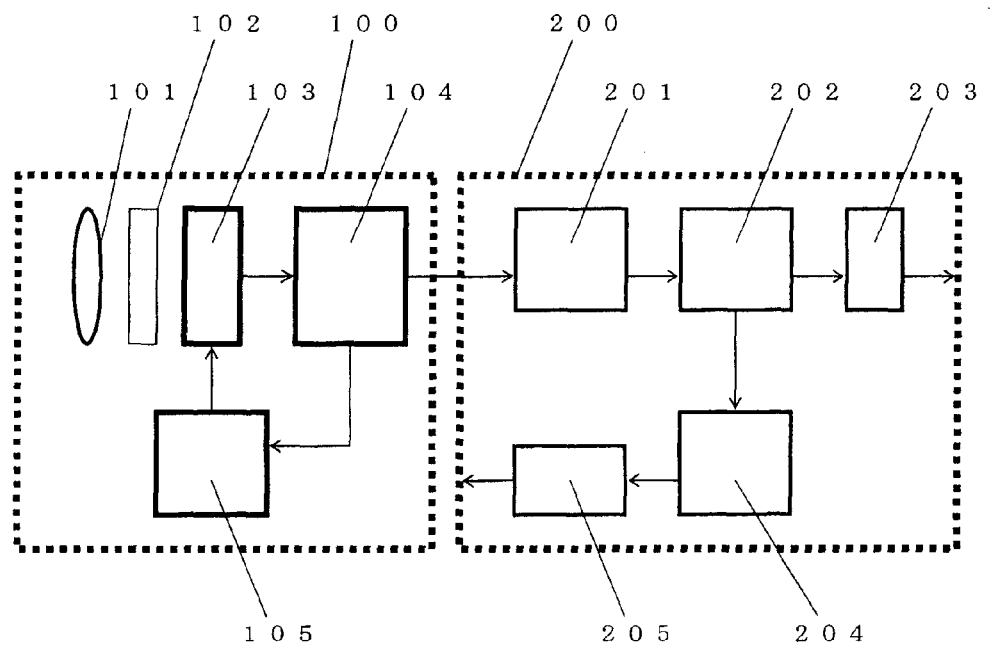
FIG. 28 illustrates an overall configuration for an image capture device according to the present invention.

The solid-state imaging device shown in FIG. 28 includes an image capturing section 100 and a video signal processing section 100 that receives a signal from the image capturing section 100 and generates a video signal. The configuration and operation of the image capturing section 100 and the video signal processing section 100 will be described.

First, the image capturing section 100 will be described. The image capturing section 100 includes a lens 101 for imaging a given subject, an optical plate 102, and an imager 103 for converting optical information, which has been collected by imaging the subject through the lens 101 and the optical plate 102, into an electrical signal by photoelectric conversion. In this case, the optical plate 102 is a combination of a quartz crystal low-pass filter for reducing a moiré pattern to be caused by a pixel arrangement with an infrared cut filter for filtering out infrared rays. The imager is an element with any of the arrangements that have been described for various preferred embodiments of the present invention.

In addition to these components, the image capturing section 100 further includes a signal generating and pixel signal receiving section 104 and an element driving section 105. The signal generating and pixel signal receiving section 104 generates a fundamental signal to drive the imager 103 and receives the signal from the imager 103, thereby performing an A/D conversion. On the other hand, the element driving section 105 receives the signal from the signal generating and pixel signal receiving section 104 and drives the imager 103.

Next, the video signal processing section 200 will be described. In this example, the video signal processing section 200 includes an RGB signal generating section 201, a video signal generating section 202, a video interface section 203, a JPEG signal generating section 204, and a media interface section 205.

The RGB signal generating section 201 receives the image signal from the imager and transforms it into an RGB signal. The video signal generating section 202 receives the signal from the RGB signal generating section 201 and generates a composite video signal consisting of a luminance signal and two color difference signals. The video interface section 203 receives the signal from the video signal generating section 202, subjects it to D/A conversion, and then outputs it as a video signal to an external device. The JPEG signal generating section 204 receives a signal representing one picture from the video signal generating section 202 and transforms it into a still picture in the JPEG format. The media interface section 205 writes JPEG data, provided by the JPEG signal generating section 204, on an external medium.

Hereinafter, it will be described how the image capture device of this preferred embodiment gets signal processing done in a situation where the device includes the imager of the fifteenth and sixteenth preferred embodiments of the present invention described above.

First, the RGB signal generating section 201 generates an RGB signal using four pixel signals as a unit. In this preferred embodiment, the pixel signals are transformed into an RGB signal by Equations (59) to (62) using the following transformation matrix consisting of three rows by four columns.

The pixel signals S2a, S2b, S2e and S2f that have been obtained from pixels of the imager are transformed into an RGB signal in this manner through calculations represented by the following equation:

$$\begin{pmatrix} R \\ G \\ B \end{pmatrix} = \begin{pmatrix} 0 & 0 & 1/2 & -1/2 \\ 3/4 & -1/4 & -1/4 & 3/4 \\ -1/2 & 1/2 & 0 & 0 \end{pmatrix} \begin{pmatrix} S2a \\ S2b \\ S2e \\ S2f \end{pmatrix}$$

The RGB signal generated by the RGB signal generating section 201 is transformed by the video signal generating section 202 into a luminance signal Y and two color difference signals R-Y and B-Y compliant with the NTSC standard to be a composite video signal. Then, the composite video signal is further D/A converted by the video interface section 203 and eventually output as an analog composite video signal.

Meanwhile, the video signal generating section 202 also supplies the luminance signal and the two color difference signals to the JPEG signal generating section 204, which generates a still picture signal in the JPEG format. The still picture signal thus generated is written by the media interface section 205 on an external storage medium.

The RGB signal may be transformed into Y, R-Y and B-Y signals compliant with the NTSC standard using a transformation matrix represented by the following equation, for example:

$$\begin{pmatrix} Y \\ R-Y \\ B-Y \end{pmatrix} = \begin{pmatrix} 0.3 & 0.59 & 0.11 \\ 0.7 & -0.59 & -0.11 \\ -0.3 & -0.59 & 0.89 \end{pmatrix} \begin{pmatrix} R \\ G \\ B \end{pmatrix}$$

To make a JPEG signal based on the Y, R-Y and B-Y signals, a Cr signal needs to be generated by multiplying the R-Y signal by a factor of 0.713 and a Cb signal needs to be generated by multiplying the B-Y signal by a factor of 0.564 without changing Y.

The NTSC and JPEG transformation matrices have different coefficients because their reference chromaticity coordinate systems are different from each other.

In the preferred embodiments of the present invention described above, photosensitive cells are supposed to be arranged two-dimensionally on the photosensing section. In a lot of actual solid-state imaging devices, however, there are opaque portions between those photosensitive cells that are arranged two-dimensionally, and not the entire photosensing section receives incident light. Nevertheless, a small solid-state imaging device of a reverse irradiation type, which can receive incident light on the entire image capturing section, has recently been developed, and there is a growing demand for realizing a high sensitivity color representation by taking advantage of such a feature. Since the present invention provides a novel method for using a combination and color mixture of incoming light rays more efficiently by receiving the incident light entirely, this invention would be applicable even more effectively to an imager that receives incident light on the entire surface such as a solid-state imaging device of the reverse irradiation type.

INDUSTRIAL APPLICABILITY

The solid-state imaging device of the present invention can be used extensively in cameras for general consumers including so-called "digital cameras" and "digital movie cameras", camcorders for TV broadcast personnel, industrial monitor cameras, and so on.

REFERENCE SIGNS LIST 1, 4, 5 array of optical elements of light-splitting type (array of light-splitting elements)
1a, 1b, 1c, 1d light-splitting elements included in array of optical elements of light-splitting type
1aa, 1bb, 1cc, 1dd light-splitting elements included in array of optical elements of light-splitting type
5a, 5b, 5c, 5d light-splitting elements included in array of optical elements of light-splitting type
11a, 11b, 11c light-splitting elements included in array of optical elements of light-splitting type
1e transparent element
2 photosensitive cell of imager
2a, 2b, 2c, 2d photosensitive cells of imager
2e, 2f, 2g, 2h photosensitive cells of imager
2Z opaque portion of imager
3 Bayer type color filter
6a, 6b, 6c, 6d light-splitting elements made of high-refractive-index material to form array of optical elements
7 transparent portion with low refractive index
21 micro lens
22 inner lens
23 dichroic mirror that reflects every ray but red (R) ray
24 dichroic mirror that reflects only green (G) ray
25 dichroic mirror that reflects only blue (B) ray
26 micro prism
31 light-transmitting resin
32 G-ray-transmitting multilayer mirror
33 R-ray-transmitting multilayer mirror
34 G-ray-transmitting organic pigment filter
35 R-ray-transmitting organic pigment filter
36 micro lens
37 metal layer
40 filter that transmits RGB and infrared (IR) rays
101 optical lens
102 optical plate
103 solid-state imaging device
104 signal generating and pixel signal receiving section
105 element driving section
200 video signal processing section
201 RGB signal generating section
202 video signal generating section
203 video interface section
204 JPEG signal generating section
205 media interface section

The invention claimed is:
1. A solid-state imaging device comprising:
an array of photosensitive cells including first and second photosensitive cells; and
an array of optical elements, which is arranged over the array of photosensitive cells and which includes first and second optical elements,
wherein the array of optical elements is configured to make light rays falling within wavelength ranges corresponding to at least two different colors incident on at least one of the first and second photosensitive cells,
wherein the first optical element makes a light ray falling within a first wavelength range, which is included in incident light that has impinged on the first optical element, enter the first photosensitive cell and also makes a light ray falling within a second wavelength range, which is also included in the incident light, enter the second photosensitive cell, and
wherein the second optical element makes at least a light ray falling within the second wavelength range, which is included in incident light that has impinged on the second optical element, enter the second photosensitive cell, and
wherein the first photosensitive cell outputs a signal including an electrical signal component that has been produced as a result of reception of the light ray that has been transmitted through the first optical element, and
wherein the second photosensitive cell outputs a signal including an electrical signal component that has been produced as a result of reception of the light rays that have been transmitted through the first and second optical elements.

2. The solid-state imaging device of claim 1, wherein the color of the light ray falling within the first wavelength range is the complementary color of that of the light ray falling within the second wavelength range.

3. The solid-state imaging device of claim 1, wherein each of the first and second optical elements has a light-splitting property that refracts the incident light to a different direction according to its wavelength, and
wherein the first and second optical elements are located over the first and second photosensitive cells, respectively.

4. A solid-state imaging device comprising:
an array of photosensitive cells; and
an array of optical elements, in which at least two types of light-splitting elements are arranged either one-dimensionally or two-dimensionally over the array of photosensitive cells,
part or all of the photosensitive cells receiving light that has come from the at least two types of light-splitting elements and generating at least three different types of color signals,
wherein the array of optical elements includes light-splitting elements that transmit a light ray falling within a first wavelength range toward a direction that defines a first angle with respect to incident light and also transmit a light ray falling within a second wavelength range toward a direction that defines a second angle with respect to the incident light, the light rays falling within the first and second wavelength ranges having mutually complementary colors.

5. The solid-state imaging device of claim 4, wherein the array of optical elements includes light-splitting elements for splitting the incident light into at least three light rays, and
wherein at least one of the light-splitting elements makes a portion of the light fall on an associated one of the photosensitive cells and makes the rest of the light fall on another one of the photosensitive cells that is adjacent to the associated photosensitive cell.

6. The solid-state imaging device of claim 5, wherein the array of optical elements includes:
a first light-splitting element that transmits the light ray falling within the first wavelength range toward the direction that defines the first angle with respect to the incident light and also transmits the light ray falling within the second wavelength range toward the direction that defines the second angle with respect to the incident light, the light rays falling within the first and second wavelength ranges having mutually complementary colors; and
a second light-splitting element for splitting the incident light into light rays falling within third, fourth and fifth wavelength ranges, respectively, and
wherein the first and second light-splitting elements are alternately arranged adjacent to each other, and
wherein the light ray falling within the second wavelength range that has been transmitted through the first light-splitting element and the light rays falling within the third and fifth wavelength ranges that have been transmitted through the second light-splitting element enter the photosensitive cell associated with the first light-splitting element, and
wherein the light ray falling within the first wavelength range that has been transmitted through the first light-splitting element and the light ray falling within the fourth wavelength range that has been transmitted through the second light-splitting element enter the photosensitive cell associated with the second light-splitting element.

7. The solid-state imaging device of claim 5, wherein the array of optical elements includes:
a first light-splitting element that transmits the light ray falling within the first wavelength range toward the direction that defines the first angle with respect to the incident light and also transmits the light ray falling within the second wavelength range toward the direction that defines the second angle with respect to the incident light, the light rays falling within the first and second wavelength ranges having mutually complementary colors; and
a transparent element that does not split the incident light, and
wherein the first light-splitting element and the transparent element are arranged adjacent to each other, and
wherein the light ray falling within the second wavelength range that has been transmitted through the first light-splitting element enters the photosensitive cell associated with the first light-splitting element, and
wherein the light ray falling within the first wavelength range that has been transmitted through the first light-splitting element and the light ray that has been transmitted through the transparent element enter the photosensitive cell associated with the transparent element.

8. The solid-state imaging device of claim 5, wherein the array of optical elements includes:
first and second light-splitting elements that transmit the light ray falling within the first wavelength range toward the direction that defines the first angle with respect to the incident light and also transmit the light ray falling within the second wavelength range toward the direction that defines the second angle with respect to the incident light, the light rays falling within the first and second wavelength ranges having mutually complementary colors;
a third light-splitting element for splitting the incident light into light rays falling within third, fourth and fifth wavelength ranges, respectively; and
a transparent element that does not split the incident light, and
wherein the first and third light-splitting elements are alternately arranged adjacent to each other and the second light-splitting element and the transparent element are arranged adjacent to each other, and
wherein the light ray falling within the second wavelength range that has been transmitted through the first light-splitting element and the light rays falling within the third and fifth wavelength ranges that have been transmitted through the third light-splitting element enter the photosensitive cell associated with the first light-splitting element, and
wherein the light ray falling within the first wavelength range that has been transmitted through the first light-splitting element and the light ray falling within the fourth wavelength range that has been transmitted through the third light-splitting element enter the photosensitive cell associated with the third light-splitting element, and
wherein the light ray falling within the second wavelength range that has been transmitted through the second light-splitting element enters the photosensitive cell associated with the second light-splitting element, and
wherein the light ray falling within the first wavelength range that has been transmitted through the second light-splitting element and the light ray that has been transmitted through the transparent element enter the photosensitive cell associated with the transparent element.

9. The solid-state imaging device of claim 4, wherein the array of optical elements includes first and second light-splitting elements that transmit the light ray falling within the first wavelength range toward the direction that defines the first angle with respect to the incident light and also transmit the light ray falling within the second wavelength range toward the direction that defines the second angle with respect to the incident light, the light rays falling within the first and second wavelength ranges having mutually complementary colors, and
wherein the first and second light-splitting elements are arranged adjacent to each other, and
wherein the light rays falling within the first wavelength range that have been transmitted through the first and second light-splitting elements, respectively, enter the photosensitive cell associated with the first light-splitting element, and
wherein the light rays falling within the second wavelength range that have been transmitted through the first and second light-splitting elements, respectively, enter the photosensitive cell associated with the second light-splitting element.

10. The solid-state imaging device of claim 4, wherein the array of optical elements includes:
a third light-splitting element that transmits the light ray falling within the first wavelength range toward the direction that defines the first angle with respect to the incident light and also transmits the light ray falling within the second wavelength range toward the direction that defines the second angle with respect to the incident light, the light rays falling within the first and second wavelength ranges having mutually complementary colors; and a transparent element that does not split the incident light, and wherein the third light-splitting element and the transparent element are arranged adjacent to each other, and wherein the light ray falling within the first wavelength range that has been transmitted through the third light-splitting element enters the photosensitive cell associated with the third light-splitting element, and wherein the light ray falling within the second wavelength range that has been transmitted through the third light-splitting element and the light ray that has been transmitted through the transparent element enter the photosensitive cell associated with the transparent element.

11. The solid-state imaging device of claim 4, wherein the array of optical elements includes:

first, second and third light-splitting elements that transmit the light ray falling within the first wavelength range toward the direction that defines the first angle with respect to the incident light and also transmit the light ray falling within the second wavelength range toward the direction that defines the second angle with respect to the incident light, the light rays falling within the first and second wavelength ranges having mutually complementary colors; and a transparent element that does not split the incident light, and wherein the first and second light-splitting elements are arranged adjacent to each other, and the third light-splitting element and the transparent element are arranged adjacent to each other, and wherein the light rays falling within the first wavelength range that have been transmitted through the first and second light-splitting elements, respectively, enter the photosensitive cell associated with the first light-splitting element, and wherein the light rays falling within the second wavelength range that have been transmitted through the first and second light-splitting elements, respectively, enter the photosensitive cell associated with the second light-splitting element, and wherein the light ray falling within the first wavelength range that has been transmitted through the third light-splitting element enters the photosensitive cell associated with the third light-splitting element, and wherein the light ray falling within the second wavelength range that has been transmitted through the third light-splitting element and the light ray that has been transmitted through the transparent element enter the photosensitive cell associated with the transparent element.

12. The solid-state imaging device of claim 4, comprising a light-splitting element that splits incident light into two light rays and makes one of those two light rays fall on a photosensitive cell associated with a transparent element, wherein the light ray to fall on the photosensitive cell associated with the transparent element has the lower intensity than the other light ray.

13. The solid-state imaging device of claim 4, wherein the light-splitting element splits the incident light by diffraction.

14. The solid-state imaging device of claim 4, wherein the light-splitting element includes: a high-refractive-index transparent portion that is made of a material with a relatively high refractive index; and a low-refractive-index transparent portion that is made of a material with a relatively low refractive index and that contacts with a side surface of the high-refractive-index transparent portion.

15. The solid-state imaging device of claim 14, wherein the high-refractive-index transparent portion has a part that has a different thickness from the other parts in the direction in which the incident light travels.

16. The solid-state imaging device of claim 14, wherein the center axis of the high-refractive-index transparent portion is stepped as viewed on a plane that is parallel to the direction in which the incident light travels.

17. The solid-state imaging device of claim 4, wherein color information is obtained by calculating a difference between the output signals of two adjacent photosensitive cells.

18. A solid-state imaging device comprising:

an array of photosensitive cells, which includes a number of photosensitive cells that are arranged two-dimensionally and which includes first and second photosensitive cells that are adjacent to each other in a first direction; and a first light-splitting element, which is arranged to face the first photosensitive cell and which splits and refracts incident light toward a first direction, wherein at least a portion of the light that has been split by the first light-splitting element enters the second photosensitive cell, and wherein each of the first and second photosensitive cells outputs a photoelectrically converted signal based on the intensity of the light received, and wherein the intensity of the light that has been split by the first light-splitting element and then has entered the second photosensitive cell is detected by calculating a difference between the photoelectrically converted signals supplied from the first and second photosensitive cells.

19. The solid-state imaging device of claim 18, wherein color elements with the same optical property are arranged over the first and second photosensitive cells, and wherein the intensity of the light that has been split by the first light-splitting element and then has entered the second photosensitive cell is detected by using a photoelectrically converted signal obtained through the color elements.

20. The solid-state imaging device of claim 18, further comprising a second light-splitting element, which is arranged to face the second photosensitive cell and which splits and refracts the incident light toward a second direction that defines an angle with respect to the first direction, wherein the intensity of the split light is detected by calculating a difference between the sum of photoelectrically converted signals supplied from the second photosensitive cells and the sum of photoelectrically converted signals supplied from the first and second photosensitive cells.

21. The solid-state imaging device of claim 20, wherein the angle is 90 degrees.

22. The solid-state imaging device of claim 18, wherein the light that has been split by the first light-splitting element and then has entered the second photosensitive cell is an infrared ray.

23. The solid-state imaging device of claim 22, wherein an infrared ray image is produced based on the intensity of the infrared ray that has been split by the first light-splitting element and then has entered the second photosensitive cell.

24. The solid-state imaging device of claim 22, wherein a visible radiation image is produced by subtracting the intensity of the infrared ray that has been split by the first light-splitting element and then has entered the second photosensitive cell from the photoelectrically converted signal of each said photosensitive cell.

25. The solid-state imaging device of claim 24, wherein the array of photosensitive cells includes a third photosensitive cell that is adjacent in the second direction, and
   wherein the device further comprises a third light-splitting element, which is arranged to face the third photosensitive cell and which splits and refracts the incident light toward the second direction, and
   wherein the second light-splitting element splits the incident light into blue and other color rays, and
   wherein the third light-splitting element splits the incident light into red and other color rays.

26. The solid-state imaging device of claim 25, wherein the arrangement pitches of the light-splitting elements and the photosensitive cells have an integral ratio of m to n, where n/m is not an integer.

27. The solid-state imaging device of claim 26, wherein the device includes: a high-refractive-index transparent portion that is made of a material with a relatively high refractive index; and a low-refractive-index transparent portion that is made of a material with a relatively low refractive index and that contacts with a side surface of the high-refractive-index transparent portion, and
   wherein the high-refractive-index transparent portion has a part that has a different thickness from the other parts in the direction in which the incident light travels.

28. The solid-state imaging device of claim 25, wherein the light-splitting elements included in the array of optical elements have the same property.

* * * * *